US012750069B2

(12) United States Patent
Lin et al.

(10) Patent No.: US 12,750,069 B2
(45) Date of Patent: Sep. 29, 2026

(54) LDPC ENCODING AND DECODING METHOD AND RELATED APPARATUS

(71) Applicant: HUAWEI TECHNOLOGIES CO., LTD., Shenzhen (CN)

(72) Inventors: Wei Lin, Shenzhen (CN); Guido Montorsi, Turin (IT); Sergio Benedetto, Turin (IT); Xun Yang, Singapore (SG); Yan Xin, Ottawa (CA); Ming Gan, Shenzhen (CN); Mengyao Ma, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 68 days.

(21) Appl. No.: 18/940,997

(22) Filed: Nov. 8, 2024

(65) Prior Publication Data

US 2025/0070800 A1 Feb. 27, 2025

Related U.S. Application Data

(63) Continuation of application No. PCT/CN2023/092280, filed on May 5, 2023.

(30) Foreign Application Priority Data

May 10, 2022 (CN) ......................... 202210505542.9

(51) Int. Cl.
*H03M 13/11* (2006.01)

(52) U.S. Cl.
CPC ...... *H03M 13/118* (2013.01); *H03M 13/1125* (2013.01)

(58) Field of Classification Search
None
See application file for complete search history.

(56) References Cited

U.S. PATENT DOCUMENTS

| | | | | |
|---|---|---|---|---|
| 7,237,171 | B2 | 6/2007 | Richardson | |
| 10,797,727 | B1 * | 10/2020 | Walke | H03M 13/116 |
| 11,108,410 | B1 * | 8/2021 | Walke | H03M 13/116 |
| 2017/0230058 | A1 * | 8/2017 | Xu | H03M 13/116 |

(Continued)

FOREIGN PATENT DOCUMENTS

| | | | |
|---|---|---|---|
| CN | 109891753 | A | 6/2019 |
| CN | 113193874 | A | 7/2021 |

OTHER PUBLICATIONS

IEEE Computer Society:"IEEE Standard for Low-Rate Wireless Networks Amendment 1: Enhanced Ultra Wideband (UWB) Physical Layers (PHYs) and Associated Ranging Techniques." IEEE Std 802.15.4z™-2020. Jun. 4, 2020. total 174 pages.

(Continued)

*Primary Examiner* — Daniel F. McMahon

(57) ABSTRACT

A low-density parity-check (LDPC) encoding method includes performing LDPC encoding on an information bit sequence based on a parity check matrix, to obtain a first code word. The parity-check matrix is obtained by expanding a base matrix or a submatrix of the base matrix. The base matrix or submatrix is an H×M submatrix formed from H selected rows and M selected columns of a 12×22 matrix, where H is 1 to 12 and M is 1 to 22. The H×M submatrix includes two columns corresponding to first two columns of the 12×22 matrix and including predetermined binary sequences.

12 Claims, 13 Drawing Sheets

(56) References Cited

U.S. PATENT DOCUMENTS

| | | | | |
|---|---|---|---|---|
| 2019/0260390 | A1* | 8/2019 | Shutkin | H04L 1/0041 |
| 2020/0028523 | A1* | 1/2020 | Li | H03M 13/036 |
| 2021/0391872 | A1* | 12/2021 | Declercq | H03M 13/1108 |
| 2022/0224359 | A1* | 7/2022 | Ahn | H03M 13/618 |

OTHER PUBLICATIONS

802 Committee:"IEEE P802.11ac™/D7.0 Draft Standard for Information Technology—Telecommunications and information exchange between systems—Local and metropolitan area networks—Specific requirements Part 11: Wireless LAN Medium Access Control (MAC) and Physical Layer (PHY) specifications Amendment 4: Enhancements for Very High Throughput for Operation in Bands below 6 GHz." IEEE P802.11ac/D7.0, Sep. 2013. total 456 pages.

LAN/MAN Standards Committee of the IEEE Computer Society:"IEEE P802.11ax™M/D8.0 Draft Standard for Information technology—Telecommunications and information exchange between systems Local and metropolitan area networks—Specific requirements Part 11: Wireless LAN Medium Access Control (MAC) and Physical Layer (PHY) Specifications Amendment 1: Enhancements for High Efficiency WLAN." IEEE P802.11ax™M/D8.0, Oct. 2020. total 820 pages.

LAN/MAN Standards Committee of the IEEE Computer Society:"P802.11ay™M/D5.0 Draft Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications—Amendment 2: Enhanced throughput for operation in license-exempt bands above 45 GHz." IEEE P802.11ay™/D5.0, Oct. 2019. total 790 pages.

Marc P. C et al:"Quasi-Cyclic Low-Density Parity-Check Codes From Circulant Permutation Matrices." Aug. 2004. total 6 pages.

Tom Richardson et al:"Multi-Edge Type LDPC Codes." Apr. 20, 2004. total 36 pages.

LAN/MAN Standards Committee of the IEEE Computer Society:"P802.15.4ab™/D01 Draft Standard for Low-Rate Wireless Networks Amendment 1: Enhanced Ultra Wideband (UWB) Physical Layers (PHYs) and Associated Medium Access and Control (MAC) Sublayer Enhancements." Jun. 2024. total 223 pages.

Aliazam Abbasfar et al:"Accumulate Repeat Accumulate Codes." ISIT 2004, Chicago, USA, Jun. 27-Jul. 2, 2004. total 1 page.

J. Thorpe:"Low-Density Parity-Check (LDPC) Codes Constructed from Protographs." Aug. 15, 2003. total 7 pages.

International Search Report and Written Opinion issued in PCT/CN2023/092280, dated Jun. 23, 2023, 7 pages.

* cited by examiner $$
\begin{array}{c}
\\
\mathbf{H} =
\end{array}
\begin{array}{c}
\begin{array}{cccccccc} V_1 & V_2 & V_3 & V_4 & V_5 & V_6 & V_7 & V_8 \end{array} \\
\begin{bmatrix}
1 & 0 & 1 & 0 & 1 & 0 & 1 & 0 \\
1 & 0 & 0 & 1 & 0 & 1 & 0 & 1 \\
0 & 1 & 1 & 0 & 0 & 1 & 1 & 0 \\
0 & 1 & 0 & 1 & 1 & 0 & 0 & 1
\end{bmatrix}
\end{array}
\begin{array}{c}
\\
C_1 \\ C_2 \\ C_3 \\ C_4
\end{array}
$$
FIG. 1
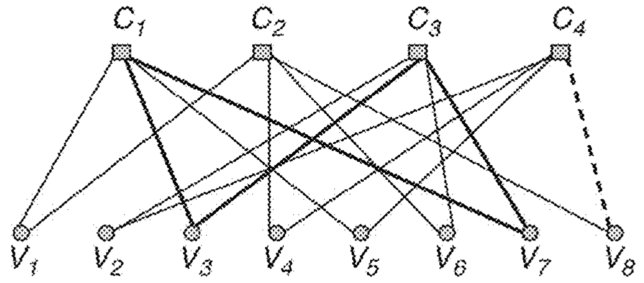
FIG. 2
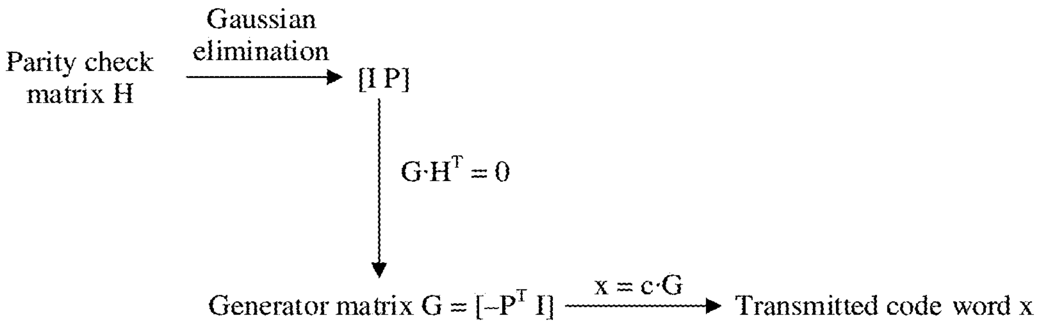
FIG. 3

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 10 | 40 | 67 | 55 | 3 | 62 | 5 | 25 | 64 | 43 | 31 | 50 | | 41 | 61 | 26 | 62 | 61 | 19 | | 0 | 0 | | | | | | |
| 58 | 53 | 62 | 47 | 54 | 64 | 48 | 54 | 5 | 13 | 43 | | 54 | | 57 | 7 | 40 | 52 | 45 | 22 | | 0 | 0 | | | | | |
| 43 | 12 | 0 | 67 | 20 | 21 | 35 | 45 | 37 | 59 | 59 | 7 | 56 | 29 | | 48 | | 24 | | 44 | 0 | | 0 | 0 | | | | |
| 13 | 24 | 30 | 34 | 37 | 47 | 49 | 31 | 42 | 20 | | 54 | 3 | 54 | 43 | | 3 | | 61 | 43 | 0 | | | 0 | | | | |
| | | | 25 | | | | | 24 | | | | | | | | | 6 | | | | | | 47 | 0 | | | |
| | | | | 73 | | | 23 | | | | | | | | | 16 | | | | | 49 | | | | 0 | | |
| 30 | | 16 | | | | | | | | | | | 47 | | | | | 19 | | | | | | | | 0 | |
| | | | | | | 65 | | | 40 | | 44 | 0 | | | | | | | | | | | | | | | 0 |

FIG. 5

| | | | | | | | | | | | | | | | | | | | | | |
|---|---|---|---|---|---|---|---|---|---|---|---|---|---|---|---|---|---|---|---|---|---|
| 19 | 30 | −1 | 8 | −1 | −1 | 27 | −1 | −1 | −1 | 1 | 0 | −1 | −1 | −1 | −1 | −1 | −1 | −1 | −1 | −1 | −1 |
| 24 | −1 | −1 | 27 | 3 | 32 | −1 | 32 | 15 | −1 | −1 | 0 | 0 | −1 | −1 | −1 | −1 | −1 | −1 | −1 | −1 | −1 |
| 13 | 0 | 11 | −1 | −1 | −1 | 3 | −1 | 8 | 13 | −1 | −1 | 0 | 0 | −1 | −1 | −1 | −1 | −1 | −1 | −1 | −1 |
| −1 | 21 | 7 | 24 | 4 | 7 | 20 | −1 | −1 | 28 | 0 | −1 | −1 | 0 | 0 | −1 | −1 | −1 | −1 | −1 | −1 | −1 |
| 29 | 4 | 19 | −1 | 6 | 16 | −1 | 30 | 15 | 33 | −1 | −1 | −1 | −1 | 0 | 0 | −1 | −1 | −1 | −1 | −1 | −1 |
| 7 | −1 | −1 | 0 | −1 | −1 | −1 | 18 | −1 | −1 | 1 | −1 | −1 | −1 | −1 | 0 | −1 | −1 | −1 | −1 | −1 | −1 |
| 5 | 12 | −1 | −1 | −1 | −1 | −1 | −1 | −1 | −1 | −1 | −1 | −1 | −1 | −1 | −1 | 0 | −1 | −1 | −1 | −1 | −1 |
| −1 | 27 | −1 | 11 | −1 | −1 | −1 | −1 | −1 | 24 | −1 | 17 | 10 | −1 | −1 | −1 | −1 | 0 | −1 | −1 | −1 | −1 |
| 0 | 16 | −1 | −1 | −1 | −1 | −1 | −1 | 5 | −1 | −1 | −1 | −1 | −1 | −1 | −1 | −1 | −1 | 0 | −1 | −1 | −1 |
| 24 | −1 | −1 | −1 | 2 | −1 | −1 | −1 | 27 | −1 | −1 | −1 | −1 | −1 | 22 | −1 | −1 | −1 | −1 | 0 | −1 | −1 |
| 24 | 24 | −1 | 16 | −1 | −1 | −1 | −1 | −1 | −1 | −1 | 26 | −1 | −1 | −1 | 10 | −1 | −1 | −1 | −1 | 0 | −1 |
| −1 | 4 | −1 | 26 | 27 | 14 | −1 | −1 | −1 | −1 | −1 | −1 | −1 | −1 | −1 | −1 | −1 | −1 | −1 | −1 | −1 | 0 |

FIG. 6

R = 2/3

1201

| | | | | | | | | | | | | | | | | | | | | | | |
|---|---|---|---|---|---|---|---|---|---|---|---|---|---|---|---|---|---|---|---|---|---|---|
| 1 | 19 | 30 | -1 | 8 | -1 | -1 | 27 | -1 | -1 | -1 | 1 | 0 | -1 | -1 | -1 | -1 | -1 | -1 | -1 | -1 | -1 | -1 |
| 2 | 24 | -1 | -1 | 27 | 3 | 32 | -1 | 32 | 15 | -1 | -1 | 0 | 0 | -1 | -1 | -1 | -1 | -1 | -1 | -1 | -1 | -1 |
| 3 | 13 | 0 | 11 | -1 | -1 | -1 | 3 | -1 | 8 | 13 | -1 | -1 | 0 | 0 | -1 | -1 | -1 | -1 | -1 | -1 | -1 | -1 |
| 4 | -1 | 21 | 7 | 24 | 4 | 7 | 20 | -1 | -1 | 28 | 0 | -1 | -1 | 0 | 0 | -1 | -1 | -1 | -1 | -1 | -1 | -1 |
| 5 | 29 | 4 | 19 | -1 | 6 | 16 | -1 | 30 | 15 | 33 | -1 | -1 | -1 | -1 | 0 | 0 | -1 | -1 | -1 | -1 | -1 | -1 |
| 6 | 7 | -1 | -1 | 0 | -1 | -1 | -1 | 18 | -1 | -1 | 1 | -1 | -1 | -1 | -1 | 0 | -1 | -1 | -1 | -1 | -1 | -1 |
| 7 | 5 | 12 | -1 | -1 | -1 | -1 | -1 | -1 | -1 | -1 | -1 | -1 | -1 | -1 | -1 | -1 | 0 | -1 | -1 | -1 | -1 | -1 |
| 8 | -1 | 27 | -1 | 11 | -1 | -1 | -1 | -1 | -1 | 24 | -1 | 17 | 10 | -1 | -1 | -1 | -1 | 0 | -1 | -1 | -1 | -1 |
| 9 | 0 | 16 | -1 | -1 | -1 | -1 | -1 | -1 | 5 | -1 | -1 | -1 | -1 | -1 | -1 | -1 | -1 | -1 | 0 | -1 | -1 | -1 |
| 10 | 24 | -1 | -1 | -1 | 2 | -1 | -1 | -1 | 27 | -1 | -1 | -1 | -1 | -1 | 22 | -1 | -1 | -1 | -1 | 0 | -1 | -1 |
| 11 | 24 | 24 | -1 | 16 | -1 | -1 | -1 | -1 | -1 | -1 | -1 | 26 | -1 | -1 | -1 | 10 | -1 | -1 | -1 | -1 | 0 | -1 |
| 12 | -1 | 4 | -1 | 26 | 27 | 14 | -1 | -1 | -1 | -1 | -1 | -1 | -1 | -1 | -1 | -1 | -1 | -1 | -1 | -1 | -1 | 0 |

FIG. 12

LDPC ENCODING AND DECODING METHOD AND RELATED APPARATUS

CROSS-REFERENCE TO RELATED APPLICATIONS

This application is a continuation of International Application No. PCT/CN2023/092280, filed on May 5, 2023, which claims priority to Chinese Patent Application No. 202210505542.9, filed on May 10, 2022. The disclosures of the aforementioned applications are hereby incorporated by reference in their entireties.

TECHNICAL FIELD

This application relates to the field of communication technologies, and in particular, to an LDPC encoding and decoding method and a related apparatus.

BACKGROUND

A wireless local area network (WLAN) transmission standard like IEEE 802.11n/ac/ax/be mainly aims to improve user experience in a high-bandwidth scenario, including improving an average user throughput and energy usage efficiency of a battery-powered device. In a 60 GHz high-bandwidth scenario, high-speed and reliable transmission of data and video services and the like on limited frequency and power resources needs to be supported. Therefore, a highly reliable and efficient channel encoding/decoding scheme is required. In the field of channel encoding, a Turbo code and a low-density parity-check (LDPC) code are two maturest and widely used channel encoding methods currently, and both the two codes have performance close to a Shannon limit. Compared with the Turbo code, the LDPC code has the following advantages: good bit error performance without an in-depth interleaver, better frame error rate performance, greatly reduced error floor, supporting parallel decoding, short decoding delay, and the like.

Therefore, the LDPC code becomes a standard channel encoding scheme for a low-frequency short-range WLAN communication system of IEEE802.11n/ac/ax, and becomes a mandatory channel encoding scheme in IEEE802.11ax in a case in which a bandwidth is greater than or equal to 40 MHz. Based on this, a new LDPC code may be designed for a next-generation WLAN standard or an ultra-wideband (UWB), to further improve reliability and system performance of a next-generation WLAN system or a UWB system.

SUMMARY

Embodiments of this application disclose an LDPC encoding and decoding method and a related apparatus that can improve coding performance and support a plurality of code rates.

According to a first aspect, an embodiment of this application provides an LDPC code encoding method. The method includes: performing low-density parity-check (LDPC) encoding on an information bit sequence based on a parity check matrix, to obtain a first code word, where the parity check matrix complies with a base matrix, and the base matrix meets one of the following: each row in the first two columns of the base matrix includes at least one 1; or the first two columns of the base matrix include "1 0" and "0 1" that alternate regularly, and "1 1" is included between "1 0" and "0 1"; or the first two columns of the base matrix conform to the following rule: one column includes a plurality of "1 1 1 0" in sequence, and the other column correspondingly includes a plurality of "1 0 1 1" in sequence; and sending the first code word.

In this embodiment, the parity check matrix complies with the base matrix. The design of the base matrix enables the parity check matrix that complies with the base matrix to quickly transmit, exchange, decode and update information between code word bits corresponding to each column in the parity check matrix, to accelerate an overall decoding convergence speed of a system.

According to a second aspect, an embodiment of this application provides another LDPC code encoding method. The method includes: A receive end determines a first log-likelihood ratio sequence corresponding to a signal received over a first channel, and decodes the first LLR sequence based on a parity check matrix, where the parity check matrix complies with a base matrix, and the base matrix meets one of the following: each row in the first two columns of the base matrix includes at least one 1; or the first two columns of the base matrix include "1 0" and "0 1" that alternate regularly, and "1 1" is included between "1 0" and "0 1"; or the first two columns of the base matrix conform to the following rule: one column includes a plurality of "1 1 1 0" in sequence, and the other column correspondingly includes a plurality of "1 0 1 1" in sequence.

In this embodiment, the parity check matrix complies with the base matrix. A design of the base matrix enables the parity check matrix that complies with the base matrix to quickly transmit, exchange, decode and update information between codeword bits corresponding to each column in the parity check matrix, to accelerate an overall decoding convergence speed of a system.

In a possible implementation of the first aspect and the second aspect, one of the first two columns of the base matrix includes the following elements: 1 1 1 0 1 1 1 0 1 1 1 0, and the other column of the first two columns of the base matrix includes the following elements: 1 0 1 1 1 0 1 1 1 0 1 1, 1 in the base matrix corresponds to a circulant permutation matrix CPM, and 0 in the base matrix corresponds to an all-zero square matrix.

In this implementation, one column in the first two columns of the base matrix includes the following elements: 1 1 1 0 1 1 1 0 1 1 1 0, and the other column in the first two columns of the base matrix includes the following elements: 1 0 1 1 1 0 1 1 1 0 1 1. A good tradeoff between encoding complexity and decoding performance can be obtained.

According to a third aspect, an embodiment of this application provides a communication apparatus. The communication apparatus has a function of implementing behavior in the method embodiment in the first aspect. The communication apparatus may be a communication device, or may be a component (for example, a processor, a chip, or a chip system) of a communication device, or may be a logical module or software that can implement all or some functions of the communication device. The function of the communication apparatus may be implemented by hardware, or may be implemented by hardware executing corresponding software. The hardware or the software includes one or more modules or units corresponding to the foregoing function. In a possible implementation, the communication apparatus includes an interface module and a processing module. The processing module is configured to perform low-density parity-check (LDPC) encoding on an information bit sequence based on a parity check matrix, to obtain a first code word, where the parity check matrix complies with a base matrix, and the base matrix meets one of the following: each row in the first two columns of the base matrix includes at least one 1; or the first two columns of the base matrix include "1 0" and "0 1" that alternate regularly, and "1 1" is included between "1 0" and "0 1"; or the first two columns of the base matrix conform to the following rule: one column includes a plurality of "1 1 1 0" in sequence, and the other column correspondingly includes a plurality of "1 0 1 1" in sequence. The interface module is configured to send the first code word.

In this embodiment, the parity check matrix complies with the base matrix. A design of the base matrix enables the parity check matrix that complies with the base matrix to quickly transmit, exchange, decode and update information between code word bits corresponding to each column in the parity check matrix, to accelerate an overall decoding convergence speed of a system.

According to a fourth aspect, an embodiment of this application provides a communication apparatus. The communication apparatus has a function of implementing behavior in the method embodiment in the second aspect. The communication apparatus may be a communication device, or may be a component (for example, a processor, a chip, or a chip system) of a communication device, or may be a logical module or software that can implement all or some functions of the communication device. The function of the communication apparatus may be implemented by hardware, or may be implemented by hardware executing corresponding software. The hardware or the software includes one or more modules or units corresponding to the foregoing function. In a possible implementation, the communication apparatus includes an interface module and a processing module. The interface module is configured to receive a signal from a transmit end. The processing module is configured to: determine a first log-likelihood ratio sequence corresponding to a signal received over a first channel, and decode the first LLR sequence based on a parity check matrix, where the parity check matrix complies with a base matrix, and the base matrix meets one of the following: each row in the first two columns of the base matrix includes at least one 1; or the first two columns of the base matrix include "1 0" and "0 1" that alternate regularly, and "1 1" is included between "1 0" and "0 1"; or the first two columns of the base matrix conform to the following rule: one column includes a plurality of "1 1 1 0" in sequence, and the other column correspondingly includes a plurality of "1 0 1 1" in sequence.

In this embodiment, the parity check matrix complies with the base matrix. A design of the base matrix enables the parity check matrix that complies with the base matrix to quickly transmit, exchange, decode and update information between codeword bits corresponding to each column in the parity check matrix, to accelerate an overall decoding convergence speed of a system.

In a possible implementation of the third aspect and the fourth aspect, one of the first two columns of the base matrix includes the following elements: 1 1 1 0 1 1 1 0 1 1 1 0, and the other column of the first two columns of the base matrix includes the following elements: 1 0 1 1 1 0 1 1 1 0 1 1, 1 in the base matrix corresponds to a circulant permutation matrix CPM, and 0 in the base matrix corresponds to an all-zero square matrix.

In this implementation, one column in the first two columns of the base matrix includes the following elements: 1 1 1 0 1 1 1 0 1 1 1 0, and the other column in the first two columns of the base matrix includes the following elements: 1 0 1 1 1 0 1 1 1 0 1 1. A good tradeoff between encoding complexity and decoding performance can be obtained.

According to a fifth aspect, an embodiment of this application provides another communication apparatus. The communication apparatus includes a processor, the processor is coupled to a memory, the memory is configured to store a program or instructions, and when the program or the instructions are executed by the processor, the communication apparatus is enabled to perform the method shown in any one of the first aspect or the possible implementations of the first aspect, or when the program or the instructions are executed by the processor, the communication apparatus is enabled to perform the method shown in any one of the second aspect or the possible implementations of the second aspect.

In this embodiment, in a process of performing the method, a process of sending information (or a signal) in the method may be understood as a process of outputting information based on instructions of the processor. When outputting the information, the processor outputs the information to a transceiver, so that the transceiver transmits the information. After the information is output by the processor, other processing may further need to be performed, and then the information arrives at the transceiver. Similarly, when the processor receives input information, the transceiver receives the information, and inputs the information into the processor. Further, after the transceiver receives the information, other processing may need to be performed on the information before the information is input to the processor.

Unless otherwise specified, or if an operation like sending and/or receiving related to the processor does not conflict with an actual function or internal logic of the operation in related descriptions, the operation may be generally understood as processor-based instruction output.

In an implementation process, the processor may be a processor specially configured to perform these methods, or may be a processor that executes computer instructions in the memory to perform these methods, for example, a general-purpose processor. For example, the processor may be further configured to execute the program stored in the memory. When the program is executed, the communication apparatus is enabled to perform the method shown in any one of the first aspect or the possible implementations of the first aspect.

In a possible implementation, the memory is located outside the communication apparatus. In a possible implementation, the memory is located in the communication apparatus.

In a possible implementation, the processor and the memory may be further integrated into one component, that is, the processor and the memory may be further integrated together.

In a possible implementation, the communication apparatus further includes the transceiver. The transceiver is configured to receive a signal, send a signal, or the like.

According to a sixth aspect, this application provides another communication apparatus. The communication apparatus includes a processing circuit and an interface circuit. The interface circuit is configured to obtain data or output data. The processing circuit is configured to perform a corresponding method according to the first aspect or any possible implementation of the first aspect, or the processing circuit is configured to perform a corresponding method according to the second aspect or any possible implementation of the second aspect.

According to a seventh aspect, this application provides a computer-readable storage medium. The computer-readable storage medium stores a computer program, the computer program includes program instructions, and when the program instructions are executed, a computer is enabled to perform the method according to any one of the first aspect or the possible implementations of the first aspect. Alternatively, when the program instructions are executed, a computer is enabled to perform the method according to the second aspect or any possible implementation of the second aspect.

According to an eighth aspect, this application provides a computer program product. The computer program product includes a computer program, the computer program includes program instructions, and when the program instructions are executed, a computer is enabled to perform the method according to any one of the first aspect or the possible implementations of the first aspect; or when the program instructions are executed, a computer is enabled to perform the method according to the second aspect or any possible implementation of the second aspect.

According to a ninth aspect, this application provides a communication system, including the communication apparatus according to the third aspect or any possible implementation of the third aspect and the communication apparatus according to the fourth aspect or any possible implementation of the fourth aspect.

BRIEF DESCRIPTION OF DRAWINGS

To describe technical solutions in embodiments of this application or in the background more clearly, the following describes accompanying drawings for describing embodiments of this application or the background.

FIG. 1 is an example of a parity check matrix H of an LDPC code;

FIG. 2 is a Tanner graph of a parity check matrix H of an LDPC code;

FIG. 3 shows an example of an LDPC code encoding process;

FIG. 5 is an example of a mother matrix obtained by extending $H_{MC}$;

FIG. 6 shows an example of a parity check matrix obtained by extending a base matrix with a size of (12×22);

FIG. 12 is an example of a parity check matrix according to an embodiment of this application;

DESCRIPTION OF EMBODIMENTS

Figure 4:
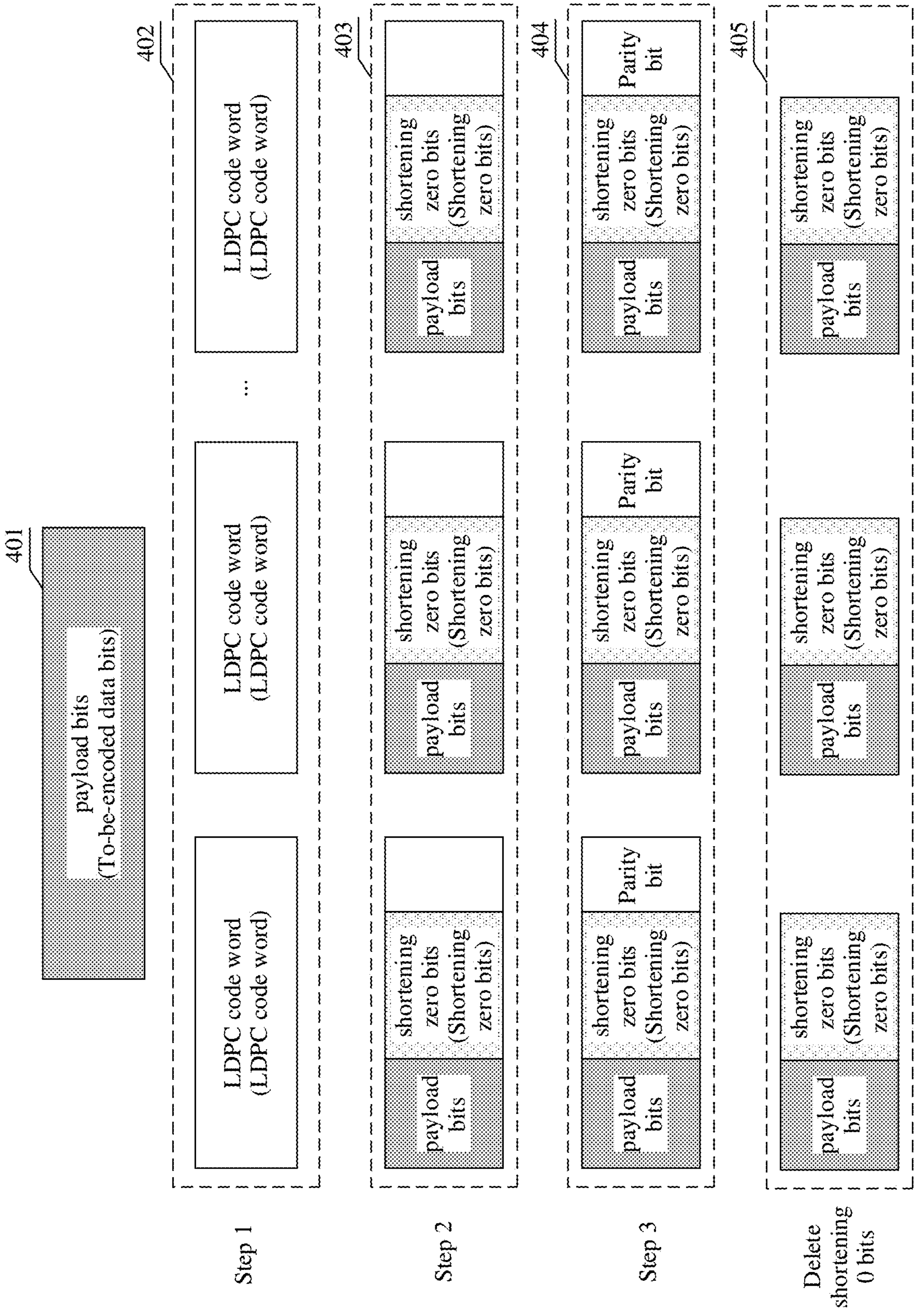
FIG. 4 is a diagram of a shortening operation part in an LDPC encoding process.

Terms "first", "second", and the like in the specification, claims, and accompanying drawings of this application are merely used to distinguish between different objects, and are not used to describe a specific order. In addition, the terms "including", "having", and any other variants thereof are intended to cover a non-exclusive inclusion. For example, a process, a method, a system, a product, or a device that includes a series of steps or units is not limited to the listed steps or units, but optionally further includes a step or a unit that is not listed. Alternatively, optionally, other steps or units inherent to these processes, methods, products, or devices may be further included.

In this disclosure, the word "example" or "for example" is used to represent giving an example, an illustration, or a description. Any embodiment or design solution described as "an example", "for example", or "for example" in this application should not be interpreted as being more preferred or advantageous than another embodiment or design solution. Exactly, use of the word "example", "example", or "for example" is intended to present a related concept in a specific manner.

"Embodiments" mentioned in this specification mean that a specific feature, structure, or characteristic described in combination with the embodiments may be included in at least one embodiment of this application. The phrase shown in various locations in the specification may not necessarily refer to a same embodiment, and is not an independent or optional embodiment exclusive from another embodiment. It may be understood explicitly and implicitly by a person skilled in the art that embodiments described in the specification may be combined with another embodiment.

Terms used in the following embodiments of this application are merely intended to describe specific embodiments, but are not intended to limit this application. As used in the specification of this application and the appended claims, the singular expression "a", "an", "the", "the foregoing", "such a", or "this" is intended to also include a plural expression unless otherwise clearly indicated in the context. It should also be understood that, the term "and/or" used in this application indicates and includes any or all possible combinations of one or more associated listed items. For example, "A and/or B" may represent any one of three cases: Only A exists, only B exists, or both A and B exist, where A and B may be singular or plural. The term "a plurality of" used in this application means two or more than two.

It may be understood that in embodiments of this application, "B corresponding to A" indicates that there is a correspondence between A and B, and B may be determined based on A. However, it should be further understood that determining (or generating) B based on (or based on) A does not mean that B is determined (or generated) based only on (or based on) A, and B may alternatively be determined (or generated) based on (or based on) A and/or other information.

To facilitate understanding of the solutions in this disclosure, related concepts of an LDPC code in this disclosure are first described.

The LDPC code is short for low-density parity-check code. Literally, the LDPC code is a parity check code featuring a low density. The low density herein means that a parity check matrix of the LDPC code has a low density. Therefore, to understand what the LDPC code is, three concepts: the parity check code, the parity check matrix, and the low density, are needed to be understood first.

1. Parity Check Code

The parity check code is an encoding method in which a quantity of "1" in a code word is always an odd number or an even number by adding a redundancy bit, and is an error-detection code. The parity check code is usually used for digital encoding in a binary field of 0 and 1. One or more bits (parity bits) are added to the end of a code word. Whether an error occurs in the code word before and after transmission is determined by determining whether a quantity of 1 in the code word is an odd number or an even number. For example, if parity check is performed on a code word 100, a parity bit may be 1. In this case, a sum (exclusive OR) value s of the entire code word is 0, namely, 1001. If the value changes to 1101 after transmission, an information bit (which may be referred to as a bit) is incorrect, s is 1, and it can be determined that a transmission error occurs. It should be understood that if an even quantity of information bits is incorrect, an algorithm is invalid. Therefore, further, a plurality of parity bits may be set. For example, a four-bit code word 1101 may be grouped, and a first bit of parity bits is used to check a first bit and a second bit that are of information bits (namely, the first two bits 11 of the information bits). For example, if a sum of the first two bits of the information bits is 0, the first bit of the parity bits should be 0. Similarly, a second bit of the parity bits may be used to check the last two information bits of the code word 1101, and therefore the second bit of the parity bits is set to 1. Therefore, an encoded code word is 110101. This is actually a check idea of the LDPC code, that is, a meaning of "PC". It can be learned that the LDPC code is a block code, and actually uses parity check. If the low density feature is added, the LDPC code can be obtained.

2. Parity Check Matrix and Generator Matrix

The code word 1101 is used as an example. A check relationship between information bits and parity bits of a code word may be written in a form of a matrix. The information bits are denoted as c1, c2, c3, and c4, and the parity bits are denoted as p1 and p2. c=[c1, c2, c3, c4], and x=[c1, c2, c3, c4, p1, p2]. Herein, c and x are code words before and after encoding respectively. In the example of the code word 1101, a check relationship between information bits and parity bits of the code word 1101 may be represented as the following linear relationships: c1+c2+p1=0, and c3+c4+p2=0. The linear relationships may be written as the following formula:

$$x \cdot H^T = s = 0. \quad (1)$$

$$H \text{ is } \begin{bmatrix} 1 & 1 & 0 & 0 & 1 & 0 \\ 0 & 0 & 1 & 1 & 0 & 1 \end{bmatrix}, \text{ and } s = (0, 0).$$

Herein, H is a parity check matrix, s is a syndrome, and $H^T$ indicates a transpose of H. An idea of the formula (1) is that after an original code word (an unencoded code word) c is encoded by a generator matrix G (G is determined by H), an obtained transmitted code word x needs to satisfy: $x \cdot H^T=0$. To easily determine whether a result is 0, the concept of the syndrome s is introduced. As long as s is all 0, transmission is normal. In this application, "·" represents a matrix multiplication operation, and "A·B" represents a product of multiplying matrices of a matrix A and a matrix B.

The transmitted code word x obtained by encoding c by using the generator matrix G may satisfy the following formula:

$$x = c \cdot G. \quad (2)$$

Herein, c represents an unencoded code word (or a bit sequence), and G represents the generator matrix. G and $H^T$ are orthogonal to each other, that is, $G \cdot H^T=0$. The generator matrix may be obtained by transforming the parity check matrix. In other words, after the parity check matrix is known, a generator matrix corresponding to the parity check matrix may be obtained. c may be referred to as an information code word, and x may be referred to as a transmitted code word. The formula (2) shows that the transmitted code word is obtained by multiplying the information code word by the generator matrix.

3. Low Density Feature of an LDPC Code

The low density feature of the LDPC code means that a quantity of 1 in a parity check matrix of the LDPC code is small. The LDPC code is a linear block code, and the parity check matrix of the LDPC code is a sparse matrix. A quantity of zero elements in the parity check matrix of the LDPC code is far greater than a quantity of non-zero elements. To be specific, a row weight (namely, a quantity of 1 in each row) and a column weight (namely, a quantity of 1 in each column) of the parity check matrix are far less than a code length of the LDPC code.

4. Tanner Graph

In 1981, Tanner represented a code word of an LDPC code in a graph. Currently, this graph is referred to as the Tanner graph, and the Tanner graph one-to-one corresponds to a parity check matrix. The Tanner graph includes two types of vertices. One type of vertex is a variable node, representing a code word bit. The other type of vertex is a check node, representing a check constraint relationship. Each check node represents a check constraint relationship, which is described below with reference to FIG. 1 and FIG. 2.

FIG. 1 is a parity check matrix H of an LDPC code. In FIG. 1, $\{V_i\}$ indicates a variable node set, and $\{C_i\}$ indicates a check node set. Each row of the parity check matrix H corresponds to one check equation, and each column corresponds to one code word bit. In FIG. 1, there are eight variable nodes and four check nodes. If a code word bit is included in a corresponding check equation, a connection line is used to connect an involved variable node and an involved check node, to obtain a Tanner graph.

FIG. 2 is the Tanner graph of the parity check matrix H of the LDPC code. As shown in FIG. 2, the Tanner graph represents the parity check matrix of the LDPC code. For example, for the parity check matrix H with a size of m rows and n columns, the Tanner graph includes two types of nodes: n variable nodes (which may also be referred to as information nodes or bit nodes) and m check nodes, where both m and n are integers greater than 0. The n variable nodes respectively correspond to n columns of the parity check matrix H, and the m check nodes respectively correspond to m rows of the parity check matrix H. A cycle in the Tanner graph includes vertices that are connected to each other. The cycle uses one of the vertices both as a start point and an end point, and passes through each node only once. A length of the cycle is defined as a quantity of connection lines included in the cycle. A circumference of a graph may also be referred to as a size of the graph, and is defined as a minimum cycle length in the graph. In FIG. 2, the circumference is 6, as shown in blackened connection lines in FIG. 2.

5. Encoding of an LDPC Code

Based on the foregoing descriptions, it can be learned that a transmitted code word is obtained by multiplying an information code word by a generator matrix, and the generator matrix may be obtained by transforming a parity check matrix. Therefore, an entire LDPC code encoding process is actually a process of constructing a parity check matrix. FIG. 3 shows an example of an LDPC code encoding process. As shown in FIG. 3, a parity check matrix H may be changed to H=[I P] through Gaussian elimination; a generator matrix $G=[-P^T\ I]$ is obtained based on $G \cdot H^T=0$; and an information code word c is encoded by using the generator matrix G to obtain a transmitted code word x, that is, $x=c \cdot G$. I represents an information bit part, P represents a parity bit part, and x is the transmitted code word.

6. Decoding of an LDPC Code

In an LDPC code decoding process, message iteration is continuously performed between variable nodes and check nodes according to a check rule between parity bits and information bits until a code word satisfying $x \cdot H^T=0$ is found, and an output x is a decoded code word. A decoding algorithm of the LDPC code includes three types: hard decision decoding, soft decision decoding, and hybrid decoding.

7. Quasi-Cyclic Low-Density Parity-Check (QC-LDPC) Code

An LDPC code used in the IEEE 802.11ac and 802.11ax standards is a QC-LDPC code.

The QC-LDPC code is a type of structured LDPC code. Due to a unique structure of a parity check matrix of the QC-LDPC code, a simple feedback shift register may be used during encoding, to reduce encoding complexity of the LDPC code.

A parity check matrix H of an LDPC code with a code length N=1944 and a code rate R=5/6 in the IEEE802.11ac standard is as follows:

| | | | | | | | | | | | | | | | | | | | | | | | |
|---|---|---|---|---|---|---|---|---|---|---|---|---|---|---|---|---|---|---|---|---|---|---|---|
| 13 | 48 | 80 | 66 | 4 | 74 | 7 | 30 | 76 | 52 | 37 | 60 | – | 49 | 73 | 31 | 74 | 73 | 23 | – | 1 | 0 | – | – |
| 69 | 63 | 74 | 56 | 64 | 77 | 57 | 65 | 6 | 16 | 51 | – | 64 | – | 68 | 9 | 48 | 62 | 54 | 27 | – | 0 | 0 | – |
| 51 | 15 | 0 | 80 | 24 | 25 | 42 | 54 | 44 | 71 | 71 | 9 | 67 | 35 | – | 58 | – | 29 | – | 53 | 0 | – | 0 | 0 |
| 16 | 29 | 36 | 41 | 44 | 56 | 59 | 37 | 50 | 24 | – | 65 | 4 | 65 | 52 | – | 4 | – | 73 | 52 | 1 | – | – | 0 |

The parity check matrix H is a matrix with a size of (4×24). Each element (except "-") in the parity check matrix H represents a z=N/24-order square matrix. "-" in the parity check matrix represents a (z×z) all-zero square matrix. Each item $P_i$ in the parity check matrix represents a (z×z) circulant permutation matrix, and i ($0 \le i \le z-1$) represents a cyclic shift value. An element in a first row and a first column in the parity check matrix is used as an example, and $P_i=13$.

For example, $P_i=0$ represents an identity matrix with a size of (z×z), and $P_i=1$ represents the following circulant permutation matrix:

$$\begin{bmatrix} 0 & 1 & 0 & \dots & 0 \\ 0 & 0 & 1 & \dots & 0 \\ \vdots & \vdots & \vdots & \ddots & \vdots \\ 0 & 0 & 0 & \dots & 1 \\ 1 & 0 & 0 & \dots & 0 \end{bmatrix}$$

8. LDPC Encoding in a WLAN

Some WLAN standards (for example, the IEEE 802.11n/ac) use an orthogonal frequency division multiplexing (OFDM) technology. An LDPC encoding module needs to encode data bits (which may be referred to as an information bit) and place the encoded data bits into an integer quantity of OFDM symbols, and these encoded bits also need to be exactly capable of being placed into an integer quantity of LDPC code words. The foregoing step is performed. First, a transmit end obtains, through calculation, a minimum quantity $N_{SYM}$ of OFDM symbols required for current transmission; and then, calculates, based on $N_{SYM}$ and a current encoding modulation scheme, a total quantity of encoded bits that can be stored in all OFDM symbols: $N_{TCB}=N_{CBPS}*N_{SYM}$, where $N_{CBPS}$ is a quantity of bits that can be stored in each OFDM symbol. Subsequently, the transmit end calculates, based on the obtained result, a code length of an LDPC used in the current transmission and a quantity of required code words. For most combinations of bit lengths and encoding modulation schemes of to-be-encoded data, because there are not enough data bits to fill a data bit part in the LDPC code word, a shortening operation needs to be performed before a parity bit is generated. The data bit part in the LDPC code word includes only an information bit (or a data bit), and does not include a parity bit.

In this application, the shortening operation means that before the parity bit is generated through LDPC encoding, a specific quantity of 0s is filled in a data bit part of code word information, and these 0s are deleted after the parity bit is generated through encoding. FIG. 4 is a diagram of a shortening operation part in an LDPC encoding process. As shown in FIG. 4, 401 represents to-be-encoded data bits (payload bits); step 1 is to calculate a length of an LDPC code word and a quantity of code words required for sending the to-be-encoded data bits, and 402 shows the length of the LDPC code word and the quantity of code words; step 2 is to perform a shortening operation on the to-be-encoded data bits, and 403 shows code words including data bits and shortening zero bits; step 3 is to generate parity bits by using the data bits and shortening zero bits, and 404 shows code words including the data bits, the shortening zero bits, and the parity bits; and these shortening zero bits are then discarded (discard shortening bits), and 405 shows code words including only the data bits and the parity bits.

9. Obtaining a Mother Matrix by Extending a Parity Check Matrix

The mother matrix is a large matrix, and parity check matrices of different sizes may be read from the mother matrix. The parity check matrices that are of different sizes and that are read from the mother matrix correspond to different code rates. The mother matrix may be obtained by extending a parity check matrix (hereinafter referred to as a base matrix). For example, when the base matrix is read from the mother matrix, the base matrix is the parity check matrix. In this case, a code rate corresponding to the parity check matrix is the largest. When the entire mother matrix is read, the mother matrix is the parity check matrix. In this case, a code rate corresponding to the parity check matrix is the smallest. The following describes, with reference to an example, how to obtain the mother matrix by extending the parity check matrix.

If $H_{MC}$ represents a base matrix with a size of (4×24) (for example, a WLAN LDPC parity check matrix with a code length of 1944 and a code rate of 5/6), $O_{4\times100}$ represents an all-zero matrix with a size of (4×100), and $I_{100\times100}$ represents an identity matrix with a size of (100×100), a matrix HIR with a size of (100×24) is defined to form an extended mother matrix with $H_{MC}$, $O_{4\times100}$, and $I_{100\times100}$, namely, H, that is $$H=\begin{bmatrix} H_{MC} 0_{4\times100} \\ H_{IR} I_{100\times100} \end{bmatrix}. \quad (3)$$

It can be learned from the formula that, because both $O_{4\times100}$ and $I_{100\times100}$ are fixed matrices, a key of rate compatibility for the mother matrix (that is, parity check matrices with different code rates may be read from the mother matrix) lies in design and optimization of $H_{MC}$ and $H_{IR}$. If an incremental redundancy bit corresponding to a lower code rate is expected to obtain through extending $H_{MC}$, $H_{MC}$ needs to be extended by a required quantity of columns based on a required code rate. For example, if the code rate needs to be reduced from 5/6 corresponding to $H_{MC}$ to 4/7, or 324 new incremental redundancy bits corresponding to four columns need to be added on the basis of $H_{MC}$, $H_{MC}$ needs to be extended to a lower left side based on H, that is, four rows need to be extended downwards, and at the same time, four rows are extended to the right.

FIG. 5 is an example of a mother matrix obtained by extending $H_{MC}$. As shown in FIG. 5, a rectangular box at the upper left corner of the mother matrix shows a matrix $H_{MC}$, $H_{MC}$ is extended rightwards by four columns, and $H_{MC}$ is extended downwards by four rows, to obtain the mother matrix shown in FIG. 5. Each blank grid in FIG. 5 represents an all-zero matrix with a size of (81×81), the upper left corner of the mother matrix shows a matrix $H_{MC}$ with a size of (4×24), the upper right corner of the mother matrix shows a first fixed matrix, and the first fixed matrix is $O_{4\times100}$. The lower left corner of the mother matrix shows a matrix $H_{IR}$, the lower right corner of the mother matrix shows a second fixed matrix, and the fixed matrix is large $I_{100\times100}$.

A size of a matrix obtained by extending $H_{MC}$ is (8×28), as shown in the entire matrix in FIG. 5. Each element (except blank grids) in the mother matrix is a circulant permutation matrix with a size (81×81). It should be understood that a size of the entire mother matrix is (8×28), and a final size of the mother matrix obtained by extending each item is (648×2268). If a remaining code rate or a remaining quantity of incremental redundancy bits needs to be obtained, a required part may be selected from the upper left part of H as a parity check matrix according to the foregoing method. If (81·j) incremental redundancy parity bits need to be generated in addition to a code word bit corresponding to an original $H_{MC}$, the selected parity check matrix is a part with a size of (4+j)×(24+j) in the upper left part of H, and j is a positive integer.

The foregoing uses the parity check matrix $H_{MC}$ as an example to describe a process of extending the basic matrix to the mother matrix. Obtaining a mother matrix by extending another parity check matrix is also based on the same design idea.

10. Obtaining a Parity Check Matrix by Extending a Base Matrix

Base matrices of LDPC codes may be extended to parity check matrices of the LDPC codes with various code lengths as required. In other words, the parity check matrices of the LDPC codes with various code lengths may be obtained by extending the base matrices as required. The base matrix includes only two types of elements: 0 and 1. In this application, 0 in the base matrix may be replaced with blank, "-", "−1", or another number or symbol. This is not limited in this application. In this application, 1 in the base matrix corresponds to a non-all-zero square matrix (which may also be referred to as a non-all-0 square matrix), and an element 0 in the base matrix corresponds to an all-zero square matrix (which may also be referred to as an all-0 square matrix). In this application, the all-zero square matrix is a square matrix in which included elements are all 0, for example, a square matrix with a size of (34×34). In this application, the non-all-zero square matrix is a square matrix including at least one non-zero element, for example, a circulant permutation matrix (CPM). It may be understood that 1 in the base matrix may be extended to a CPM of any size, and 0 in the base matrix may be extended to an all-zero square matrix of any size. A meaning or function of 1 or 0 in the following base matrix 1 to base matrix 15 is consistent with that in the foregoing descriptions. Details are not described again.

A manner of extending the base matrix to obtain the parity check matrix is as follows: replacing 1 in the base matrix with CPMs of various cyclic factors, and replacing 0 with an all-zero square matrix of a corresponding size. Therefore, parity check matrices of a series of LDPC codes may be obtained based on the base matrix. Sizes of these parity check matrices and expansion factors of all CPMs may be different, but correspond to or complies with a same base matrix. In this application, meanings of the cyclic factor and the expansion factor are the same. Therefore, the cyclic factor and the expansion factor may be interchangeable.

The following is an example of obtaining a parity check matrix by extending a base matrix. An example of a base matrix with a size of (12×22) is as follows:

| | | | | | | | | | | | | | | | | | | | | | |
|---|---|---|---|---|---|---|---|---|---|---|---|---|---|---|---|---|---|---|---|---|---|
| 1 | 1 | 0 | 1 | 0 | 0 | 1 | 0 | 0 | 0 | 1 | 1 | 0 | 0 | 0 | 0 | 0 | 0 | 0 | 0 | 0 | 0 |
| 1 | 0 | 0 | 1 | 1 | 1 | 0 | 1 | 1 | 0 | 0 | 1 | 1 | 0 | 0 | 0 | 0 | 0 | 0 | 0 | 0 | 0 |
| 1 | 1 | 1 | 0 | 0 | 0 | 1 | 0 | 1 | 1 | 0 | 0 | 1 | 1 | 0 | 0 | 0 | 0 | 0 | 0 | 0 | 0 |
| 0 | 1 | 1 | 1 | 1 | 1 | 1 | 0 | 0 | 1 | 1 | 0 | 0 | 1 | 1 | 0 | 0 | 0 | 0 | 0 | 0 | 0 |
| 1 | 1 | 1 | 0 | 1 | 1 | 0 | 1 | 1 | 1 | 0 | 0 | 0 | 0 | 1 | 1 | 0 | 0 | 0 | 0 | 0 | 0 |
| 1 | 0 | 0 | 1 | 0 | 0 | 0 | 1 | 0 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 0 | 1 | 0 | 0 | 0 | 0 | 0 | 1 | 0 | 1 | 1 | 0 | 0 | 0 | 0 | 1 | 0 | 0 | 0 | 0 |

-continued

| | | | | | | | | | | | | | | | | | | | | | |
|---|---|---|---|---|---|---|---|---|---|---|---|---|---|---|---|---|---|---|---|---|---|
| 1 | 1 | 0 | 0 | 0 | 0 | 0 | 0 | 1 | 0 | 0 | 0 | 0 | 0 | 0 | 0 | 0 | 0 | 1 | 0 | 0 | 0 |
| 1 | 0 | 0 | 0 | 1 | 0 | 0 | 0 | 1 | 0 | 0 | 0 | 0 | 0 | 1 | 0 | 0 | 0 | 0 | 1 | 0 | 0 |
| 1 | 1 | 0 | 1 | 0 | 0 | 0 | 0 | 0 | 0 | 0 | 1 | 0 | 0 | 0 | 1 | 0 | 0 | 0 | 0 | 1 | 0 |
| 0 | 1 | 0 | 1 | 1 | 1 | 0 | 0 | 0 | 0 | 0 | 0 | 0 | 0 | 0 | 0 | 0 | 0 | 0 | 0 | 0 | 1. |

FIG. 6 shows an example of a parity check matrix (a parity check matrix 11 below) obtained by extending a base matrix (a base matrix 1 below) with a size of (12×22). As shown in FIG. 6, −1 in the parity check matrix represents an all-zero matrix with a size of (K×K), 0 in the parity check matrix represents an identity matrix with a size of (K×K), and an element greater than 0 in the parity check matrix represents a circulant permutation matrix with a size of (K×K). In this application, −1 (representing the all-zero matrix) in the parity check matrix may be replaced with blank, "-", or another number or symbol. This is not limited in this application. A meaning or function of −1 or 0 in the following parity check matrix is described above. Details are not described again.

The foregoing describes, by using an example, a process of extending the base matrix to the parity check matrix. It should be understood that any base matrix may be extended in a same manner to obtain a parity check matrix with a required code length. In this application, if a parity check matrix is obtained by extending a base matrix, it may be understood that the parity check matrix complies with (or meets) the base matrix, or the parity check matrix corresponds to the base matrix.

In order to improve transmission reliability of a wireless transmission system, an LDPC code is widely used in a WLAN standard. Compared with the IEEE 802.15.4z standard, a new IEEE 802.15ab standard may introduce a new LDPC encoding technology, to greatly improve data transmission reliability of the system. Therefore, it may be considered that a new LDPC code is designed for a next-generation WLAN standard or UWB standard, to further improve reliability and system performance of a next-generation WLAN system or UWB system.

To improve the reliability and the system performance of the next-generation WLAN system or UWB system, this application proposes designs of base matrices and corresponding parity check matrices of a group of LDPC codes for the next-generation WLAN system or UWB system. The base matrix provided in this application can effectively support a plurality of code rates, for example, a code rate from 2/3 to 1/2. The LDPC encoding scheme provided in this application can well support encoding of a short packet, for example, 20-byte (160-bit) data encoding, and obtain excellent error control performance. In addition, the base matrix of the LDPC code provided in this application may be flexibly extended to various code lengths, so that the excellent error control performance can be obtained at each code length by using a single base matrix.

The technical solutions of this application are mainly applicable to a wireless communication system. The wireless communication system may comply with a wireless communication standard of the third generation partnership project (3GPP), or may comply with another wireless communication standard, for example, wireless communication standards of 802 series (for example, 802.11, 802.15, or 802.20) of the Institute of Electrical and Electronics Engineers (IEEE).

With reference to the accompanying drawings, the following is an example of a wireless communication system to which the technical solutions of this application are applicable.

Figure 7:
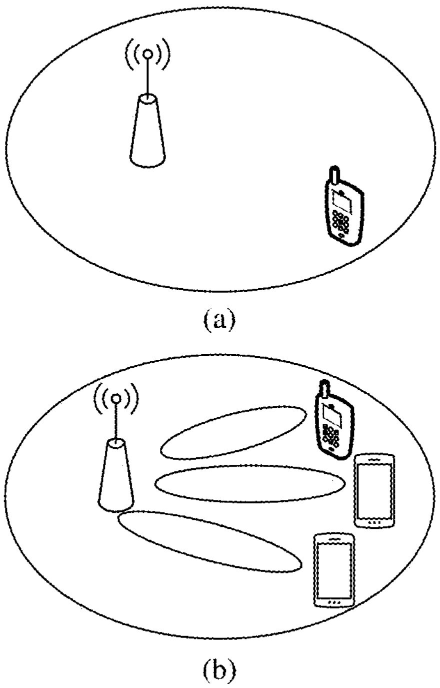
FIG. 7 is a diagram of system architectures applicable to an embodiment of this application.

Refer to FIG. 7. (a) and (b) in FIG. 7 are diagrams of system architectures applicable to an embodiment of this application. A wireless communication system includes at least one access network device and one or more terminal devices. The at least one access network device and the one or more terminal devices communicate with each other by using a wireless communication technology. For example, (a) in FIG. 7 shows communication between one access network device and a single terminal device. (b) in FIG. 7 shows communication between one access network device and a plurality of terminal devices. The communication between the access network device and the terminal device may include downlink transmission in which the access network device sends a signal to the terminal device, or may include uplink transmission in which the terminal device sends a signal to the access network device. This is not limited in this specification.

The terminal device is a device that has a wireless transceiver function. The terminal device may communicate with one or more core network (CN) devices (or referred to as core devices) via an access network device (or referred to as an access device) in a radio access network (RAN). The terminal device may be deployed on land, including an indoor or outdoor terminal device, a handheld or vehicle-mounted terminal device; or may be deployed on water (for example, on a ship); or may be deployed in the air (for example, on an aircraft, a balloon, or a satellite). In embodiments of this application, the terminal device may also be referred to as a terminal or user equipment (UE), and may be a mobile phone, a station (STA), a mobile station (MS), a tablet computer (pad), or a computer with a wireless transceiver function, a virtual reality (VR) terminal device, an augmented reality (AR) terminal device, a wireless terminal device in industrial control, a wireless terminal device in self driving, a wireless terminal device in remote medical, a wireless terminal device in a smart grid, a wireless terminal device in transportation safety, a wireless terminal device in a smart city, a wireless terminal device in a smart home, a subscriber unit, a cellular phone, a wireless data card, a personal digital assistant (PDA) computer, a tablet computer, a laptop computer, a machine type communication (MTC) terminal device, and the like. The terminal device may include various handheld devices, vehicle-mounted devices, wearable devices, or computing devices that have a wireless communication function, or another processing device connected to a wireless modem. Optionally, the terminal device may be a handheld device (handset) having a wireless communication function, a vehicle-mounted device, a wearable device, or a terminal device in the Internet of Things or the Internet of Vehicles, a terminal device in any form in 5G and an evolved communication system after 5G, or the like. This is not limited in this application. The terminal device may support a 3GPP wireless communication standard, or may support the IEE802 series (for example, 802.11, 802.15, or 802.20) wireless communication standard.

The access network device may be any device that has a wireless transceiver function and can communicate with a terminal, for example, a RAN node that enables the terminal to access a wireless network. Currently, for example, some RAN nodes include a macro base station, a micro base station (also referred to as a small cell), a relay station, an access point, a gNB, a transmission reception point (TRP), an evolved NodeB (eNB), a radio network controller (RNC), a home base station (for example, a home evolved NodeB, or a home NodeB, HNB), a baseband unit (BBU), a wireless access point (AP), integrated access and backhaul (IAB), a transmission reception point (TRP), a transmission point (TP), or the like. In addition, the access network device may alternatively be a network node forming the gNB or the TRP, for example, the BBU, a central unit (CU), or a distributed unit (DU). The access network device may support a 3GPP wireless communication standard, or may support the IEE802 series (for example, 802.11, 802.15, or 802.20) wireless communication standard.

The following provides an LDPC code encoding method with reference to the accompanying drawings in this application.

Figure 8:
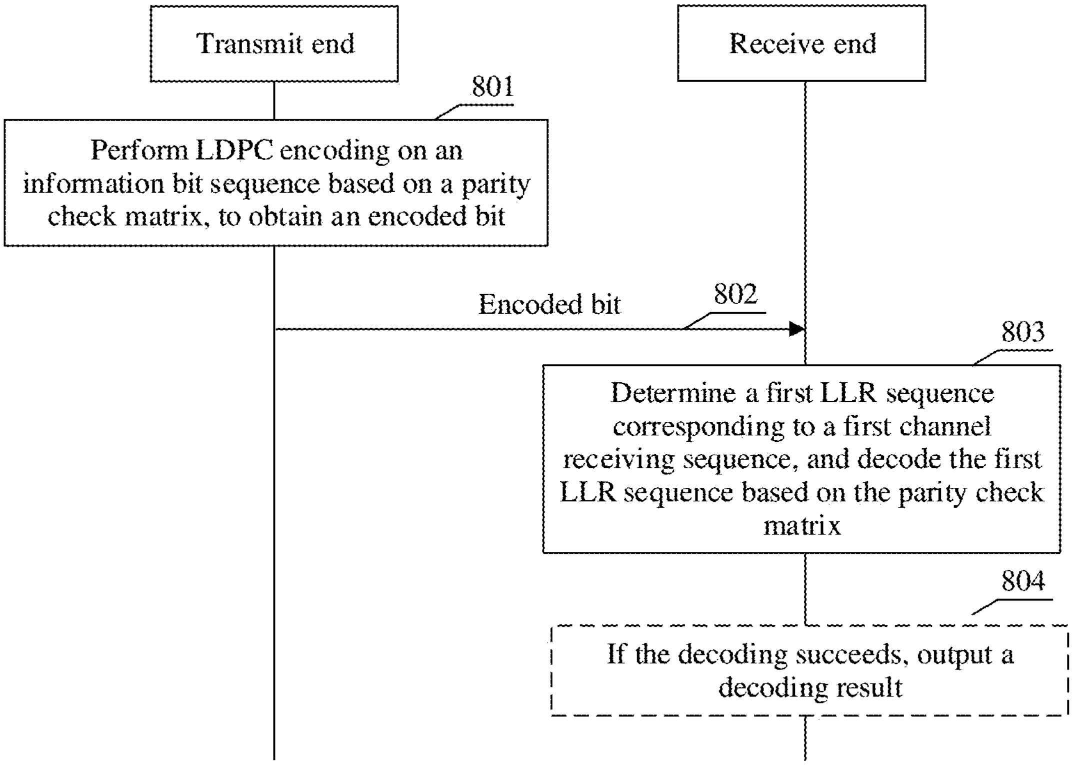
FIG. 8 is an interaction flowchart of an LDPC code encoding method according to an embodiment of this application.

FIG. 8 is an interaction flowchart of an example LDPC code encoding method according to an embodiment of this application. As shown in FIG. 8, the method includes the following steps.

801: A transmit end performs LDPC encoding on an information bit sequence based on a parity check matrix, to obtain an encoded bit.

The transmit end may be a terminal device, or may be an access network device. In this application, performing LDPC encoding on the information bit sequence based on the parity check matrix may be: multiplying the information bit sequence by a generator matrix corresponding to the parity check matrix, to obtain a first code word. For a specific process, refer to LDPC code encoding and LDPC encoding in a WLAN described above. A specific manner of performing LDPC encoding on the information bit sequence based on the parity check matrix is not limited in this application.

In this application, an operation or processing performed by a transmit end (for example, an operation or processing performed by the transmit end in the method procedure in FIG. 8) may be performed by the transmit end, or may be performed by a chip, a circuit system, or the like disposed in the transmit end. The circuit system may be, for example, an integrated circuit or a logic circuit. The chip may be, for example, a system on chip (SoC) chip or a baseband modem chip. This is not limited in this specification. The following uses the transmit end as an example for description. It should be understood that the transmit end in this embodiment is an encoding device. In this application, the operation or processing performed by the receive end may be performed by the receive end, or may be performed by a chip, a circuit system, or the like disposed in the receive end. The circuit system may be, for example, an integrated circuit or a logic circuit. The chip may be, for example, the SoC chip or the baseband modem chip. This is not limited in this specification. The following uses the receive end as an example for description. The receive end may be a terminal device or an access network device. It should be understood that the receive end in this embodiment is a decoding device.

The parity check matrix complies with (or meets) a base matrix. In other words, the parity check matrix is obtained by extending a base matrix or a submatrix of the base matrix. Because a process of obtaining the parity check matrix by extending the base matrix is described above, details are not described herein again. The parity check matrix may be divided into two parts. One part is an information bit, and the other part is a parity bit. For example, the first F columns of the parity check matrix are the information bit part, an $(F+1)^{th}$ column to the last column are the parity bit part, and F is an integer greater than 0. The base matrix includes a core matrix, an extension matrix, a first fixed matrix, and a second fixed matrix. The core matrix is located at an upper left corner of the base matrix, and the extension matrix is located at a lower left corner of the base matrix. The first fixed matrix is located at an upper right corner of the base matrix. The second fixed matrix is located at a lower right corner of the base matrix. A quantity of rows of the core matrix is equal to a quantity of rows of the first fixed matrix. A quantity of rows of the extension matrix is equal to a quantity of rows of the second fixed matrix, and a quantity of columns of the extension matrix is equal to a quantity of columns of the core matrix. A quantity of columns of the first fixed matrix is equal to a quantity of columns of the second fixed matrix. Optionally, the second fixed matrix is an identity matrix. Optionally, the first fixed matrix is an all-zero matrix.

In a possible implementation, the transmit end stores one or more parity check matrices complying with the base matrix, and different parity check matrices have different code lengths and/or code rates. Before performing step 801, the transmit end may select, from the stored one or more parity check matrices, a parity check matrix that meets a requirement on a code length and a code rate. In this implementation, the transmit end accurately and quickly obtains the required parity check matrix based on the code length and the code rate.

In a possible implementation, the transmit end stores one or more base matrices. Before performing step 801, the transmit end may extend, based on a code rate and a code length that are selected for performing LDPC encoding on the information bit sequence, a base matrix or a submatrix of a matrix to obtain a parity check matrix having a required code length and code rate. For example, the transmit end stores a base matrix with a size of (12×22), and the first two columns of the base matrix are punctured columns; and the transmit end may obtain, through extension based on the base matrix, a parity check matrix with a size of ((12*34)×(22*34)). If the transmit end performs encoding at a code rate of 1/2 based on the parity check matrix, 10*34=340 information bits are encoded to obtain a code word sequence whose length is (22−2)*34=640 bits. If the information bits are less than 340 bits, 0 may be added to the end of the information bits according to an industry practice, and then encoding is performed. In addition, after encoding, parity bits obtained through encoding may also be punctured, to obtain a higher code rate or a shorter code length. In this implementation, the transmit end only needs to store one or more base matrices, and small storage space is occupied.

An example of the base matrix provided in this application is shown as follows:

$$H' = \begin{bmatrix} H'_{MC} 0_{p\times r} \\ H'_{IR} I_{r\times r} \end{bmatrix}. \quad (4)$$

Herein, H' represents the base matrix, $$H'_{MC}$$

represents a core matrix with a size of (p×q), $$H'_{IR}$$

represents an extension matrix with a size of (r×q), $O_{p\times r}$ represents an all-zero matrix with a size of (p×r), and $I_{r\times r}$ represents an identity matrix with a size of (r×r). p, q, and r are integers greater than 0. For example, p is 6, q is 16, and r is 6. For example, p is 6, q is 17, and r is 5. For example, p is 6, q is 16, and r is 6. Optionally, p is 8, q is 18, and r is 4. The three examples are merely three possible examples of p, q, and r, and are not all examples. Values of p, q, and r are not limited in this application.

In a possible implementation, p is 6, q is 16, r is 6, and H' is a matrix with a size of (12×22) (the base matrix 1 below). An example of the base matrix is shown as follows:

1 1 0 1 0 0 1 0 0 0 1 1 0 0 0 0 0 0 0 0 0 0

1 0 0 1 1 1 0 1 1 0 0 1 1 0 0 0 0 0 0 0 0 0

1 1 1 0 0 0 1 0 1 1 0 0 1 1 0 0 0 0 0 0 0 0

0 1 1 1 1 1 1 0 0 1 1 0 0 1 1 0 0 0 0 0 0 0

1 1 1 0 1 1 0 1 1 1 0 0 0 0 1 1 0 0 0 0 0 0

1 0 0 1 0 0 0 1 0 0 1 0 0 0 0 1 0 0 0 0 0 0

1 1 0 0 0 0 0 0 0 0 0 0 0 0 0 0 1 0 0 0 0 0

0 1 0 1 0 0 0 0 0 1 0 1 1 0 0 0 0 1 0 0 0 0

1 1 0 0 0 0 0 0 1 0 0 0 0 0 0 0 0 0 1 0 0 0

1 0 0 0 1 0 0 0 1 0 0 0 0 0 1 0 0 0 0 1 0 0

1 1 0 1 0 0 0 0 0 0 0 1 0 0 0 1 0 0 0 0 1 0

0 1 0 1 1 1 0 0 0 0 0 0 0 0 0 0 0 0 0 0 0 1.

In this implementation, the base matrix is a matrix with a size of (12×22), namely, a matrix with 12 rows and 22 columns. Herein, specific parameter selection in which the base matrix is 12 rows and 22 columns is a tradeoff between implementation complexity and decoding performance of the base matrix. Generally, a smaller base matrix indicates lower implementation complexity, but a degree of freedom in designing the base matrix is also affected. Specifically, the base matrix may be extended by using a CPM of an appropriate size based on an actually required code length. In this application, the base matrix is not limited to a (12×22) matrix, and may alternatively be a matrix of another size. In actual application, a size of the base matrix to be used may be selected based on the implementation complexity and decoding performance of the base matrix.

It may be noted that the first two columns of the base matrix comply with or meet the following rule: The first two columns of the base matrix include "1 0" and "0 1" that alternate regularly, and "1 1" is included between "1 0" and "0 1". Alternatively, the first two columns of the base matrix comply with the following rule: One column includes "1 1 1 0" in sequence, and the other column correspondingly includes "1 0 1 1" obtained through cyclic shift of "1 1 1 0" in sequence. Because the first two columns of the base matrix comply with or meet the foregoing rule, decoding performance can be improved by using a parity check matrix that complies with the base matrix.

802: The transmit end sends the encoded bit.

Specifically, the step of sending may include but is not limited to: The transmit end performs, based on the LDPC-encoded bit, processing such as stream parsing, constellation mapping (Constellation mapper), LDPC carrier mapping, or possible processing such as IDFT (Inverse Discrete Fourier Transform) inverse discrete Fourier transform, so that a signal can be sent on a channel.

Correspondingly, the receive end receives, over a first channel from the transmit end, a signal (which may also be referred to as a first code word for ease of description) that carries the encoded bit. Optionally, the transmit end is a terminal device, and the receive end is an access network device. Optionally, the transmit end is an access network device, and the receive end is a terminal device.

A possible implementation of step 802 is as follows: The transmit end broadcasts the first code word. The receive end receives a first channel receiving sequence (corresponding to the first code word) from the transmit end.

A possible implementation of step 802 is as follows: The transmit end sends the first code word to the receive end (corresponding to a unicast manner). The receive end receives a first channel receiving sequence (corresponding to the first code word) from the transmit end.

803: The receive end determines a first log-likelihood ratio (LLR) sequence corresponding to the first channel receiving sequence, and decodes the first LLR sequence based on the parity check matrix.

The receive end may decode the first LLR sequence based on the parity check matrix by using any one of hard decision decoding, soft decision decoding, and hybrid decoding. This is not limited herein.

804: If decoding succeeds, the receive end outputs a decoding result.

Step 804 is optional rather than mandatory. The decoding result may be output via an output device like a display, a display screen, or an audio device. Optionally, if the receive end incorrectly performs decoding (or decoding fails), the receive end sends retransmission indication information to the transmit end, to request a transmit end device to perform retransmission. In addition, if decoding fails, the receive end stores the first LLR sequence, to combine the first LLR sequence with a subsequently received retransmitted LLR sequence for decoding.

In this embodiment, parity check matrices with different code rates and/or code lengths can be obtained by extending a base matrix or a submatrix of the base matrix, and LDPC encoding is performed by using these parity check matrices, so that not only a plurality of code rates can be compatible, but also a diversity gain can be obtained, thereby improving encoding performance.

Figure 9:
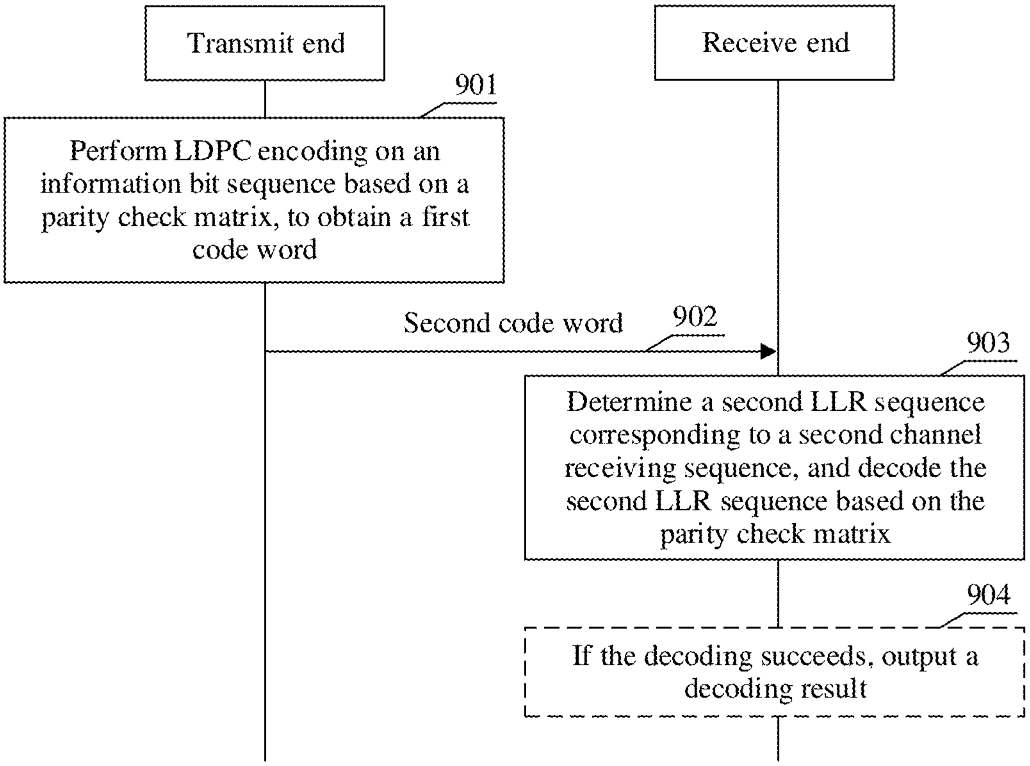
FIG. 9 is an interaction flowchart of another LDPC code encoding method according to an embodiment of this application.

FIG. 9 is an interaction flowchart of another LDPC code encoding method according to an embodiment of this application. A method interaction procedure in FIG. 9 is a possible implementation of the method described in FIG. 8. In this implementation, a transmit end punctures some information bits in a code word obtained through LDPC encoding, so that decoding performance can be improved. As shown in FIG. 9, the method includes the following steps.

901: The transmit end performs LDPC encoding on an information bit sequence based on a parity check matrix, to obtain a first code word.

For step 901, refer to step 801. The parity check matrix is obtained by extending a base matrix or a submatrix of the base matrix. The first code word may be understood as an encoded bit obtained by the transmit end by performing LDPC encoding on the information bit sequence based on the parity check matrix.

In a possible implementation, any row in the first two columns of the base matrix includes at least one 1. In other words, in the first two columns of the base matrix, at least one of two elements in each row is 1. For Example 1 of the first two columns of the base matrix, one column of the first two columns of the base matrix sequentially includes the following elements: 1 1 1 0 1 1 1 0 1 1 1 0, and the other column of the first two columns of the base matrix sequentially includes the following elements: 1 0 1 1 1 0 1 1 1 0 1 1, where 1 in the foregoing base matrix corresponds to a circulant permutation matrix CPM, and 0 in the foregoing base matrix corresponds to an all-zero square matrix. In this example, a first submatrix is a matrix with 12 rows and 2 columns.

In this implementation, information may be quickly transmitted, exchanged, decoded and updated between code word bits corresponding to each column in the parity check matrix (corresponding to the base matrix) by using a heavy column in the first two columns of the base matrix, to accelerate an overall decoding convergence speed of a system.

In a possible implementation, the first two columns of the base matrix are punctured columns. In other words, a first information bit in the first code word does not participate in transmission, and the first information bit is obtained by performing LDPC encoding on submatrices that are in the parity check matrix and that corresponds to the first two columns of the base matrix. In other words, the first two columns of the base matrix are punctured nodes. Herein, puncturing is a common operation in channel encoding in which a corresponding bit is not transmitted after encoding. Details are not described herein again. The first two columns of the parity check matrix that complies with the base matrix participate in encoding, but an information bit obtained through encoding based on the two columns do not participate in transmission.

A specific design principle in which the first two columns of the base matrix are punctured columns as follows: A heavier weight of a punctured column indicates better performance of the punctured column in a long code. However, for a short code, if a column weight is too heavy, a subgraph structure with lossy decoding performance, such as a short loop or a trap set, appears in a corresponding factor graph. Therefore, weights and sparsity of the first two columns of the base matrix in this application are controlled by using the design shown in Example 1, and a compromise is made between short code performance and long code performance.

The first two columns with heavy weights in the base matrix are directly punctured and do not participate in transmission. Because the two columns with the heavy weights can quickly transmit, exchange, decode, and update information between code word bits corresponding to each column in the matrix, an overall decoding convergence speed of a system is accelerated. However, because the column weights of the two columns are heavy, if transmission is performed and an error occurs in bits corresponding to the two columns, the error is quickly propagated to another code word bit. This adversely affects decoding. Therefore, the two columns participate in actual encoding, but corresponding bits are punctured and not transmitted.

Optionally, a seventeenth column of the base matrix includes only one 1 and 1 is located in a seventh row of the base matrix, at least one element in the first two columns of the seventh row of the base matrix is 0, and elements in the seventeenth column of the seventh row of the base matrix are 1. The first two columns of the base matrix are combined with the seventh row (there is only one 1 at a corresponding location except the first two columns) and the seventeenth column (there is only one 1) of the base matrix, so that decoding performance can be greatly improved.

In another implementation, the first two columns of the base matrix in Example 1 may be replaced with two columns that meet a similar characteristic. As described above, the first two columns of the base matrix include “1 0” and “0 1” that alternate regularly, and “1 1” is included between “1 0” and “0 1”. Alternatively, the first two columns of the base matrix comply with the following rule: Each column includes, in sequence, “1 1 1 0” or cyclic shifts “1 0 1 1” of “1 110”.

902: The transmit end sends a second code word.

Correspondingly, a receive end receives a second channel receive sequence (corresponding to the second code word) from the transmit end. Optionally, the transmit end is a terminal device, and the receive end is an access network device. Optionally, the transmit end is an access network device, and the receive end is a terminal device. For step 902, refer to step 802.

Optionally, before sending the second code word, the transmit end punctures the first code word to obtain the second code word. For example, the transmit end punctures a first information bit in the first code word to obtain the second code word. The first information bit is obtained by performing LDPC encoding on submatrices that are in the parity check matrix and that corresponds to the first two columns of the base matrix. The second code word may be understood as a bit obtained by puncturing an encoded bit.

903: The receive end determines a second LLR sequence corresponding to the second channel receiving sequence, and decodes the second LLR sequence based on the parity check matrix.

Decoding herein is decoding performed after puncturing. A decoding process may be hard decision decoding, soft decision decoding, or hybrid decoding. Details are not described again.

904: If decoding succeeds, the receive end outputs a decoding result.

Step 904 is optional rather than mandatory. For step 904, refer to step 804.

In this embodiment, the transmit end punctures some information bits in the code word obtained through LDPC encoding, so that an overall decoding convergence speed of a system can be accelerated, and adverse impact on decoding can be avoided.

Figure 10:
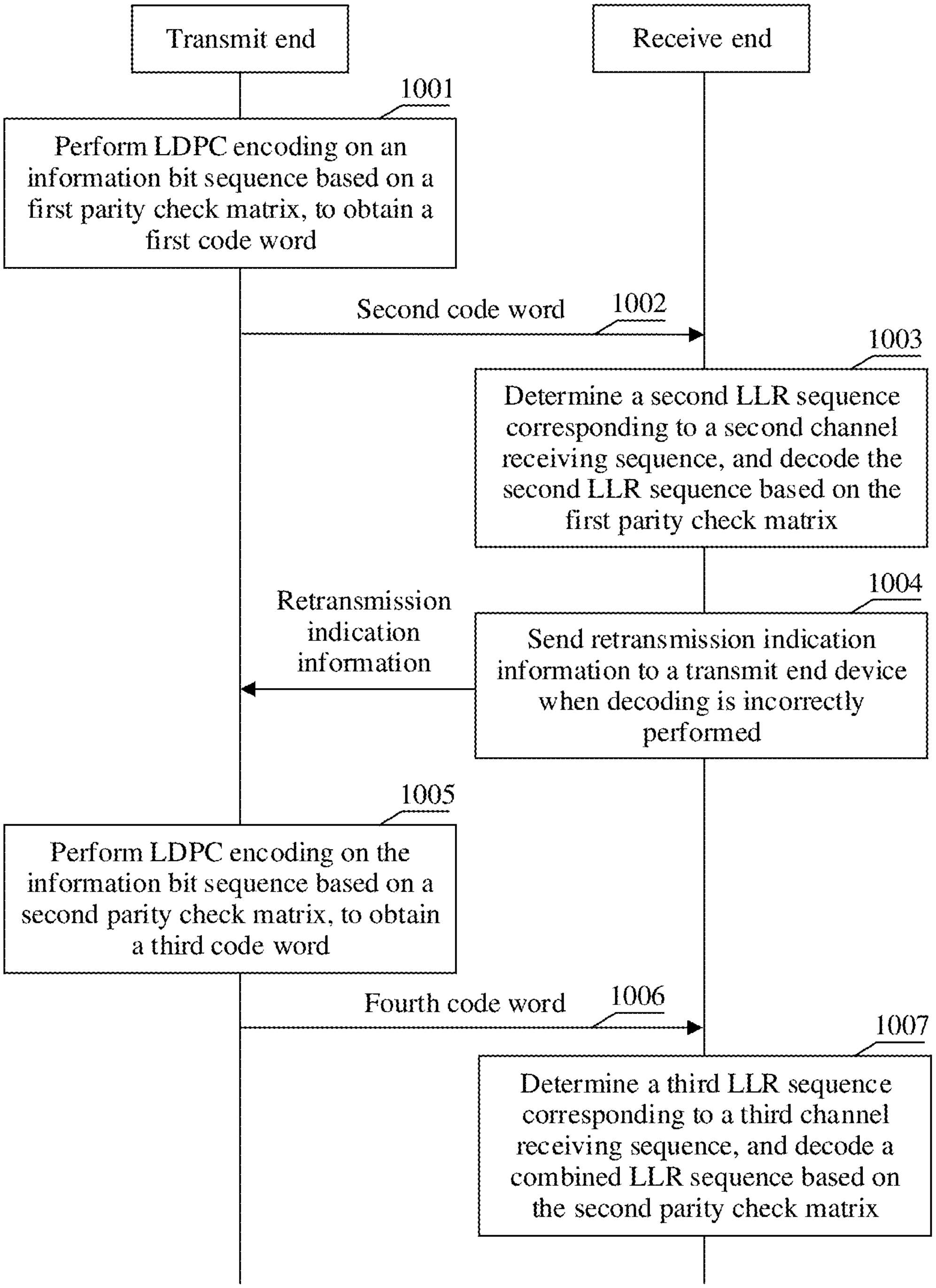
FIG. 10 is an interaction flowchart of another LDPC code encoding method according to an embodiment of this application.

FIG. 10 is an interaction flowchart of another example LDPC code encoding method according to an embodiment of this application. A method interaction procedure in FIG. 10 is a possible implementation of the method described in FIG. 8. In this implementation, if a first transmission fails, a receive end performs LDPC encoding by using a parity check matrix with a lower code rate, and decodes a combined LLR sequence. In retransmission, based on an information bit sequence, an incremental redundancy parity bit is added, and a channel encoding rate is reduced. Therefore, a decoding success rate of a receive end device can be improved, a quantity of retransmissions can be reduced, a retransmission delay can be reduced, and decoding performance can be improved.

1001: A transmit end performs LDPC encoding on an information bit sequence based on a first parity check matrix, to obtain a first code word.

For step 1001, refer to step 801. The first parity check matrix is obtained by extending a base matrix or a submatrix of the base matrix. The first parity check matrix used by the transmit end to perform step 1001 may be the same as the parity check matrix used to perform step 801.

1002: The transmit end sends a second code word.

Correspondingly, the receive end receives a second channel receive sequence (corresponding to the second code word) from the transmit end. For step 1002, refer to step 802.

1003: The receive end determines a second LLR sequence corresponding to the second channel receiving sequence, and decodes the second LLR sequence based on the first parity check matrix.

For step 1003, refer to step 803.

1004: When decoding is incorrectly performed, the receive end sends retransmission indication information to a transmit end device.

Correspondingly, the transmit end receives the retransmission indication information from the receive end. That decoding is incorrectly performed means that the receive end does not obtain a correct decoding result by decoding the second LLR sequence based on the first parity check matrix. In other words, none of decoding results obtained by the receive end by decoding the second LLR sequence can pass the check performed by the first parity check matrix.

1005: The transmit end performs LDPC encoding on the information bit sequence based on a second parity check matrix, to obtain a third code word.

For step 1005, refer to step 801. The second parity check matrix is obtained by extending a base matrix or a submatrix of the base matrix. The first parity check matrix and the second parity check matrix may be obtained by extending a same base matrix. Optionally, a code rate of the second parity check matrix is lower than a code rate of the first parity check matrix.

1006: The transmit end sends a fourth code word to the receive end.

Correspondingly, the receive end receives a third channel receiving sequence (corresponding to the fourth code word) from the transmit end. For step 1006, refer to step 802. Optionally, before sending the fourth code word, the transmit end punctures the third code word to obtain the fourth code word. For example, the transmit end punctures a second information bit in the third code word to obtain the fourth code word. The second information bit is obtained by performing LDPC encoding on submatrices that are in the second parity check matrix and that correspond to the first two columns of the base matrix.

1007: The receive end determines a third LLR sequence corresponding to the third channel receiving sequence and decodes a combined LLR sequence based on the second parity check matrix.

The combined LLR sequence is obtained by combining the second LLR sequence and the third LLR sequence by the receive end. Optionally, the second LLR sequence and the third LLR sequence are combined bitwise. LLR values at a same location index of the second LLR sequence and the third LLR sequence are combined, and LLR values at different index locations continue to be reserved.

Further, if the receive end successfully decodes the combined LLR sequence based on the second parity check matrix, the receive end outputs a decoding result. If the receive end fails to decode the combined LLR sequence based on the second parity check matrix, the receive end performs next retransmission. By analogy, decoding fails until decoding succeeds or a specified maximum quantity of retransmissions is reached.

It can be learned that after one transmission failure, the transmit end encodes the information bit sequence based on a parity check matrix corresponding to a lower code rate, so that a quantity of redundancy bits can be increased, and a code rate of an encoded code word is reduced. In retransmission, based on an information bit sequence, an incremental redundancy parity bit is added, and a channel encoding rate is reduced. Therefore, a decoding success rate of a receive end device can be improved, a quantity of retransmissions can be reduced, a retransmission delay can be reduced, and decoding performance can be improved.

The foregoing describes in detail the LDPC encoding method provided in this application. According to the encoding method provided in this application, a plurality of code rates can be compatible. The following mainly describes base matrices provided in this application and examples of some parity check matrices extended from these base matrices.

The base matrices provided in this application may be extended to parity check matrices of LDPC codes with various code lengths as required. As described above, the parity check matrices of the LDPC codes with various code lengths can be obtained by replacing 1 in the base matrices with CPMs of various cyclic factors and replacing 0 with all-zero square matrices of corresponding sizes. In other words, a series of parity check matrices of LDPC codes may be obtained by using one base matrix. Extension sizes of these parity check matrices and extension factors of all CPMs may be different, but correspond to a same base matrix.

It should be noted that a base matrix obtained by performing various row-column permutations on the base matrix provided in this application is equivalent to the base matrix provided in this application. In other words, the base matrix obtained by performing row-column permutation on the base matrix provided in this application also belongs to the base matrix protected in this application. The various row-column permutations of the base matrix mean that one or more elements in the base matrix are replaced with another element or other elements. In other words, after being replaced with the another element or the other elements, the one or more elements in the base matrix are equivalent to the base matrix. In other words, replacing the one or more elements in the base matrix with the another element or the other elements may also be considered as the base matrix. In this application, the row-column permutation of the base matrix may include any one of the following: one or more elements in a row of the base matrix are replaced with another element, one or more elements in a column of the base matrix are replaced with another element, a plurality of elements in different rows of the base matrix are replaced with other elements, a plurality of elements in different columns of the base matrix are replaced with other elements, locations of the plurality of rows in the base matrix change, and locations of the plurality of columns in the base matrix change. For example, locations of two columns in the base matrix are exchanged. Replacing one element with another element may be understood as replacing the element with any element different from the element. For example, one or more elements 0 in the base matrix are replaced with an element 1. For another example, one or more elements 1 in the base matrix are replaced with an element 0.

Figure 11:
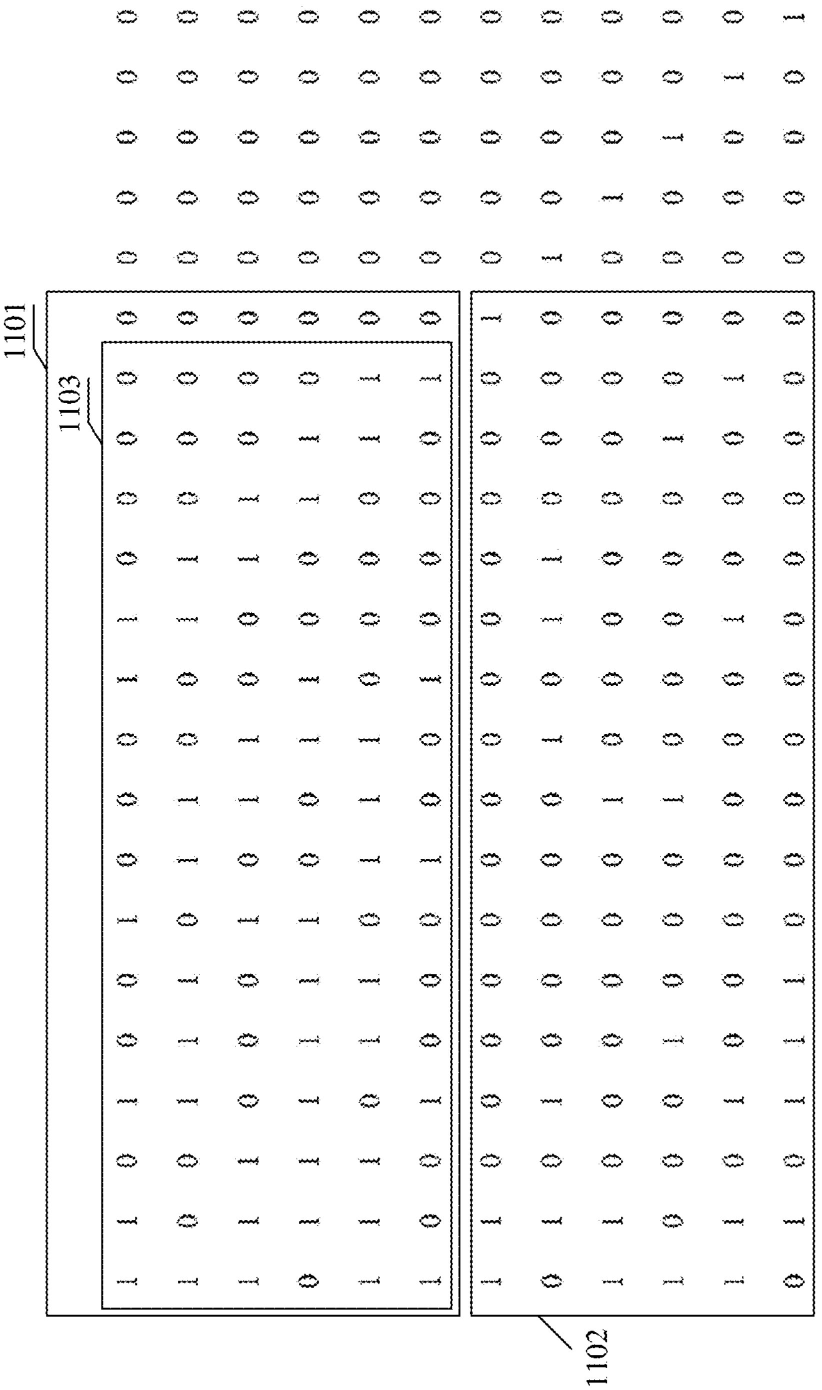
FIG. 11 is an example of a base matrix according to an embodiment of this application.

FIG. 11 is an example of a base matrix according to an embodiment of this application. As shown in FIG. 11, a matrix in a rectangular block 1101 is a core matrix of the base matrix, a matrix in a rectangular block 1102 is an extension matrix of the base matrix, a matrix in a rectangular block 1103 is a submatrix of the base matrix, and a lower right corner of the base matrix is an identity matrix. This application further protects a local matrix (namely, the submatrix) of the base matrix provided in this application, for example, the matrix in the rectangular block 1101, the matrix in the rectangular block 1102, or the matrix in the rectangular block 1103.

Refer to FIG. 11. The base matrix provided in this application is a (12×22) two-dimensional matrix. Optionally, the first two columns of the base matrix provided in this application are punctured columns. In the base matrix provided in this application, the first 10 columns correspond to information bits, and subsequent columns (namely, the last 12 columns) correspond to parity bits. Therefore, a minimum code rate of the base matrix is R=10/(22−2)=1/2. It may be understood that a code rate of the parity check matrix obtained by extending the base matrix is 1/2. If a transmit end works at a code rate R=2/3, a parity check matrix used by the transmit end is obtained by extending a submatrix in an upper left corner part of the base matrix (referring to the rectangular block 1101): R=10/(17−2)=2/3. It can be learned that parity check matrices with different code rates may be obtained by extending the base matrix, so that a plurality of code rates, for example, 1/2 to 2/3, can be effectively supported. In addition to the foregoing two types of code rates, the base matrix provided in this application may also work at another code rate, and specifically depends on a quantity of rows and columns of the matrix obtained during encoding. For example, if the first nine rows and the first 19 columns of the base matrix are used, a code rate R=10/(17−2+2)=10/17 may be obtained.

FIG. 12 is an example of a parity check matrix according to an embodiment of this application. The parity check matrix in FIG. 12 may be obtained by extending the base matrix shown in FIG. 11 by using a (34×34) CPM. As shown in FIG. 12, a code rate when a matrix in a rectangular block 1201 is used as the parity check matrix is R=2/3, and a code rate when the entire matrix shown in FIG. 12 is used as the parity check matrix is 1/2. The matrix in the rectangular block 1201 corresponds to the matrix in the rectangular block 1101 in FIG. 11. In addition, base matrices provided in this application may be extended to parity check matrices of LDPC codes with various code lengths as required. It can be learned that excellent error control performance can be obtained at each code length by using a single base matrix. Therefore, the base matrices provided in this application may be flexibly extended to obtain parity check matrices with different code rates and code lengths.

An example of encoding is as follows: For a base matrix (namely, a parity check matrix) obtained after CPM extension with a size of (Z×Z), an information bit sequence may be first divided into (10×Z) sub-information sequences, where a part less than (10×Z) may be padded with 0 at any location in the sub-information sequences, generally, 0 are added to a tail of the sub-information sequence (that is, a shortening operation in conventional channel encoding). Subsequently, regardless of a code rate required by a system (namely, a transmit end), encoding is first performed by using a part that is of an extended base matrix and that corresponds to the rectangular block 1201. An encoding method is similar to an LDPC encoding method in 802.11n. Subsequently, a remaining parity bit sequence may continue to be encoded based on a required code rate or a quantity of transmitted bits and based on an encoded word sequence by using a remaining part of the extended base matrix. The remaining parity bit sequence may be encoded through a recursive operation, and a specific method is similar to an existing 5G NR LDPC encoding method. Finally, information bits corresponding to the first two columns of the base matrix are punctured and not transmitted, and then 0-padded bits during encoding are removed, and finally a code word bit sequence required for system transmission is obtained. A specific encoding process is shown in FIG. 2. The information bits corresponding to the first two columns of the base matrix are obtained by encoding an extended part of the first two columns of the base matrix.

Figure 13:
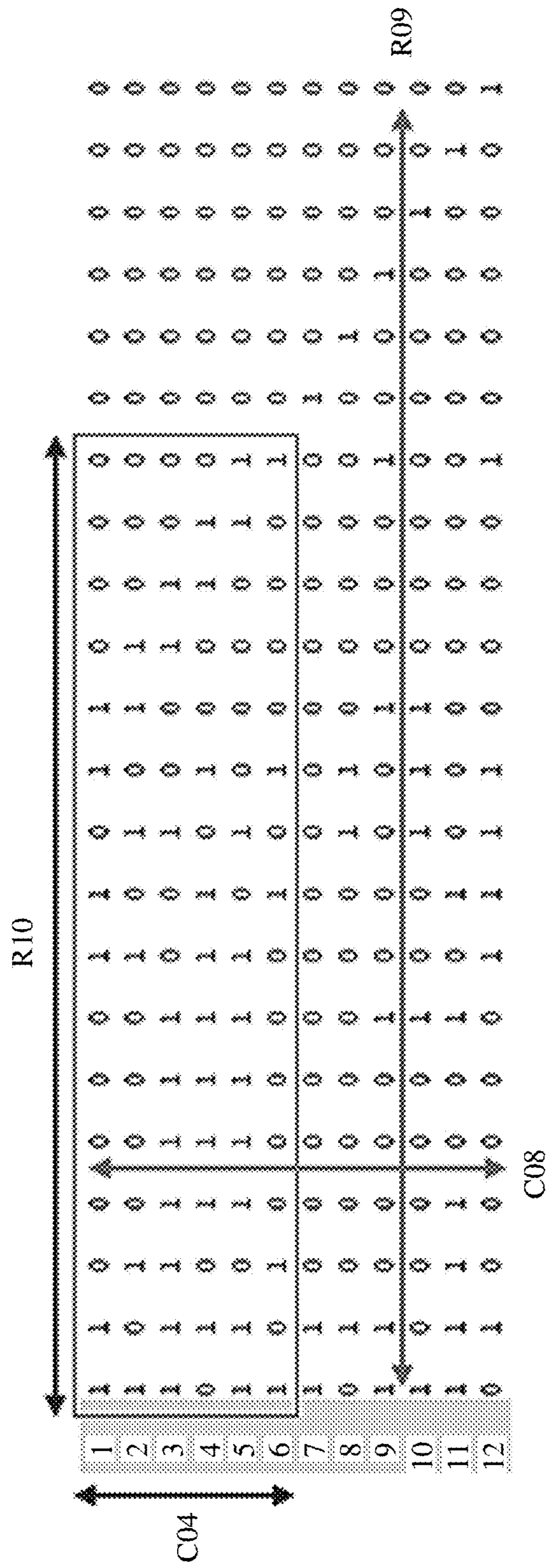
FIG. 13 is an example of another base matrix according to an embodiment of this application.

FIG. 13 is an example of another base matrix according to an embodiment of this application. A matrix in a rectangular box is a matrix 1, R10 indicates that a maximum quantity of 1 in each row of the matrix 1 does not exceed 10, C04 indicates that a maximum column weight (excluding the first two columns) of the matrix 1 does not exceed 4, C08 indicates that a maximum column weight of the base matrix does not exceed 8, and R09 indicates that a maximum row weight of a part of the base matrix other than the matrix 1 does not exceed 9. In other words, C04 indicates that none of column weights of a third column to a sixteenth column of the matrix 1 exceeds 4. R09 indicates that none of row weights of a seventh row to a twelfth row of the base matrix exceeds 9. The base matrix shown in FIG. 13 meets a row-column weight constraint condition C04_R10_C08_R09. It should be understood that C04_R10_C08_R09 is merely an example of a row-column weight constraint condition of a base matrix, and a meaning of another row-column weight constraint condition is similar to a meaning of C04_R10_C08_R09.

It should be noted that Thr is a decoding threshold obtained when a ½ part of a code rate of the base matrix in this application is used. The decoding threshold refers to minimum Eb/NO required for successful decoding of an LDPC code corresponding to the base matrix when a code length is infinite. Gap refers to a distance (expressed in dB) between the decoding threshold and Eb/NO corresponding to a channel capacity of a corresponding code rate. Eb represents signal energy averaged to each bit, and NO represents power spectral density of a noise. Correspondingly, Thr_2 is a decoding threshold obtained when a 2/3 part of a code rate of the base matrix in this application is used, and Gap_2 is a distance (represented in dB) between the decoding threshold and Eb/NO corresponding to a channel capacity of a corresponding code rate.

The following shows an example of a base matrix that meets the row-column weight constraint condition C04_R10_C08_R09 and that is provided in this application. These base matrices may consider both implementation complexity and decoding performance of the base matrices.

Base Matrix 1:

| | | | | | | | | | | | | | | | | | | | | | |
|---|---|---|---|---|---|---|---|---|---|---|---|---|---|---|---|---|---|---|---|---|---|
| 1 | 1 | 0 | 1 | 0 | 0 | 1 | 0 | 0 | 0 | 1 | 1 | 0 | 0 | 0 | 0 | 0 | 0 | 0 | 0 | 0 | 0 |
| 1 | 0 | 0 | 1 | 1 | 1 | 0 | 1 | 1 | 0 | 0 | 1 | 1 | 0 | 0 | 0 | 0 | 0 | 0 | 0 | 0 | 0 |
| 1 | 1 | 1 | 0 | 0 | 0 | 1 | 0 | 1 | 1 | 0 | 0 | 1 | 1 | 0 | 0 | 0 | 0 | 0 | 0 | 0 | 0 |
| 0 | 1 | 1 | 1 | 1 | 1 | 1 | 0 | 0 | 1 | 1 | 0 | 0 | 1 | 1 | 0 | 0 | 0 | 0 | 0 | 0 | 0 |
| 1 | 1 | 1 | 0 | 1 | 1 | 0 | 1 | 1 | 1 | 0 | 0 | 0 | 0 | 1 | 1 | 0 | 0 | 0 | 0 | 0 | 0 |
| 1 | 0 | 0 | 1 | 0 | 0 | 0 | 1 | 0 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 0 | 1 | 0 | 0 | 0 | 0 | 0 | 1 | 0 | 1 | 1 | 0 | 0 | 0 | 0 | 1 | 0 | 0 | 0 | 0 |
| 1 | 1 | 0 | 0 | 0 | 0 | 0 | 0 | 1 | 0 | 0 | 0 | 0 | 0 | 0 | 0 | 0 | 0 | 1 | 0 | 0 | 0 |
| 1 | 0 | 0 | 0 | 1 | 0 | 0 | 0 | 1 | 0 | 0 | 0 | 0 | 0 | 1 | 0 | 0 | 0 | 0 | 1 | 0 | 0 |
| 1 | 1 | 0 | 1 | 0 | 0 | 0 | 0 | 0 | 0 | 0 | 1 | 0 | 0 | 0 | 1 | 0 | 0 | 0 | 0 | 1 | 0 |
| 0 | 1 | 0 | 1 | 1 | 1 | 0 | 0 | 0 | 0 | 0 | 0 | 0 | 0 | 0 | 0 | 0 | 0 | 0 | 0 | 0 | 1 |

Parameter information corresponding to the base matrix 1 is as follows: Thr=0.5571 dB, Gap=0.3953 dB Thr_2=1.4078 dB, and Gap_2=0.3255 dB.

A parity check matrix 11 extended by the base matrix 1 is as follows:

| | | | | | | | | | | | | | | | | | | | | | |
|---|---|---|---|---|---|---|---|---|---|---|---|---|---|---|---|---|---|---|---|---|---|
| 19 | 30 | −1 | 8 | −1 | −1 | 27 | −1 | −1 | −1 | 1 | 0 | −1 | −1 | −1 | −1 | −1 | −1 | −1 | −1 | −1 | −1 |
| 24 | −1 | −1 | 27 | 3 | 32 | −1 | 32 | 15 | −1 | −1 | 0 | 0 | −1 | −1 | −1 | −1 | −1 | −1 | −1 | −1 | −1 |
| 13 | 0 | 11 | −1 | −1 | −1 | 3 | −1 | 8 | 13 | −1 | −1 | 0 | 0 | −1 | −1 | −1 | −1 | −1 | −1 | −1 | −1 |
| −1 | 21 | 7 | 24 | 4 | 7 | 20 | −1 | −1 | 28 | 0 | −1 | −1 | 0 | 0 | −1 | −1 | −1 | −1 | −1 | −1 | −1 |
| 29 | 4 | 19 | −1 | 6 | 16 | −1 | 30 | 15 | 33 | −1 | −1 | −1 | −1 | 0 | 0 | −1 | −1 | −1 | −1 | −1 | −1 |
| 7 | −1 | −1 | 0 | −1 | −1 | −1 | 18 | −1 | −1 | 1 | −1 | −1 | −1 | −1 | 0 | −1 | −1 | −1 | −1 | −1 | −1 |
| 5 | 12 | −1 | −1 | −1 | −1 | −1 | −1 | −1 | −1 | −1 | −1 | −1 | −1 | −1 | −1 | 0 | −1 | −1 | −1 | −1 | −1 |
| −1 | 27 | −1 | 11 | −1 | −1 | −1 | −1 | −1 | 24 | −1 | 17 | 10 | −1 | −1 | −1 | −1 | 0 | −1 | −1 | −1 | −1 |
| 0 | 16 | −1 | −1 | −1 | −1 | −1 | −1 | 5 | −1 | −1 | −1 | −1 | −1 | −1 | −1 | −1 | −1 | 0 | −1 | −1 | −1 |
| 24 | −1 | −1 | −1 | 2 | −1 | −1 | −1 | 27 | −1 | −1 | −1 | −1 | −1 | 22 | −1 | −1 | −1 | −1 | 0 | −1 | −1 |
| 24 | 24 | −1 | 16 | −1 | −1 | −1 | −1 | −1 | −1 | −1 | 26 | −1 | −1 | −1 | 10 | −1 | −1 | −1 | −1 | 0 | −1 |
| −1 | 4 | −1 | 26 | 27 | 14 | −1 | −1 | −1 | −1 | −1 | −1 | −1 | −1 | −1 | −1 | −1 | −1 | −1 | −1 | −1 | 0 |

A parity check matrix 12 extended by the base matrix 1 is as follows:

| | | | | | | | | | | | | | | | | | | | | | |
|---|---|---|---|---|---|---|---|---|---|---|---|---|---|---|---|---|---|---|---|---|---|
| 22 | 25 | −1 | 5 | −1 | −1 | 17 | −1 | −1 | −1 | 1 | 0 | −1 | −1 | −1 | −1 | −1 | −1 | −1 | −1 | −1 | −1 |
| 28 | −1 | −1 | 2 | 31 | 21 | −1 | 14 | 33 | −1 | −1 | 0 | 0 | −1 | −1 | −1 | −1 | −1 | −1 | −1 | −1 | −1 |
| 6 | 0 | 8 | −1 | −1 | −1 | 27 | −1 | 6 | 18 | −1 | −1 | 0 | 0 | −1 | −1 | −1 | −1 | −1 | −1 | −1 | −1 |
| −1 | 30 | 14 | 13 | 18 | 22 | 11 | −1 | −1 | 22 | 0 | −1 | −1 | 0 | 0 | −1 | −1 | −1 | −1 | −1 | −1 | −1 |
| 0 | 7 | 3 | −1 | 11 | 30 | −1 | 32 | 26 | 9 | −1 | −1 | −1 | −1 | 0 | 0 | −1 | −1 | −1 | −1 | −1 | −1 |
| 2 | −1 | −1 | 32 | −1 | −1 | −1 | 18 | −1 | −1 | −1 | −1 | −1 | −1 | −1 | 0 | −1 | −1 | −1 | −1 | −1 | −1 |
| 12 | 20 | −1 | −1 | −1 | −1 | −1 | −1 | −1 | −1 | −1 | −1 | −1 | −1 | −1 | −1 | −1 | 0 | −1 | −1 | −1 | −1 |
| −1 | 18 | −1 | 2 | −1 | −1 | −1 | −1 | −1 | 29 | −1 | 9 | 1 | −1 | −1 | −1 | −1 | 0 | −1 | −1 | −1 | −1 |
| 6 | 7 | −1 | −1 | −1 | −1 | −1 | −1 | 2 | −1 | −1 | −1 | −1 | −1 | −1 | −1 | −1 | −1 | 0 | −1 | −1 | −1 |
| 19 | −1 | −1 | −1 | 23 | −1 | −1 | −1 | 18 | −1 | −1 | −1 | −1 | −1 | 30 | −1 | −1 | −1 | −1 | 0 | −1 | −1 |
| 21 | 9 | −1 | 25 | −1 | −1 | −1 | −1 | −1 | −1 | −1 | 29 | −1 | −1 | −1 | 31 | −1 | −1 | −1 | −1 | 0 | −1 |
| −1 | 31 | −1 | 6 | 31 | 7 | −1 | −1 | −1 | −1 | −1 | −1 | −1 | −1 | −1 | −1 | −1 | −1 | −1 | −1 | −1 | 0 |

A parity check matrix 13 extended by the base matrix 1 is as follows:

| | | | | | | | | | | | | | | | | | | | | | |
|---|---|---|---|---|---|---|---|---|---|---|---|---|---|---|---|---|---|---|---|---|---|
| 10 | 17 | −1 | 5 | −1 | −1 | 20 | −1 | −1 | −1 | 1 | 0 | −1 | −1 | −1 | −1 | −1 | −1 | −1 | −1 | −1 | −1 |
| 3 | −1 | −1 | 6 | 14 | 9 | −1 | 26 | 12 | −1 | −1 | 0 | 0 | −1 | −1 | −1 | −1 | −1 | −1 | −1 | −1 | −1 |
| 30 | 5 | 28 | −1 | −1 | −1 | 22 | −1 | 6 | 15 | −1 | −1 | 0 | 0 | −1 | −1 | −1 | −1 | −1 | −1 | −1 | −1 |
| −1 | 24 | 30 | 26 | 19 | 31 | 31 | −1 | −1 | 30 | 0 | −1 | −1 | 0 | 0 | −1 | −1 | −1 | −1 | −1 | −1 | −1 |
| 12 | 5 | 4 | −1 | 5 | 8 | −1 | 4 | 2 | 2 | −1 | −1 | −1 | −1 | 0 | 0 | −1 | −1 | −1 | −1 | −1 | −1 |
| 1 | −1 | −1 | 25 | −1 | −1 | −1 | 21 | −1 | −1 | 1 | −1 | −1 | −1 | −1 | 0 | −1 | −1 | −1 | −1 | −1 | −1 |
| 11 | 17 | −1 | −1 | −1 | −1 | −1 | −1 | −1 | −1 | −1 | −1 | −1 | −1 | −1 | −1 | 0 | −1 | −1 | −1 | −1 | −1 |
| −1 | 31 | −1 | 5 | −1 | −1 | −1 | −1 | −1 | 12 | −1 | 11 | 3 | −1 | −1 | −1 | −1 | 0 | −1 | −1 | −1 | −1 |

-continued

| | | | | | | | | | | | | | | | | | | | | | |
|---|---|---|---|---|---|---|---|---|---|---|---|---|---|---|---|---|---|---|---|---|---|
| 6 | 28 | −1 | −1 | −1 | −1 | −1 | −1 | 3 | −1 | −1 | −1 | −1 | −1 | −1 | −1 | −1 | −1 | 0 | −1 | −1 | −1 |
| 21 | −1 | −1 | −1 | 16 | −1 | −1 | −1 | 10 | −1 | −1 | −1 | −1 | −1 | 18 | −1 | −1 | −1 | −1 | 0 | −1 | −1 |
| 12 | 28 | −1 | 21 | −1 | −1 | −1 | −1 | −1 | −1 | −1 | 7 | −1 | −1 | −1 | 27 | −1 | −1 | −1 | −1 | 0 | −1 |
| −1 | 29 | −1 | 5 | 6 | 30 | −1 | −1 | −1 | −1 | −1 | −1 | −1 | −1 | −1 | −1 | −1 | −1 | −1 | −1 | −1 | 0 |

Base Matrix 2:

| | | | | | | | | | | | | | | | | | | | | | |
|---|---|---|---|---|---|---|---|---|---|---|---|---|---|---|---|---|---|---|---|---|---|
| 1 | 1 | 0 | 1 | 0 | 0 | 1 | 0 | 0 | 0 | 1 | 1 | 0 | 0 | 0 | 0 | 0 | 0 | 0 | 0 | 0 | 0 |
| 1 | 0 | 1 | 1 | 1 | 1 | 0 | 1 | 1 | 1 | 0 | 1 | 1 | 0 | 0 | 0 | 0 | 0 | 0 | 0 | 0 | 0 |
| 1 | 1 | 0 | 0 | 1 | 1 | 1 | 1 | 1 | 1 | 0 | 0 | 1 | 1 | 0 | 0 | 0 | 0 | 0 | 0 | 0 | 0 |
| 0 | 1 | 0 | 1 | 1 | 1 | 0 | 1 | 1 | 1 | 1 | 0 | 0 | 1 | 1 | 0 | 0 | 0 | 0 | 0 | 0 | 0 |
| 1 | 1 | 1 | 1 | 1 | 0 | 0 | 0 | 0 | 0 | 0 | 0 | 0 | 0 | 1 | 1 | 0 | 0 | 0 | 0 | 0 | 0 |
| 1 | 0 | 1 | 0 | 0 | 0 | 1 | 0 | 0 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 0 | 1 | 0 | 0 | 0 | 1 | 0 | 1 | 1 | 0 | 1 | 0 | 0 | 0 | 0 | 1 | 0 | 0 | 0 | 0 |
| 1 | 1 | 1 | 1 | 0 | 1 | 1 | 0 | 0 | 0 | 1 | 0 | 0 | 0 | 0 | 0 | 0 | 0 | 1 | 0 | 0 | 0 |
| 1 | 0 | 0 | 0 | 1 | 0 | 0 | 0 | 0 | 0 | 1 | 0 | 0 | 0 | 0 | 0 | 0 | 0 | 0 | 1 | 0 | 0 |
| 1 | 1 | 0 | 1 | 0 | 0 | 0 | 0 | 0 | 0 | 0 | 0 | 0 | 0 | 0 | 0 | 0 | 0 | 0 | 0 | 1 | 0 |
| 0 | 1 | 0 | 0 | 0 | 0 | 0 | 1 | 1 | 0 | 1 | 0 | 0 | 0 | 0 | 0 | 0 | 0 | 0 | 0 | 0 | 1 |

Parameter information corresponding to the base matrix 2 is as follows: Thr=0.5418 dB, Gap=0.3799 dB Thr_2=1.3982 dB, and Gap_2=0.3159 dB.

Base Matrix 3:

| | | | | | | | | | | | | | | | | | | | | | |
|---|---|---|---|---|---|---|---|---|---|---|---|---|---|---|---|---|---|---|---|---|---|
| 1 | 1 | 0 | 1 | 0 | 0 | 0 | 1 | 0 | 0 | 1 | 1 | 0 | 0 | 0 | 0 | 0 | 0 | 0 | 0 | 0 | 0 |
| 1 | 0 | 0 | 1 | 1 | 1 | 1 | 1 | 1 | 1 | 0 | 1 | 1 | 0 | 0 | 0 | 0 | 0 | 0 | 0 | 0 | 0 |
| 1 | 1 | 1 | 1 | 1 | 1 | 0 | 0 | 0 | 1 | 0 | 0 | 1 | 1 | 0 | 0 | 0 | 0 | 0 | 0 | 0 | 0 |
| 0 | 1 | 1 | 1 | 0 | 1 | 0 | 1 | 1 | 1 | 1 | 0 | 0 | 1 | 1 | 0 | 0 | 0 | 0 | 0 | 0 | 0 |
| 1 | 1 | 1 | 0 | 1 | 1 | 1 | 0 | 1 | 1 | 0 | 0 | 0 | 0 | 1 | 1 | 0 | 0 | 0 | 0 | 0 | 0 |
| 1 | 0 | 0 | 0 | 0 | 0 | 1 | 0 | 0 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 0 | 0 | 0 | 0 | 1 | 1 | 0 | 0 | 1 | 1 | 0 | 0 | 1 | 0 | 0 | 1 | 0 | 0 | 0 | 0 |
| 1 | 1 | 0 | 0 | 0 | 0 | 0 | 0 | 0 | 0 | 0 | 1 | 0 | 0 | 0 | 1 | 0 | 0 | 1 | 0 | 0 | 0 |
| 1 | 0 | 0 | 1 | 0 | 0 | 0 | 0 | 0 | 0 | 1 | 0 | 0 | 0 | 0 | 0 | 0 | 0 | 0 | 1 | 0 | 0 |
| 1 | 1 | 0 | 0 | 0 | 1 | 0 | 1 | 1 | 0 | 0 | 0 | 0 | 0 | 0 | 0 | 0 | 0 | 0 | 0 | 1 | 0 |
| 0 | 1 | 1 | 1 | 0 | 0 | 1 | 0 | 0 | 0 | 1 | 0 | 0 | 0 | 1 | 0 | 0 | 0 | 0 | 0 | 0 | 1 |

Parameter information corresponding to the base matrix 3 is as follows: Thr=0.5993 dB, Gap=0.4374 dB Thr_2=1.4771 dB, and Gap_2=0.3948 dB.

Base Matrix 4:

| | | | | | | | | | | | | | | | | | | | | | |
|---|---|---|---|---|---|---|---|---|---|---|---|---|---|---|---|---|---|---|---|---|---|
| 1 | 1 | 0 | 1 | 1 | 1 | 0 | 0 | 0 | 0 | 1 | 1 | 0 | 0 | 0 | 0 | 0 | 0 | 0 | 0 | 0 | 0 |
| 1 | 0 | 0 | 0 | 1 | 1 | 1 | 1 | 1 | 1 | 0 | 1 | 1 | 0 | 0 | 0 | 0 | 0 | 0 | 0 | 0 | 0 |

-continued

| | | | | | | | | | | | | | | | | | | | | | |
|---|---|---|---|---|---|---|---|---|---|---|---|---|---|---|---|---|---|---|---|---|---|
| 1 | 1 | 1 | 0 | 1 | 0 | 1 | 0 | 1 | 1 | 0 | 0 | 1 | 1 | 0 | 0 | 0 | 0 | 0 | 0 | 0 | 0 |
| 0 | 1 | 1 | 1 | 0 | 1 | 0 | 1 | 0 | 0 | 1 | 0 | 0 | 1 | 1 | 0 | 0 | 0 | 0 | 0 | 0 | 0 |
| 1 | 1 | 0 | 1 | 0 | 0 | 1 | 0 | 1 | 1 | 0 | 0 | 0 | 0 | 1 | 1 | 0 | 0 | 0 | 0 | 0 | 0 |
| 1 | 0 | 1 | 1 | 1 | 0 | 0 | 1 | 0 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 1 | 1 | 1 | 1 | 1 | 0 | 0 | 0 | 1 | 0 | 0 | 0 | 1 | 0 | 0 | 1 | 0 | 0 | 0 | 0 |
| 1 | 1 | 0 | 0 | 0 | 0 | 0 | 0 | 0 | 0 | 0 | 0 | 0 | 0 | 0 | 0 | 0 | 0 | 1 | 0 | 0 | 0 |
| 1 | 0 | 1 | 0 | 0 | 0 | 0 | 0 | 0 | 0 | 1 | 0 | 0 | 0 | 0 | 1 | 0 | 0 | 0 | 1 | 0 | 0 |
| 1 | 1 | 0 | 1 | 0 | 0 | 0 | 0 | 0 | 0 | 0 | 0 | 0 | 0 | 0 | 1 | 0 | 0 | 0 | 0 | 1 | 0 |
| 0 | 1 | 1 | 0 | 1 | 1 | 0 | 1 | 0 | 0 | 0 | 0 | 0 | 0 | 1 | 0 | 0 | 0 | 0 | 0 | 0 | 1 |

Parameter information corresponding to the base matrix 4 is as follows: Thr=0.6033 dB, Gap=0.4415 dB Thr_2=1.4119 dB, and Gap_2=0.3296 dB.

Base Matrix 5:

| | | | | | | | | | | | | | | | | | | | | | |
|---|---|---|---|---|---|---|---|---|---|---|---|---|---|---|---|---|---|---|---|---|---|
| 1 | 1 | 1 | 0 | 0 | 1 | 1 | 1 | 0 | 1 | 1 | 1 | 0 | 0 | 0 | 0 | 0 | 0 | 0 | 0 | 0 | 0 |
| 1 | 0 | 1 | 1 | 1 | 1 | 0 | 1 | 1 | 1 | 0 | 1 | 1 | 0 | 0 | 0 | 0 | 0 | 0 | 0 | 0 | 0 |
| 1 | 1 | 0 | 1 | 1 | 0 | 1 | 0 | 0 | 0 | 0 | 0 | 1 | 1 | 0 | 0 | 0 | 0 | 0 | 0 | 0 | 0 |
| 0 | 1 | 1 | 0 | 0 | 1 | 1 | 1 | 1 | 1 | 1 | 0 | 0 | 1 | 1 | 0 | 0 | 0 | 0 | 0 | 0 | 0 |
| 1 | 1 | 0 | 0 | 0 | 0 | 0 | 0 | 0 | 0 | 0 | 0 | 0 | 0 | 1 | 1 | 0 | 0 | 0 | 0 | 0 | 0 |
| 1 | 0 | 0 | 1 | 1 | 0 | 1 | 1 | 1 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 1 | 0 | 0 | 1 | 1 | 0 | 0 | 0 | 0 | 0 | 0 | 0 | 0 | 1 | 0 | 1 | 0 | 0 | 0 | 0 |
| 1 | 1 | 0 | 0 | 0 | 1 | 0 | 0 | 0 | 0 | 1 | 0 | 1 | 0 | 0 | 0 | 0 | 0 | 1 | 0 | 0 | 0 |
| 1 | 0 | 0 | 0 | 0 | 0 | 0 | 0 | 0 | 0 | 0 | 1 | 0 | 1 | 0 | 1 | 0 | 0 | 0 | 1 | 0 | 0 |
| 1 | 1 | 1 | 0 | 0 | 0 | 0 | 0 | 0 | 0 | 1 | 0 | 0 | 0 | 1 | 0 | 0 | 0 | 0 | 0 | 1 | 0 |
| 0 | 1 | 0 | 0 | 0 | 0 | 1 | 0 | 0 | 0 | 1 | 0 | 0 | 0 | 0 | 1 | 0 | 0 | 0 | 0 | 0 | 1 |

Parameter information corresponding to the base matrix 5 is as follows: Thr=0.6056 dB, Gap=0.4438 dB Thr_2=1.4204 dB, and Gap_2=0.3381 dB.

Base Matrix 6:

| | | | | | | | | | | | | | | | | | | | | | |
|---|---|---|---|---|---|---|---|---|---|---|---|---|---|---|---|---|---|---|---|---|---|
| 1 | 1 | 0 | 1 | 1 | 0 | 1 | 0 | 1 | 1 | 1 | 1 | 0 | 0 | 0 | 0 | 0 | 0 | 0 | 0 | 0 | 0 |
| 1 | 0 | 0 | 1 | 0 | 0 | 1 | 1 | 0 | 0 | 0 | 1 | 1 | 0 | 0 | 0 | 0 | 0 | 0 | 0 | 0 | 0 |
| 1 | 1 | 1 | 0 | 1 | 1 | 1 | 0 | 1 | 1 | 0 | 0 | 1 | 1 | 0 | 0 | 0 | 0 | 0 | 0 | 0 | 0 |
| 0 | 1 | 1 | 0 | 0 | 1 | 0 | 0 | 0 | 1 | 1 | 0 | 0 | 1 | 1 | 0 | 0 | 0 | 0 | 0 | 0 | 0 |
| 1 | 1 | 1 | 0 | 1 | 1 | 0 | 1 | 0 | 0 | 0 | 0 | 0 | 0 | 1 | 1 | 0 | 0 | 0 | 0 | 0 | 0 |

-continued

| | | | | | | | | | | | | | | | | | | | | | |
|---|---|---|---|---|---|---|---|---|---|---|---|---|---|---|---|---|---|---|---|---|---|
| 1 | 0 | 0 | 1 | 0 | 0 | 0 | 1 | 1 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 0 | 0 | 0 | 0 | 0 | 1 | 0 | 0 | 0 | 0 | 0 | 0 | 0 | 0 | 0 | 1 | 0 | 0 | 0 | 0 |
| 1 | 1 | 0 | 0 | 0 | 0 | 1 | 0 | 1 | 0 | 0 | 0 | 0 | 0 | 0 | 0 | 0 | 0 | 1 | 0 | 0 | 0 |
| 1 | 0 | 0 | 1 | 0 | 0 | 1 | 0 | 0 | 1 | 1 | 1 | 0 | 1 | 0 | 1 | 0 | 0 | 0 | 1 | 0 | 0 |
| 1 | 1 | 0 | 0 | 0 | 0 | 1 | 0 | 0 | 1 | 0 | 0 | 0 | 0 | 0 | 1 | 0 | 0 | 0 | 0 | 1 | 0 |
| 0 | 1 | 0 | 0 | 0 | 0 | 0 | 1 | 1 | 0 | 0 | 0 | 0 | 0 | 0 | 1 | 0 | 0 | 0 | 0 | 0 | 1 |

Parameter information corresponding to the base matrix 6 is as follows: Thr=0.6076 dB, Gap=0.4457 dB Thr_2=1.4406 dB, and Gap_2=0.3583 dB.

A parity check matrix 61 extended by the base matrix 6 is as follows:

| | | | | | | | | | | | | | | | | | | | | | |
|---|---|---|---|---|---|---|---|---|---|---|---|---|---|---|---|---|---|---|---|---|---|
| 23 | 15 | −1 | 1 | 20 | −1 | 10 | −1 | 16 | 27 | 1 | 0 | −1 | −1 | −1 | −1 | −1 | −1 | −1 | −1 | −1 | −1 |
| 14 | −1 | −1 | 24 | −1 | −1 | 11 | 33 | −1 | −1 | −1 | 0 | 0 | −1 | −1 | −1 | −1 | −1 | −1 | −1 | −1 | −1 |
| 13 | 21 | 6 | −1 | 7 | 5 | 20 | −1 | 28 | 0 | −1 | −1 | 0 | 0 | −1 | −1 | −1 | −1 | −1 | −1 | −1 | −1 |
| −1 | 31 | 4 | −1 | −1 | 1 | −1 | −1 | −1 | 7 | 0 | −1 | −1 | 0 | 0 | −1 | −1 | −1 | −1 | −1 | −1 | −1 |
| 30 | 25 | 17 | −1 | 22 | 13 | −1 | 27 | −1 | −1 | −1 | −1 | −1 | −1 | 0 | 0 | −1 | −1 | −1 | −1 | −1 | −1 |
| 0 | −1 | −1 | 17 | −1 | −1 | −1 | 22 | 19 | −1 | 1 | −1 | −1 | −1 | −1 | 0 | −1 | −1 | −1 | −1 | −1 | −1 |
| 0 | 3 | −1 | −1 | −1 | −1 | −1 | −1 | −1 | −1 | −1 | −1 | −1 | −1 | −1 | −1 | 0 | −1 | −1 | −1 | −1 | −1 |
| −1 | 20 | −1 | −1 | −1 | −1 | −1 | 8 | −1 | −1 | −1 | −1 | −1 | −1 | −1 | −1 | −1 | 0 | −1 | −1 | −1 | −1 |
| 25 | 11 | −1 | −1 | −1 | −1 | 18 | −1 | 17 | −1 | −1 | −1 | −1 | −1 | −1 | −1 | −1 | −1 | 0 | −1 | −1 | −1 |
| 30 | −1 | −1 | 2 | −1 | −1 | 7 | −1 | −1 | 2 | 3 | 4 | −1 | 9 | −1 | 12 | −1 | −1 | −1 | 0 | −1 | −1 |
| 26 | 23 | −1 | −1 | −1 | −1 | 31 | −1 | −1 | 27 | −1 | −1 | −1 | −1 | −1 | 22 | −1 | −1 | −1 | −1 | 0 | −1 |
| −1 | 11 | −1 | −1 | −1 | −1 | −1 | 17 | 15 | −1 | −1 | −1 | −1 | −1 | −1 | 3 | −1 | −1 | −1 | −1 | −1 | 0 |

A parity check matrix 62 extended by the base matrix 6 is as follows:

| | | | | | | | | | | | | | | | | | | | | | |
|---|---|---|---|---|---|---|---|---|---|---|---|---|---|---|---|---|---|---|---|---|---|
| 29 | −17 | −1 | 30 | 22 | −1 | 11 | −1 | 29 | 27 | 1 | 0 | −1 | −1 | −1 | −1 | −1 | −1 | −1 | −1 | −1 | −1 |
| 2 | −1 | −1 | 10 | −1 | −1 | 15 | 25 | −1 | −1 | −1 | 0 | 0 | −1 | −1 | −1 | −1 | −1 | −1 | −1 | −1 | −1 |
| 3 | 8 | 20 | −1 | 6 | 2 | 0 | −1 | 26 | 33 | −1 | −1 | 0 | 0 | −1 | −1 | −1 | −1 | −1 | −1 | −1 | −1 |
| −1 | 4 | 3 | −1 | −1 | 8 | −1 | −1 | −1 | 4 | 0 | −1 | −1 | 0 | 0 | −1 | −1 | −1 | −1 | −1 | −1 | −1 |
| 7 | 24 | 29 | −1 | 30 | 31 | −1 | 6 | −1 | −1 | −1 | −1 | −1 | −1 | 0 | 0 | −1 | −1 | −1 | −1 | −1 | −1 |
| 5 | −1 | −1 | 1 | −1 | −1 | −1 | 10 | 31 | −1 | 1 | −1 | −1 | −1 | −1 | 0 | −1 | −1 | −1 | −1 | −1 | −1 |
| 4 | 31 | −1 | −1 | −1 | −1 | −1 | −1 | −1 | −1 | −1 | −1 | −1 | −1 | −1 | −1 | 0 | −1 | −1 | −1 | −1 | −1 |
| −1 | 22 | −1 | −1 | −1 | −1 | −1 | 20 | −1 | −1 | −1 | −1 | −1 | −1 | −1 | −1 | −1 | 0 | −1 | −1 | −1 | −1 |
| 18 | 2 | −1 | −1 | −1 | −1 | 6 | −1 | 25 | −1 | −1 | −1 | −1 | −1 | −1 | −1 | −1 | −1 | 0 | −1 | −1 | −1 |
| 9 | −1 | −1 | 13 | −1 | −1 | 13 | −1 | −1 | 18 | 0 | 28 | −1 | 21 | −1 | 30 | −1 | −1 | −1 | 0 | −1 | −1 |
| 24 | 24 | −1 | −1 | −1 | −1 | 8 | −1 | −1 | 10 | −1 | −1 | −1 | −1 | −1 | 32 | −1 | −1 | −1 | −1 | 0 | −1 |
| −1 | 4 | −1 | −1 | −1 | −1 | −1 | 0 | 5 | −1 | −1 | −1 | −1 | −1 | −1 | 31 | −1 | −1 | −1 | −1 | −1 | 0 |

Base Matrix 7:

| | | | | | | | | | | | | | | | | | | | | | |
|---|---|---|---|---|---|---|---|---|---|---|---|---|---|---|---|---|---|---|---|---|---|
| 1 | 1 | 0 | 1 | 1 | 1 | 1 | 0 | 1 | 0 | 1 | 1 | 0 | 0 | 0 | 0 | 0 | 0 | 0 | 0 | 0 | 0 |
| 1 | 0 | 1 | 0 | 1 | 1 | 0 | 1 | 1 | 1 | 0 | 1 | 1 | 0 | 0 | 0 | 0 | 0 | 0 | 0 | 0 | 0 |
| 1 | 1 | 1 | 1 | 0 | 1 | 1 | 0 | 1 | 1 | 0 | 0 | 1 | 1 | 0 | 0 | 0 | 0 | 0 | 0 | 0 | 0 |
| 0 | 1 | 0 | 1 | 0 | 1 | 0 | 0 | 0 | 1 | 1 | 0 | 0 | 1 | 1 | 0 | 0 | 0 | 0 | 0 | 0 | 0 |
| 1 | 1 | 1 | 1 | 0 | 0 | 0 | 1 | 0 | 1 | 0 | 0 | 0 | 0 | 1 | 1 | 0 | 0 | 0 | 0 | 0 | 0 |
| 1 | 0 | 0 | 0 | 1 | 0 | 1 | 1 | 1 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 0 | 0 | 0 | 1 | 0 | 0 | 0 | 0 | 0 | 0 | 0 | 1 | 0 | 0 | 0 | 1 | 0 | 0 | 0 | 0 |
| 1 | 1 | 0 | 0 | 0 | 0 | 0 | 0 | 1 | 0 | 1 | 0 | 0 | 0 | 0 | 0 | 0 | 0 | 1 | 0 | 0 | 0 |
| 1 | 0 | 0 | 1 | 1 | 1 | 0 | 1 | 0 | 0 | 1 | 0 | 0 | 1 | 0 | 0 | 0 | 0 | 0 | 1 | 0 | 0 |
| 1 | 1 | 0 | 0 | 0 | 1 | 0 | 0 | 0 | 1 | 0 | 0 | 0 | 0 | 0 | 0 | 0 | 0 | 0 | 0 | 1 | 0 |
| 0 | 1 | 0 | 0 | 0 | 0 | 0 | 0 | 1 | 1 | 0 | 0 | 0 | 0 | 0 | 0 | 0 | 0 | 0 | 0 | 0 | 1 |

-continued

| | | | | | | | | | | | | | | | | | | | | | |
|---|---|---|---|---|---|---|---|---|---|---|---|---|---|---|---|---|---|---|---|---|---|
| 0 | 1 | 0 | 0 | 0 | 1 | 0 | 0 | 0 | 0 | 0 | 0 | 0 | 1 | 0 | 0 | 0 | 1 | 0 | 0 | 0 | 0 |
| 1 | 1 | 0 | 0 | 0 | 0 | 0 | 0 | 1 | 0 | 1 | 0 | 0 | 0 | 0 | 0 | 0 | 0 | 1 | 0 | 0 | 0 |
| 1 | 0 | 0 | 1 | 1 | 1 | 0 | 1 | 0 | 0 | 1 | 0 | 0 | 1 | 0 | 0 | 0 | 0 | 0 | 1 | 0 | 0 |

Parameter information corresponding to the base matrix 7 is as follows: Thr=0.6081 dB, Gap=0.4462 dB Thr_2=1.5081 dB, and Gap_2=0.4258 dB.

A parity check matrix 71 extended by the base matrix 7 is as follows:

| | | | | | | | | | | | | | | | | | | | | | |
|---|---|---|---|---|---|---|---|---|---|---|---|---|---|---|---|---|---|---|---|---|---|
| 28 | 25 | −1 | 25 | 10 | 10 | 33 | −1 | 24 | −1 | 1 | 0 | −1 | −1 | −1 | −1 | −1 | −1 | −1 | −1 | −1 | −1 |
| 22 | −1 | 7 | −1 | 0 | 28 | −1 | 17 | 2 | 33 | −1 | 0 | 0 | −1 | −1 | −1 | −1 | −1 | −1 | −1 | −1 | −1 |
| 19 | 30 | 27 | 0 | −1 | 27 | 2 | −1 | 12 | 11 | −1 | −1 | 0 | 0 | −1 | −1 | −1 | −1 | −1 | −1 | −1 | −1 |
| −1 | 0 | −1 | 6 | −1 | 29 | −1 | −1 | −1 | 9 | 0 | −1 | −1 | 0 | 0 | −1 | −1 | −1 | −1 | −1 | −1 | −1 |
| 29 | 5 | 9 | 15 | −1 | −1 | −1 | 14 | −1 | 12 | −1 | −1 | −1 | −1 | 0 | 0 | −1 | −1 | −1 | −1 | −1 | −1 |
| 11 | −1 | −1 | −1 | 19 | −1 | 10 | 27 | 5 | −1 | 1 | −1 | −1 | −1 | −1 | 0 | −1 | −1 | −1 | −1 | −1 | −1 |
| 21 | 22 | −1 | −1 | −1 | −1 | −1 | −1 | −1 | −1 | −1 | −1 | −1 | −1 | −1 | −1 | 0 | −1 | −1 | −1 | −1 | −1 |
| −1 | 17 | −1 | −1 | −1 | 29 | −1 | −1 | −1 | −1 | −1 | −1 | −1 | 26 | −1 | −1 | −1 | 0 | −1 | −1 | −1 | −1 |
| 18 | 30 | −1 | −1 | −1 | −1 | −1 | −1 | 23 | −1 | 9 | −1 | −1 | −1 | −1 | −1 | −1 | −1 | 0 | −1 | −1 | −1 |
| 19 | −1 | −1 | 29 | 17 | 12 | −1 | 13 | −1 | −1 | 4 | −1 | −1 | 12 | −1 | −1 | −1 | −1 | −1 | 0 | −1 | −1 |
| 33 | 4 | −1 | −1 | −1 | 32 | −1 | −1 | −1 | 23 | −1 | −1 | −1 | −1 | −1 | −1 | −1 | −1 | −1 | −1 | 0 | −1 |
| −1 | 3 | −1 | −1 | −1 | −1 | −1 | −1 | 28 | 23 | −1 | −1 | −1 | −1 | −1 | −1 | −1 | −1 | −1 | −1 | −1 | 0 |

A parity check matrix 72 extended by the base matrix 7 is as follows:

| | | | | | | | | | | | | | | | | | | | | | |
|---|---|---|---|---|---|---|---|---|---|---|---|---|---|---|---|---|---|---|---|---|---|
| 21 | 3 | −1 | 8 | 5 | 24 | 10 | −1 | 18 | −1 | 1 | 0 | −1 | −1 | −1 | −1 | −1 | −1 | −1 | −1 | −1 | −1 |
| 25 | −1 | 31 | −1 | 16 | 16 | −1 | 29 | 6 | 32 | −1 | 0 | 0 | −1 | −1 | −1 | −1 | −1 | −1 | −1 | −1 | −1 |
| 4 | 1 | 9 | 27 | −1 | 18 | 9 | −1 | 2 | 21 | −1 | −1 | 0 | 0 | −1 | −1 | −1 | −1 | −1 | −1 | −1 | −1 |
| −1 | 32 | −1 | 21 | −1 | 22 | −1 | −1 | −1 | 8 | 0 | −1 | −1 | 0 | 0 | −1 | −1 | −1 | −1 | −1 | −1 | −1 |
| 22 | 12 | 21 | 25 | −1 | −1 | −1 | 17 | −1 | 28 | −1 | −1 | −1 | −1 | 0 | 0 | −1 | −1 | −1 | −1 | −1 | −1 |
| 24 | −1 | −1 | −1 | 20 | −1 | 4 | 29 | 15 | −1 | 1 | −1 | −1 | −1 | −1 | 0 | −1 | −1 | −1 | −1 | −1 | −1 |
| 12 | 24 | −1 | −1 | −1 | −1 | −1 | −1 | −1 | −1 | −1 | −1 | −1 | −1 | −1 | −1 | 0 | −1 | −1 | −1 | −1 | −1 |
| −1 | 9 | −1 | −1 | −1 | 22 | −1 | −1 | −1 | −1 | −1 | −1 | −1 | 5 | −1 | −1 | −1 | 0 | −1 | −1 | −1 | −1 |
| 15 | 0 | −1 | −1 | −1 | −1 | −1 | −1 | 33 | −1 | 9 | −1 | −1 | −1 | −1 | −1 | −1 | −1 | 0 | −1 | −1 | −1 |
| 15 | −1 | −1 | 9 | 19 | 16 | −1 | 31 | −1 | −1 | 6 | −1 | −1 | 5 | −1 | −1 | −1 | −1 | −1 | 0 | −1 | −1 |
| 25 | 11 | −1 | −1 | −1 | 0 | −1 | −1 | −1 | 0 | −1 | −1 | −1 | −1 | −1 | −1 | −1 | −1 | −1 | −1 | 0 | −1 |
| −1 | 33 | −1 | −1 | −1 | −1 | −1 | −1 | 11 | 8 | −1 | −1 | −1 | −1 | −1 | −1 | −1 | −1 | −1 | −1 | −1 | 0 |

Base Matrix 8:

| | | | | | | | | | | | | | | | | | | | | | |
|---|---|---|---|---|---|---|---|---|---|---|---|---|---|---|---|---|---|---|---|---|---|
| 1 | 1 | 0 | 1 | 1 | 1 | 1 | 0 | 1 | 0 | 1 | 1 | 0 | 0 | 0 | 0 | 0 | 0 | 0 | 0 | 0 | 0 |
| 1 | 0 | 1 | 0 | 1 | 1 | 0 | 1 | 1 | 1 | 0 | 1 | 1 | 0 | 0 | 0 | 0 | 0 | 0 | 0 | 0 | 0 |
| 1 | 1 | 1 | 1 | 0 | 1 | 1 | 0 | 1 | 1 | 0 | 0 | 1 | 1 | 0 | 0 | 0 | 0 | 0 | 0 | 0 | 0 |
| 0 | 1 | 0 | 1 | 0 | 1 | 0 | 0 | 0 | 1 | 1 | 0 | 0 | 1 | 1 | 0 | 0 | 0 | 0 | 0 | 0 | 0 |
| 1 | 1 | 1 | 1 | 0 | 0 | 0 | 1 | 0 | 1 | 0 | 0 | 0 | 0 | 1 | 1 | 0 | 0 | 0 | 0 | 0 | 0 |
| 1 | 0 | 0 | 0 | 1 | 0 | 1 | 1 | 1 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |

-continued

| | | | | | | | | | | | | | | | | | | | | | |
|---|---|---|---|---|---|---|---|---|---|---|---|---|---|---|---|---|---|---|---|---|---|
| 1 | 1 | 0 | 0 | 0 | 1 | 0 | 0 | 0 | 1 | 0 | 0 | 0 | 0 | 0 | 0 | 0 | 0 | 0 | 0 | 1 | 0 |
| 0 | 1 | 0 | 0 | 0 | 0 | 0 | 0 | 1 | 1 | 0 | 0 | 0 | 0 | 0 | 0 | 0 | 0 | 0 | 0 | 0 | 1 |

Parameter information corresponding to the base matrix 8 is as follows: Thr=0.4803 dB, Gap=0.3184 dB Thr_2=1.4491 dB, and Gap_2=0.3668 dB.

Base Matrix 9:

| | | | | | | | | | | | | | | | | | | | | | |
|---|---|---|---|---|---|---|---|---|---|---|---|---|---|---|---|---|---|---|---|---|---|
| 1 | 1 | 0 | 1 | 1 | 1 | 1 | 0 | 1 | 0 | 1 | 1 | 0 | 0 | 0 | 0 | 0 | 0 | 0 | 0 | 0 | 0 |
| 1 | 0 | 1 | 0 | 1 | 1 | 0 | 1 | 1 | 1 | 0 | 1 | 1 | 0 | 0 | 0 | 0 | 0 | 0 | 0 | 0 | 0 |
| 1 | 1 | 1 | 1 | 0 | 1 | 1 | 0 | 1 | 1 | 0 | 0 | 1 | 1 | 0 | 0 | 0 | 0 | 0 | 0 | 0 | 0 |
| 0 | 1 | 0 | 1 | 0 | 1 | 0 | 0 | 0 | 1 | 1 | 0 | 0 | 1 | 1 | 0 | 0 | 0 | 0 | 0 | 0 | 0 |
| 1 | 1 | 1 | 1 | 0 | 0 | 0 | 1 | 0 | 1 | 0 | 0 | 0 | 0 | 1 | 1 | 0 | 0 | 0 | 0 | 0 | 0 |
| 1 | 0 | 0 | 0 | 1 | 0 | 1 | 1 | 1 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 0 | 0 | 0 | 1 | 0 | 0 | 0 | 0 | 0 | 0 | 0 | 1 | 0 | 0 | 0 | 1 | 0 | 0 | 0 | 0 |
| 1 | 1 | 0 | 0 | 0 | 0 | 0 | 0 | 1 | 0 | 1 | 0 | 0 | 0 | 0 | 0 | 0 | 0 | 1 | 0 | 0 | 0 |
| 1 | 0 | 0 | 1 | 1 | 1 | 0 | 1 | 0 | 0 | 1 | 0 | 0 | 1 | 0 | 0 | 0 | 0 | 0 | 1 | 0 | 0 |
| 1 | 1 | 0 | 0 | 0 | 1 | 0 | 0 | 0 | 1 | 0 | 0 | 0 | 0 | 0 | 0 | 0 | 0 | 0 | 0 | 1 | 0 |
| 0 | 1 | 0 | 0 | 0 | 0 | 0 | 0 | 1 | 1 | 0 | 0 | 0 | 0 | 0 | 0 | 0 | 0 | 0 | 0 | 0 | 1 |

Parameter information corresponding to the base matrix 9 is as follows: Thr=0.4988 dB, Gap=0.3369 dB Thr_2=1.4274 dB, and Gap_2=0.3451 dB.

The following shows an example of a base matrix that meets a row-column weight constraint condition C04_R9_C08_R08 and that is provided in this application. These base matrices may consider both implementation complexity and decoding performance of the base matrices.

Base Matrix 10:

| | | | | | | | | | | | | | | | | | | | | | |
|---|---|---|---|---|---|---|---|---|---|---|---|---|---|---|---|---|---|---|---|---|---|
| 1 | 1 | 0 | 1 | 1 | 1 | 1 | 0 | 1 | 0 | 1 | 1 | 0 | 0 | 0 | 0 | 0 | 0 | 0 | 0 | 0 | 0 |
| 1 | 0 | 1 | 0 | 1 | 1 | 0 | 1 | 1 | 1 | 0 | 1 | 1 | 0 | 0 | 0 | 0 | 0 | 0 | 0 | 0 | 0 |
| 1 | 1 | 1 | 1 | 0 | 1 | 1 | 0 | 1 | 1 | 0 | 0 | 1 | 1 | 0 | 0 | 0 | 0 | 0 | 0 | 0 | 0 |
| 0 | 1 | 0 | 1 | 0 | 1 | 0 | 0 | 0 | 1 | 1 | 0 | 0 | 1 | 1 | 0 | 0 | 0 | 0 | 0 | 0 | 0 |
| 1 | 1 | 1 | 1 | 0 | 0 | 0 | 1 | 0 | 1 | 0 | 0 | 0 | 0 | 1 | 1 | 0 | 0 | 0 | 0 | 0 | 0 |
| 1 | 0 | 0 | 0 | 1 | 0 | 1 | 1 | 1 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 0 | 0 | 0 | 1 | 0 | 0 | 0 | 0 | 0 | 0 | 0 | 1 | 0 | 0 | 0 | 1 | 0 | 0 | 0 | 0 |
| 1 | 1 | 0 | 0 | 0 | 0 | 0 | 0 | 1 | 0 | 1 | 0 | 0 | 0 | 0 | 0 | 0 | 0 | 1 | 0 | 0 | 0 |
| 1 | 0 | 0 | 1 | 1 | 1 | 0 | 1 | 0 | 0 | 1 | 0 | 0 | 1 | 0 | 0 | 0 | 0 | 0 | 1 | 0 | 0 |
| 1 | 1 | 0 | 0 | 0 | 1 | 0 | 0 | 0 | 1 | 0 | 0 | 0 | 0 | 0 | 0 | 0 | 0 | 0 | 0 | 1 | 0 |
| 0 | 1 | 0 | 0 | 0 | 0 | 0 | 0 | 1 | 1 | 0 | 0 | 0 | 0 | 0 | 0 | 0 | 0 | 0 | 0 | 0 | 1 |

Parameter information corresponding to the base matrix 10 is as follows: Thr=0.3963 dB, Gap=0.2345 dB Thr_2=1.3798 dB, and Gap_2=0.2975 dB.

A parity check matrix 101 extended by the base matrix 10 is as follows:

| | | | | | | | | | | | | | | | | | | | | | |
|---|---|---|---|---|---|---|---|---|---|---|---|---|---|---|---|---|---|---|---|---|---|
| 11 | 5 | −1 | −1 | −1 | −1 | 14 | −1 | −1 | −1 | 1 | 0 | −1 | −1 | −1 | −1 | −1 | −1 | −1 | −1 | −1 | −1 |
| 31 | −1 | 11 | 17 | 29 | −1 | −1 | 2 | −1 | 12 | −1 | 0 | 0 | −1 | −1 | −1 | −1 | −1 | −1 | −1 | −1 | −1 |
| 28 | 12 | 10 | −1 | 7 | 16 | 27 | −1 | 20 | −1 | −1 | −1 | 0 | 0 | −1 | −1 | −1 | −1 | −1 | −1 | −1 | −1 |
| −1 | 31 | −1 | 13 | −1 | 24 | 33 | 30 | −1 | −1 | 0 | −1 | −1 | 0 | 0 | −1 | −1 | −1 | −1 | −1 | −1 | −1 |
| 8 | 22 | −1 | 19 | 22 | −1 | −1 | 18 | 9 | 17 | −1 | −1 | −1 | −1 | 0 | 0 | −1 | −1 | −1 | −1 | −1 | −1 |
| 22 | −1 | 28 | −1 | −1 | 28 | 12 | −1 | 2 | 22 | 1 | −1 | −1 | −1 | −1 | 0 | −1 | −1 | −1 | −1 | −1 | −1 |
| 19 | 31 | −1 | −1 | −1 | −1 | −1 | −1 | −1 | −1 | −1 | −1 | −1 | −1 | −1 | −1 | 0 | −1 | −1 | −1 | −1 | −1 |
| −1 | 13 | 6 | −1 | −1 | 29 | 14 | −1 | 32 | −1 | −1 | −1 | −1 | −1 | −1 | −1 | −1 | 0 | −1 | −1 | −1 | −1 |
| 14 | 29 | −1 | −1 | −1 | −1 | −1 | −1 | 27 | −1 | 16 | −1 | −1 | −1 | −1 | −1 | −1 | −1 | 0 | −1 | −1 | −1 |
| 15 | −1 | 26 | −1 | −1 | 17 | −1 | −1 | −1 | −1 | −1 | −1 | −1 | −1 | −1 | −1 | −1 | −1 | −1 | 0 | −1 | −1 |
| 13 | 17 | −1 | −1 | −1 | −1 | −1 | −1 | 17 | 11 | 7 | −1 | −1 | −1 | −1 | −1 | −1 | −1 | −1 | −1 | 0 | −1 |
| −1 | 16 | −1 | −1 | −1 | −1 | 33 | 31 | 27 | 22 | −1 | −1 | −1 | −1 | −1 | −1 | −1 | −1 | −1 | −1 | −1 | 0 |

Base Matrix 11:

| | | | | | | | | | | | | | | | | | | | | | |
|---|---|---|---|---|---|---|---|---|---|---|---|---|---|---|---|---|---|---|---|---|---|
| 1 | 1 | 0 | 1 | 1 | 1 | 1 | 0 | 1 | 0 | 1 | 1 | 0 | 0 | 0 | 0 | 0 | 0 | 0 | 0 | 0 | 0 |
| 1 | 0 | 1 | 0 | 1 | 1 | 0 | 1 | 1 | 1 | 0 | 1 | 1 | 0 | 0 | 0 | 0 | 0 | 0 | 0 | 0 | 0 |
| 1 | 1 | 1 | 1 | 0 | 1 | 1 | 0 | 1 | 1 | 0 | 0 | 1 | 1 | 0 | 0 | 0 | 0 | 0 | 0 | 0 | 0 |
| 0 | 1 | 0 | 1 | 0 | 1 | 0 | 0 | 0 | 1 | 1 | 0 | 0 | 1 | 1 | 0 | 0 | 0 | 0 | 0 | 0 | 0 |
| 1 | 1 | 1 | 1 | 0 | 0 | 0 | 1 | 0 | 1 | 0 | 0 | 0 | 0 | 1 | 1 | 0 | 0 | 0 | 0 | 0 | 0 |
| 1 | 0 | 0 | 0 | 1 | 0 | 1 | 1 | 1 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 0 | 0 | 0 | 1 | 0 | 0 | 0 | 0 | 0 | 0 | 0 | 1 | 0 | 0 | 0 | 1 | 0 | 0 | 0 | 0 |
| 1 | 1 | 0 | 0 | 0 | 0 | 0 | 0 | 1 | 0 | 1 | 0 | 0 | 0 | 0 | 0 | 0 | 0 | 1 | 0 | 0 | 0 |
| 1 | 0 | 0 | 1 | 1 | 1 | 0 | 1 | 0 | 0 | 1 | 0 | 0 | 1 | 0 | 0 | 0 | 0 | 0 | 1 | 0 | 0 |
| 1 | 1 | 0 | 0 | 0 | 1 | 0 | 0 | 0 | 1 | 0 | 0 | 0 | 0 | 0 | 0 | 0 | 0 | 0 | 0 | 1 | 0 |
| 0 | 1 | 0 | 0 | 0 | 0 | 0 | 0 | 1 | 1 | 0 | 0 | 0 | 0 | 0 | 0 | 0 | 0 | 0 | 0 | 0 | 1 |

Parameter information corresponding to the base matrix 11 is as follows: Thr=0.3888 dB, Gap=0.2270 dB Thr_2=1.3749 dB, and Gap_2=0.2926 dB.

The following shows an example of a base matrix that meets a row-column weight constraint condition C04_R8_C07_R08 and that is provided in this application.

These base matrices may consider both implementation complexity and decoding performance of the base matrices.

Base Matrix 12:

| | | | | | | | | | | | | | | | | | | | | | |
|---|---|---|---|---|---|---|---|---|---|---|---|---|---|---|---|---|---|---|---|---|---|
| 1 | 1 | 0 | 1 | 1 | 1 | 1 | 0 | 1 | 0 | 1 | 1 | 0 | 0 | 0 | 0 | 0 | 0 | 0 | 0 | 0 | 0 |
| 1 | 0 | 1 | 0 | 1 | 1 | 0 | 1 | 1 | 1 | 0 | 1 | 1 | 0 | 0 | 0 | 0 | 0 | 0 | 0 | 0 | 0 |
| 1 | 1 | 1 | 1 | 0 | 1 | 1 | 0 | 1 | 1 | 0 | 0 | 1 | 1 | 0 | 0 | 0 | 0 | 0 | 0 | 0 | 0 |
| 0 | 1 | 0 | 1 | 0 | 1 | 0 | 0 | 0 | 1 | 1 | 0 | 0 | 1 | 1 | 0 | 0 | 0 | 0 | 0 | 0 | 0 |
| 1 | 1 | 1 | 1 | 0 | 0 | 0 | 1 | 0 | 1 | 0 | 0 | 0 | 0 | 1 | 1 | 0 | 0 | 0 | 0 | 0 | 0 |
| 1 | 0 | 0 | 0 | 1 | 0 | 1 | 1 | 1 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 0 | 0 | 0 | 1 | 0 | 0 | 0 | 0 | 0 | 0 | 0 | 1 | 0 | 0 | 0 | 1 | 0 | 0 | 0 | 0 |
| 1 | 1 | 0 | 0 | 0 | 0 | 0 | 0 | 1 | 0 | 1 | 0 | 0 | 0 | 0 | 0 | 0 | 0 | 1 | 0 | 0 | 0 |
| 1 | 0 | 0 | 1 | 1 | 1 | 0 | 1 | 0 | 0 | 1 | 0 | 0 | 1 | 0 | 0 | 0 | 0 | 0 | 1 | 0 | 0 |
| 1 | 1 | 0 | 0 | 0 | 1 | 0 | 0 | 0 | 1 | 0 | 0 | 0 | 0 | 0 | 0 | 0 | 0 | 0 | 0 | 1 | 0 |
| 0 | 1 | 0 | 0 | 0 | 0 | 0 | 0 | 1 | 1 | 0 | 0 | 0 | 0 | 0 | 0 | 0 | 0 | 0 | 0 | 0 | 1 |

Parameter information corresponding to the base matrix 12 is as follows: Thr=0.3397 dB, Gap=0.1778 db Thr_2=1.3738 dB, and Gap_2=0.2915 dB.

A parity check matrix 1201 extended by the base matrix 12 is as follows:

| | | | | | | | | | | | | | | | | | | | | | |
|---|---|---|---|---|---|---|---|---|---|---|---|---|---|---|---|---|---|---|---|---|---|
| 26 | 6 | −1 | −1 | 10 | 25 | −1 | −1 | −1 | −1 | 1 | 0 | −1 | −1 | −1 | −1 | −1 | −1 | −1 | −1 | −1 | −1 |
| 11 | −1 | 18 | 6 | 26 | −1 | 20 | −1 | −1 | 15 | −1 | 0 | 0 | −1 | −1 | −1 | −1 | −1 | −1 | −1 | −1 | −1 |
| 3 | 1 | 22 | −1 | −1 | −1 | 18 | 8 | 15 | −1 | −1 | −1 | 0 | 0 | −1 | −1 | −1 | −1 | −1 | −1 | −1 | −1 |
| −1 | 33 | −1 | 27 | −1 | −1 | −1 | 5 | 1 | 28 | 0 | −1 | −1 | 0 | 0 | −1 | −1 | −1 | −1 | −1 | −1 | −1 |
| 20 | 3 | −1 | 11 | 11 | 9 | −1 | −1 | 25 | −1 | −1 | −1 | −1 | −1 | 0 | 0 | −1 | −1 | −1 | −1 | −1 | −1 |
| 16 | −1 | 12 | −1 | −1 | 7 | 9 | 11 | −1 | 23 | 1 | −1 | −1 | −1 | −1 | 0 | −1 | −1 | −1 | −1 | −1 | −1 |
| 16 | 18 | −1 | −1 | −1 | −1 | −1 | −1 | −1 | −1 | −1 | −1 | −1 | −1 | −1 | −1 | 0 | −1 | −1 | −1 | −1 | −1 |
| −1 | 4 | −1 | 29 | 0 | 16 | −1 | −1 | −1 | 28 | 12 | 14 | −1 | −1 | −1 | −1 | −1 | 0 | −1 | −1 | −1 | −1 |
| 11 | 3 | −1 | −1 | −1 | −1 | −1 | −1 | −1 | −1 | 31 | −1 | −1 | −1 | −1 | −1 | −1 | −1 | 0 | −1 | −1 | −1 |
| 28 | −1 | −1 | −1 | 17 | 8 | −1 | −1 | 17 | −1 | 20 | −1 | −1 | −1 | −1 | −1 | −1 | −1 | −1 | 0 | −1 | −1 |
| 22 | 3 | −1 | −1 | 19 | 28 | −1 | −1 | 18 | −1 | −1 | −1 | −1 | −1 | −1 | −1 | −1 | −1 | −1 | −1 | 0 | −1 |
| −1 | 1 | −1 | 0 | −1 | 22 | −1 | −1 | −1 | −1 | 10 | −1 | −1 | −1 | −1 | −1 | −1 | −1 | −1 | −1 | −1 | 0 |

The following shows an example of a base matrix that meets the row-column weight constraint condition C04_R8_C07_R07 and that is provided in this application. These base matrices may consider both implementation complexity and decoding performance of the base matrices.

Base Matrix 13:

| | | | | | | | | | | | | | | | | | | | | | |
|---|---|---|---|---|---|---|---|---|---|---|---|---|---|---|---|---|---|---|---|---|---|
| 1 | 1 | 0 | 1 | 1 | 1 | 1 | 0 | 1 | 0 | 1 | 1 | 0 | 0 | 0 | 0 | 0 | 0 | 0 | 0 | 0 | 0 |
| 1 | 0 | 1 | 0 | 1 | 1 | 0 | 1 | 1 | 1 | 0 | 1 | 1 | 0 | 0 | 0 | 0 | 0 | 0 | 0 | 0 | 0 |
| 1 | 1 | 1 | 1 | 0 | 1 | 1 | 0 | 1 | 1 | 0 | 0 | 1 | 1 | 0 | 0 | 0 | 0 | 0 | 0 | 0 | 0 |
| 0 | 1 | 0 | 1 | 0 | 1 | 0 | 0 | 0 | 1 | 1 | 0 | 0 | 1 | 1 | 0 | 0 | 0 | 0 | 0 | 0 | 0 |
| 1 | 1 | 1 | 1 | 0 | 0 | 0 | 1 | 0 | 1 | 0 | 0 | 0 | 0 | 1 | 1 | 0 | 0 | 0 | 0 | 0 | 0 |
| 1 | 0 | 0 | 0 | 1 | 0 | 1 | 1 | 1 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 0 | 0 | 0 | 1 | 0 | 0 | 0 | 0 | 0 | 0 | 0 | 1 | 0 | 0 | 0 | 1 | 0 | 0 | 0 | 0 |
| 1 | 1 | 0 | 0 | 0 | 0 | 0 | 0 | 1 | 0 | 1 | 0 | 0 | 0 | 0 | 0 | 0 | 0 | 1 | 0 | 0 | 0 |
| 1 | 0 | 0 | 1 | 1 | 1 | 0 | 1 | 0 | 0 | 1 | 0 | 0 | 1 | 0 | 0 | 0 | 0 | 0 | 1 | 0 | 0 |
| 1 | 1 | 0 | 0 | 0 | 1 | 0 | 0 | 0 | 1 | 0 | 0 | 0 | 0 | 0 | 0 | 0 | 0 | 0 | 0 | 1 | 0 |
| 0 | 1 | 0 | 0 | 0 | 0 | 0 | 0 | 1 | 1 | 0 | 0 | 0 | 0 | 0 | 0 | 0 | 0 | 0 | 0 | 0 | 1 |

Parameter information corresponding to the base matrix 13 is as follows: Thr=0.3435 dB, Gap=0.1817 dB Thr_2=1.4154 dB, and Gap_2=0.3331 dB.

A parity check matrix 1301 extended by the base matrix 13 is as follows:

| | | | | | | | | | | | | | | | | | | | | | |
|---|---|---|---|---|---|---|---|---|---|---|---|---|---|---|---|---|---|---|---|---|---|
| 24 | 14 | 23 | 12 | 10 | 7 | −1 | −1 | −1 | −1 | 1 | 0 | −1 | −1 | −1 | −1 | −1 | −1 | −1 | −1 | −1 | −1 |
| 23 | −1 | 10 | −1 | 1 | −1 | −1 | 29 | 19 | 20 | −1 | 0 | 0 | −1 | −1 | −1 | −1 | −1 | −1 | −1 | −1 | −1 |
| 22 | 23 | 11 | 5 | −1 | −1 | −1 | 11 | 9 | −1 | −1 | −1 | 0 | 0 | −1 | −1 | −1 | −1 | −1 | −1 | −1 | −1 |
| −1 | 9 | −1 | −1 | 4 | 24 | 3 | −1 | −1 | 9 | 0 | −1 | −1 | 0 | 0 | −1 | −1 | −1 | −1 | −1 | −1 | −1 |
| 30 | 22 | −1 | −1 | −1 | 26 | 24 | 7 | 3 | −1 | −1 | −1 | −1 | −1 | 0 | 0 | −1 | −1 | −1 | −1 | −1 | −1 |
| 12 | −1 | −1 | 10 | −1 | −1 | 15 | −1 | −1 | 6 | 1 | −1 | −1 | −1 | −1 | 0 | −1 | −1 | −1 | −1 | −1 | −1 |
| 2 | 31 | −1 | −1 | −1 | −1 | 7 | −1 | −1 | −1 | −1 | −1 | −1 | −1 | −1 | −1 | 0 | −1 | −1 | −1 | −1 | −1 |
| −1 | 10 | −1 | −1 | −1 | −1 | 2 | −1 | 5 | −1 | 27 | −1 | −1 | −1 | −1 | −1 | −1 | 0 | −1 | −1 | −1 | −1 |
| 33 | 6 | −1 | −1 | −1 | −1 | −1 | −1 | −1 | −1 | 30 | −1 | −1 | −1 | −1 | 4 | −1 | −1 | 0 | −1 | −1 | −1 |
| 24 | −1 | −1 | 18 | −1 | −1 | −1 | −1 | 9 | −1 | 15 | −1 | −1 | −1 | −1 | 2 | −1 | −1 | −1 | 0 | −1 | −1 |
| 29 | 26 | −1 | −1 | −1 | −1 | −1 | −1 | −1 | −1 | −1 | −1 | −1 | −1 | −1 | 12 | −1 | −1 | −1 | −1 | 0 | −1 |
| −1 | 6 | −1 | −1 | −1 | 0 | 12 | −1 | 8 | −1 | 16 | −1 | −1 | −1 | −1 | 33 | −1 | −1 | −1 | −1 | −1 | 0 |

The following shows an example of a base matrix that meets the row-column weight constraint condition C04_R8_C06_R07 and that is provided in this application. These base matrices may consider both implementation complexity and decoding performance of the base matrices.

Base Matrix 14:

| | | | | | | | | | | | | | | | | | | | | | |
|---|---|---|---|---|---|---|---|---|---|---|---|---|---|---|---|---|---|---|---|---|---|
| 1 | 1 | 0 | 1 | 1 | 1 | 1 | 0 | 1 | 0 | 1 | 1 | 0 | 0 | 0 | 0 | 0 | 0 | 0 | 0 | 0 | 0 |
| 1 | 0 | 1 | 0 | 1 | 1 | 0 | 1 | 1 | 1 | 0 | 1 | 1 | 0 | 0 | 0 | 0 | 0 | 0 | 0 | 0 | 0 |
| 1 | 1 | 1 | 1 | 0 | 1 | 1 | 0 | 1 | 1 | 0 | 0 | 1 | 1 | 0 | 0 | 0 | 0 | 0 | 0 | 0 | 0 |
| 0 | 1 | 0 | 1 | 0 | 1 | 0 | 0 | 0 | 1 | 1 | 0 | 0 | 1 | 1 | 0 | 0 | 0 | 0 | 0 | 0 | 0 |
| 1 | 1 | 1 | 1 | 0 | 0 | 0 | 1 | 0 | 1 | 0 | 0 | 0 | 0 | 1 | 1 | 0 | 0 | 0 | 0 | 0 | 0 |
| 1 | 0 | 0 | 0 | 1 | 0 | 1 | 1 | 1 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 0 | 0 | 0 | 1 | 0 | 0 | 0 | 0 | 0 | 0 | 0 | 1 | 0 | 0 | 0 | 1 | 0 | 0 | 0 | 0 |
| 1 | 1 | 0 | 0 | 0 | 0 | 0 | 0 | 1 | 0 | 1 | 0 | 0 | 0 | 0 | 0 | 0 | 0 | 1 | 0 | 0 | 0 |
| 1 | 0 | 0 | 1 | 1 | 1 | 0 | 1 | 0 | 0 | 1 | 0 | 0 | 1 | 0 | 0 | 0 | 0 | 0 | 1 | 0 | 0 |
| 1 | 1 | 0 | 0 | 0 | 1 | 0 | 0 | 0 | 1 | 0 | 0 | 0 | 0 | 0 | 0 | 0 | 0 | 0 | 0 | 1 | 0 |
| 0 | 1 | 0 | 0 | 0 | 0 | 0 | 0 | 1 | 1 | 0 | 0 | 0 | 0 | 0 | 0 | 0 | 0 | 0 | 0 | 0 | 1 |

Parameter information corresponding to the base matrix 14 is as follows: Thr=0.3322 dB, Gap=0.1703 dB Thr_2=1.3743 dB, and Gap_2=0.2920 dB.

Base Matrix 15:

| | | | | | | | | | | | | | | | | | | | | | |
|---|---|---|---|---|---|---|---|---|---|---|---|---|---|---|---|---|---|---|---|---|---|
| 1 | 1 | 0 | 1 | 1 | 1 | 1 | 0 | 1 | 0 | 1 | 1 | 0 | 0 | 0 | 0 | 0 | 0 | 0 | 0 | 0 | 0 |
| 1 | 0 | 1 | 0 | 1 | 1 | 0 | 1 | 1 | 1 | 0 | 1 | 1 | 0 | 0 | 0 | 0 | 0 | 0 | 0 | 0 | 0 |
| 1 | 1 | 1 | 1 | 0 | 1 | 1 | 0 | 1 | 1 | 0 | 0 | 1 | 1 | 0 | 0 | 0 | 0 | 0 | 0 | 0 | 0 |
| 0 | 1 | 0 | 1 | 0 | 1 | 0 | 0 | 0 | 1 | 1 | 0 | 0 | 1 | 1 | 0 | 0 | 0 | 0 | 0 | 0 | 0 |
| 1 | 1 | 1 | 1 | 0 | 0 | 0 | 1 | 0 | 1 | 0 | 0 | 0 | 0 | 1 | 1 | 0 | 0 | 0 | 0 | 0 | 0 |
| 1 | 0 | 0 | 0 | 1 | 0 | 1 | 1 | 1 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 0 | 0 | 0 | 1 | 0 | 0 | 0 | 0 | 0 | 0 | 0 | 1 | 0 | 0 | 0 | 1 | 0 | 0 | 0 | 0 |
| 1 | 1 | 0 | 0 | 0 | 0 | 0 | 0 | 1 | 0 | 1 | 0 | 0 | 0 | 0 | 0 | 0 | 0 | 1 | 0 | 0 | 0 |
| 1 | 0 | 0 | 1 | 1 | 1 | 0 | 1 | 0 | 0 | 1 | 0 | 0 | 1 | 0 | 0 | 0 | 0 | 0 | 1 | 0 | 0 |
| 1 | 1 | 0 | 0 | 0 | 1 | 0 | 0 | 0 | 1 | 0 | 0 | 0 | 0 | 0 | 0 | 0 | 0 | 0 | 0 | 1 | 0 |
| 0 | 1 | 0 | 0 | 0 | 0 | 0 | 0 | 1 | 1 | 0 | 0 | 0 | 0 | 0 | 0 | 0 | 0 | 0 | 0 | 0 | 1 |

Parameter information corresponding to the base matrix 15 is as follows: Thr=0.3255 dB, Gap=0.1637 dB Thr_2=1.3946 dB, and Gap_2=0.3123 dB.

For a long code, a smaller decoding threshold (namely, Thr and Thr_2) corresponding to a base matrix indicates better decoding performance of a parity check matrix that complies with the base matrix. Similarly, for the long code, a smaller distance (namely, Gap and Gap_2) between a decoding threshold corresponding to the base matrix and Eb/NO corresponding to a channel capacity at a corresponding code rate indicates better decoding performance of the parity check matrix that complies with the base matrix. It can be learned from the parameter information corresponding to the base matrix 1 to the base matrix 15 that both a decoding threshold corresponding to each base matrix and the distance between the decoding threshold and Eb/NO corresponding to the channel capacity at the corresponding code rate are small. Therefore, the parity check matrix that complies with the base matrix has good decoding performance. It can be learned from the base matrix 1 to the base matrix 15 that weights of the first two columns of each base matrix are high. For a short code, if the column weight is too heavy, a subgraph structure with lossy decoding performance, such as a short loop or a trap set, appears in a corresponding factor graph. In this application, the first two columns with a heavy weight in the base matrix are directly punctured and do not participate in transmission, so that decoding performance of the short code can be prevented from being affected by an excessively heavy column weight. Therefore, the base matrix in this application can ensure both the decoding performance of the long code and the decoding performance of the short code, that is, a good tradeoff is achieved between the performance of the short code and the performance of the long code.

Any element other than "−1" in the parity check matrix illustrated above represents a CPM of (34×34), and "−1" in the parity check matrix represents an all-0 square matrix with a size of (34×34). It should be understood that the base matrix is extended by using different extension factors, to obtain parity check matrices of different sizes. For example, a CPM of (68×68) is used to extend the base matrix. In actual application, the base matrix may be extended by using a CPM of any size based on a requirement, to obtain a required parity check matrix.

The base matrix 1 to the base matrix 15 are merely some examples rather than all examples of base matrices provided in this application. It should be understood that a base matrix obtained by performing row-column permutation on the base matrix provided in this application also belongs to the base matrix protected in this application. Similarly, the parity check matrix obtained by extending the base matrix shown above is merely some examples rather than all examples.

The foregoing shows examples of the base matrix and the parity check matrix provided in this application. With reference to the accompanying drawings, the following describes beneficial effects of the encoding method provided in this application by using the parity check matrix 11 that complies with the base matrix 1 as an example.

Figure 14:
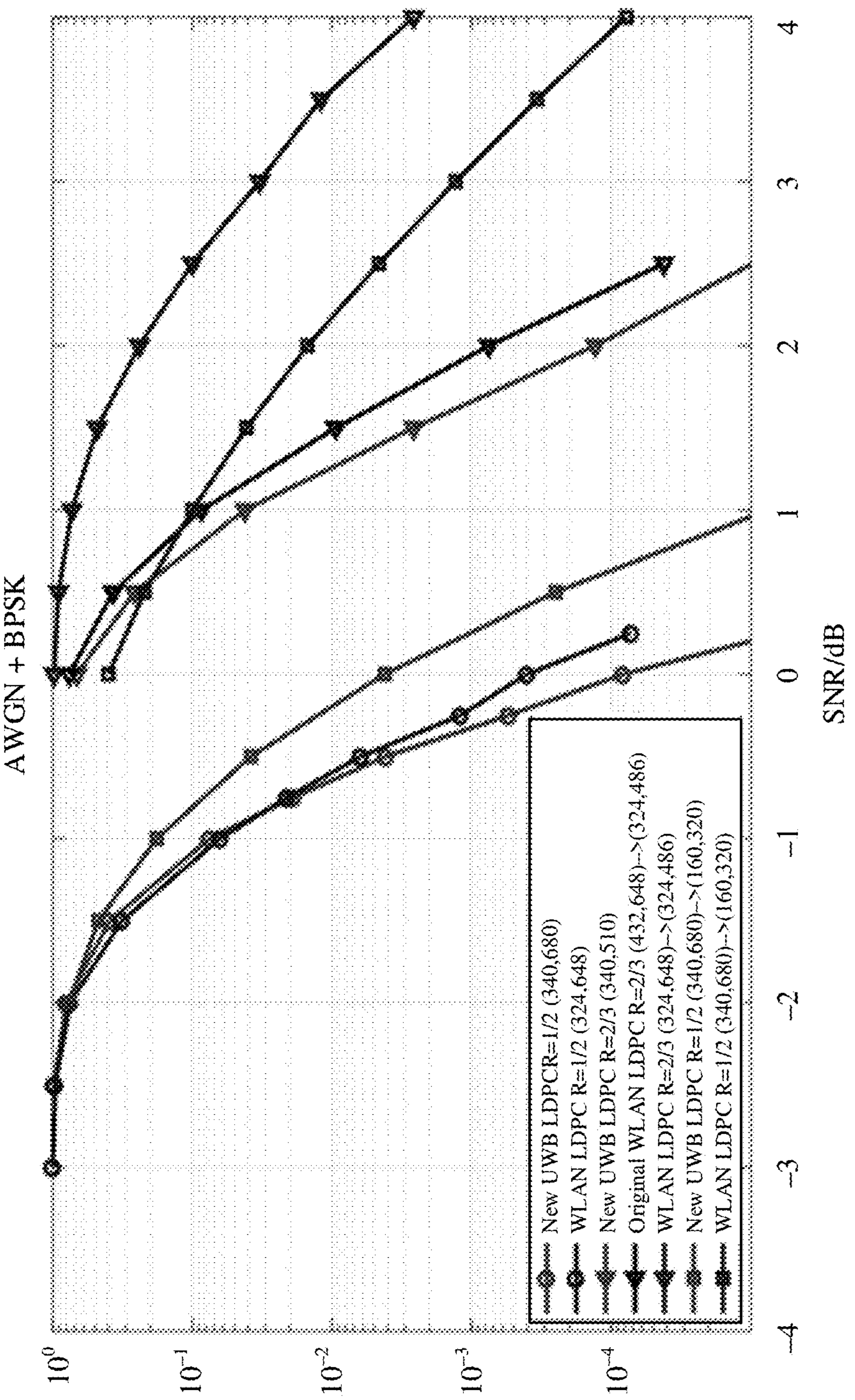
FIG. 14 is a diagram of performance comparison between LDPC codes according to an embodiment of this application.

FIG. 14 is an example diagram of performance comparison between LDPC codes according to an embodiment of this application. In FIG. 14, a horizontal coordinate represents a signal noise ratio (signal noise ratio, SNR), and a vertical coordinate represents a block error rate (block error rate, BLER), namely, a block error rate. In FIG. 14, New UWB LDPC represents an LDPC code in this application.

Refer to FIG. 14. New UWB LDPC (340, 680) vs. WLAN LDPC (324, 648): performance comparison between the LDPC code (340, 680) and the WLAN LDPC (324, 648) at a code rate of 1/2 in this application, where k in (k, n) refers to a quantity of information bits before encoding, and n refers to a quantity of bits of a code word sequence after encoding.

When BLER=$10^{-4}$, the LDPC code in this application can obtain a performance gain of about 0.25 dB.

In terms of complexity, a base matrix (a base matrix 1) of the LDPC code in this application includes 76 CPMs, and a base matrix corresponding to the WLAN LDPC code includes 88 CPMs. Therefore, the complexity of the LDPC code in this application is low.

Refer to FIG. 14. New UWB LDPC (340, 510) vs. Two WLAN LDPC (324, 486): performance comparison at a code rate R=2/3. In this application, performance when the LDPC code is punctured to (340, 510) is compared with performance when the WLAN LDPC (324, 486) at a code rate of 2/3. The two WLAN LDPC (324, 486) include Original WLAN LDPC R=2/3 (432, 648)→(324, 486) and WLAN LDPC R=2/3 (324, 648)→(324, 486) in FIG. 14.

Figure 15A:
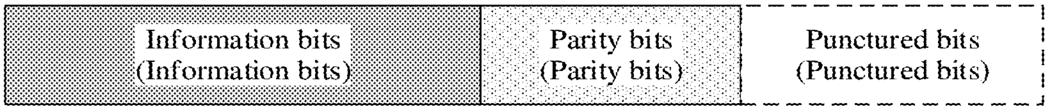
FIG. 15A is a diagram of puncturing an LDPC code according to an embodiment of this application.

WLAN LDPC R=2/3 (324, 648)→(324, 486) means that a WLAN LDPC code whose code rate is R=1/2 is punctured according to FIG. 15A until the code rate is R=2/3. FIG. 15A is an example diagram of puncturing an LDPC code according to an embodiment of this application.

Figure 15B:
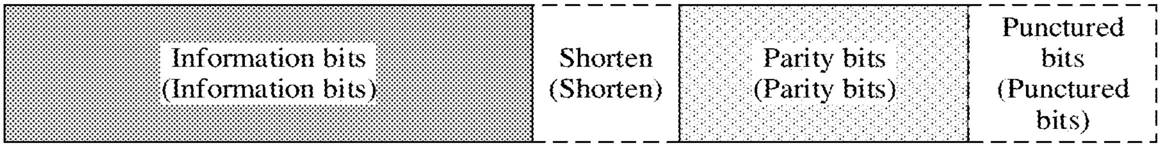
FIG. 15B is a diagram of shortening and puncturing an LDPC code according to an embodiment of this application.

Original WLAN LDPC R=2/3 (432, 648)→(324, 486) means that a WLAN LDPC code whose code rate is R=1/2 is simultaneously shortened and punctured according to FIG. 15B until the code rate is R=2/3. FIG. 15B is an example diagram of shortening and puncturing an LDPC code according to an embodiment of this application.

It can be learned from FIG. 14 that, in a similar code length, compared with an LDPC code whose WLAN code rate is 2/3, the LDPC code in this application can obtain a performance gain of about 0.35 dB, and compared with an LDPC code whose WLAN code rate is ½ being punctured to R=2/3, a performance gain greater than 2.5 dB can be obtained.

Complexity compared with R=2/3 WLAN LDPC: 50 CPMs (New UWB LDPC) vs. 88 CPMs (WLAN LDPC). Therefore, the complexity of the LDPC code in this application is low.

Figure 15C:
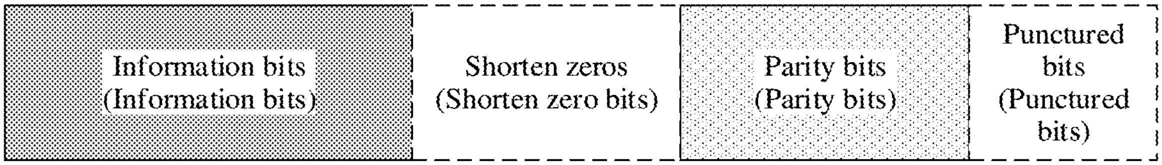
FIG. 15C is another diagram of shortening and puncturing an LDPC code according to an embodiment of this application.

Refer to FIG. 14. New UWB LDPC (160, 320) vs. WLAN LDPC (160, 320) at a code rate R=1/2: performance comparison when the LDPC code in this application and the WLAN LDPC code with the code rate 1/2 is simultaneously shortened and punctured to (160, 320). Simultaneous shortening and puncturing of the WLAN LDPC code are shown in FIG. 15C. FIG. 15C is another example diagram of shortening and puncturing an LDPC code according to an embodiment of this application.

It can be learned that an LDPC code designed in this application has excellent performance in a short packet (for example, k=160 bits=20 bytes), and can achieve a performance gain greater than 3 dB compared with WLAN LDPC.

With reference to the accompanying drawings, the following describes a structure of a communication apparatus that can implement an LDPC code encoding method or an LDPC code decoding method provided in embodiments of this application.

Figure 16:
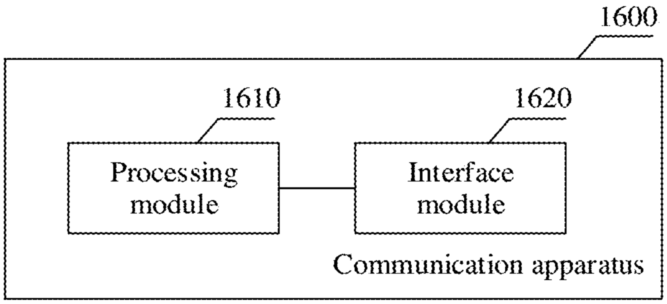
FIG. 16 is a diagram of a structure of a communication apparatus 1600 according to an embodiment of this application.

FIG. 16 is a diagram of a structure of an example communication apparatus 1600 according to an embodiment of this application. The communication apparatus 1600 may correspondingly implement functions or steps implemented by a transmit end in the foregoing method embodiments, or may correspondingly implement functions or steps implemented by a receive end in the foregoing method embodiments. The communication apparatus may include a processing module 1610 and an interface module 1620. Optionally, the communication apparatus may further include a storage unit. The storage unit may be configured to store instructions (code or a program) and/or data. The processing module 1610 and the interface module 1620 may be coupled to the storage unit. For example, the processing module 1610 may read the instructions (the code or the program) and/or the data in the storage unit, to implement a corresponding method. The foregoing units may be disposed independently, or may be partially or completely integrated. For example, the interface module 1620 may include a sending module and a receiving module. The sending module may be a transmitter, and the receiving module may be a receiver. An entity corresponding to the interface module 1620 may be a transceiver, or may be a communication interface.

In some possible implementations, the communication apparatus 1600 can correspondingly implement behavior and functions of the transmit end in the foregoing method embodiments. For example, the communication apparatus 1600 may be the transmit end, or may be a component (for example, a chip or a circuit) applied to the transmit end. For example, the interface module 1620 may be configured to perform all receiving or sending operations performed by the transmit end in the embodiments in FIG. 8, FIG. 9, and FIG. 10, for example, step 802 in the embodiment shown in FIG. 8 and step 902 in the embodiment shown in FIG. 9. Step 1002, step 1004, and step 1006 in the embodiment shown in FIG. 10, and/or another process used to support the technology described in this specification. The processing module 1610 is configured to perform all operations other than sending and receiving operations performed by the transmit end in the embodiments in FIG. 8, FIG. 9, and FIG. 10, for example, step 801 in the embodiment shown in FIG. 8, step 901 in the embodiment shown in FIG. 9, and step 1001 and step 1005 in the embodiment shown in FIG. 10.

In some possible implementations, the communication apparatus 1600 can correspondingly implement behavior and functions of the receive end in the foregoing method embodiments. For example, the communication apparatus 1600 may be the receive end, or may be a component (for example, a chip or a circuit) applied to the receive end. For example, the interface module 1620 may be configured to perform all receiving or sending operations performed by the receive end in the embodiments in FIG. 8, FIG. 9, and FIG. 10, for example, step 802 in the embodiment shown in FIG. 8 and step 902 in the embodiment shown in FIG. 9. Step 1002, step 1004, and step 1006 in the embodiment shown in FIG. 10, and/or another process used to support the technology described in this specification. The processing module 1610 is configured to perform all operations other than sending and receiving operations performed by the receive end in the embodiments in FIG. 8, FIG. 9, and FIG. 10, for example, step 803 and step 804 in the embodiment shown in FIG. 8, step 903 and step 904 in the embodiment shown in FIG. 9, and step 1003, step 1004 and step 1007 in the embodiment shown in FIG. 10.

Figure 17:
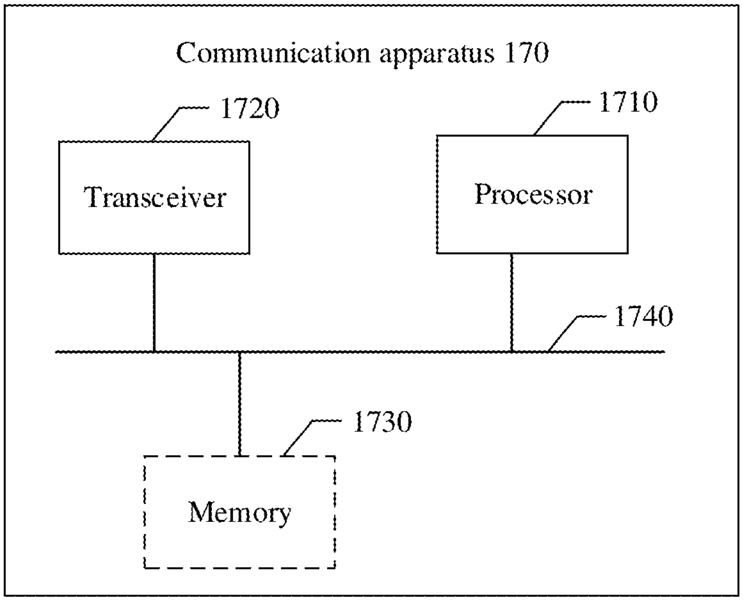
FIG. 17 is a diagram of a structure of another communication apparatus 170 according to an embodiment of this application.

FIG. 17 is a diagram of a structure of another communication apparatus 170 according to an embodiment of this application. The communication apparatus in FIG. 17 may be the foregoing transmit end, or may be the foregoing receive end.

As shown in FIG. 17, the communication apparatus 170 includes at least one processor 1710 and a transceiver 1720.

In some embodiments of this application, the processor 1710 and the transceiver 1720 may be configured to perform a function, an operation, or the like performed by an initiator. For example, the transceiver 1720 performs all receiving or sending operations performed by the transmit end in the embodiments in FIG. 8, FIG. 9, and FIG. 10. For example, the processor 1710 is configured to perform all operations performed by the transmit end other than sending and receiving operations in the embodiments in FIG. 8, FIG. 9, and FIG. 10.

In some embodiments of this application, the processor 1710 and the transceiver 1720 may be configured to perform a function, an operation, or the like performed by the receive end. For example, the transceiver 1720 performs all receiving or sending operations performed by the receive end in the embodiments in FIG. 8, FIG. 9, and FIG. 10. For example, the processor 1710 is configured to perform all operations performed by the receive end other than sending and receiving operations in the embodiments in FIG. 8, FIG. 9, and FIG. 10.

The transceiver 1720 is configured to communicate with another device/apparatus through a transmission medium. The processor 1710 receives and sends data and/or signaling by using the transceiver 1720, and is configured to implement the methods in the foregoing method embodiments. The processor 1710 may implement a function of a processing module 1610, and the transceiver 1720 may implement a function of an interface module 1620.

Optionally, the communication apparatus 170 may further include at least one memory 1730, configured to store program instructions and/or data. The memory 1730 is coupled to the processor 1710. The coupling in this embodiment may be an indirect coupling or a communication connection between apparatuses, units, or modules in an electrical form, a mechanical form, or another form, and is used for information exchange between the apparatuses, the units, or the modules. The processor 1710 may operate cooperatively with the memory 1730. The processor 1710 may execute the program instruction stored in the memory 1730. At least one of the at least one memory may be included in the processor.

A specific connection medium between the transceiver 1720, the processor 1710, and the memory 1730 is not limited in this embodiment. In this embodiment, the memory 1730, the processor 1710, and the transceiver 1720 are connected through a bus 1740 in FIG. 17. The bus is represented by using a bold line in FIG. 17. A manner of connection between other components is merely an example for description, and is not limited thereto. The bus may be classified into an address bus, a data bus, a control bus, and the like. For ease of representation, only one bold line is used to represent the bus in FIG. 17, but this does not mean that there is only one bus or only one type of bus.

In this embodiment, the processor may be a general-purpose processor, a digital signal processor, an application-specific integrated circuit, a field programmable gate array or another programmable logic device, a discrete gate or transistor logic device, or a discrete hardware component, the processor may implement or perform the methods, the steps, and the logical block diagrams disclosed in embodiments of this application. The general-purpose processor may be a microprocessor, or may be any conventional processor or the like. Steps of the methods disclosed with reference to embodiments of this application may be directly performed by a hardware processor, or may be performed by using a combination of hardware in the processor and a software module.

Figure 18:
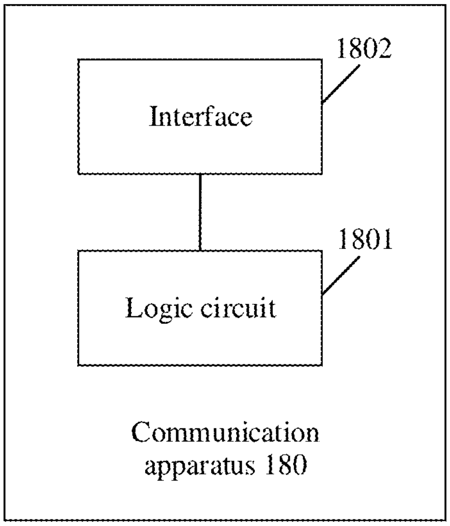
FIG. 18 is a diagram of a structure of another communication apparatus 180 according to an embodiment of this application.

FIG. 18 is a diagram of a structure of another communication apparatus 180 according to an embodiment of this application. As shown in FIG. 18, the communication apparatus shown in FIG. 18 includes a logic circuit 1801 and an interface 1802. The processing module 1610 in FIG. 16 may be implemented by using the logic circuit 1801, and the interface module 1620 in FIG. 16 may be implemented through the interface 1802. The logic circuit 1801 may be a chip, a processing circuit, an integrated circuit, a system on chip (SoC) chip, or the like. The interface 1802 may be a communication interface, an input/output interface, or the like. In this embodiment, the logic circuit and the interface may be further coupled to each other. A specific connection manner of the logic circuit and the interface is not limited in this embodiment.

In some embodiments of this application, the logic circuit and the interface may be configured to perform a function, an operation, or the like performed by the transmit end.

In some embodiments of this application, the logic circuit and the interface may be configured to perform a function, an operation, or the like performed by the receive end.

This application further provides a computer-readable storage medium. The computer-readable storage medium stores a computer program or instructions. When the computer program or the instructions run on a computer, the computer performs the method in the foregoing embodiment.

This application further provides a computer program product. The computer program product includes instructions or a computer program. When the instructions or the computer program runs on a computer, the method in the foregoing embodiment is performed.

This application further provides a communication system, including the transmit end and the receive end.

The foregoing descriptions are merely non-limiting examples of specific implementations and are not intended to limit the protection scope, which is intended to cover any variation or replacement readily determined by a person of ordinary skill in the art. Therefore, the claims shall define the protection scope.

The invention claimed is:

1. A low-density parity-check (LDPC) code encoding method, comprising:

performing LDPC encoding on an information bit sequence based on a parity check matrix, to obtain a first code word, wherein the parity check matrix is obtained by expanding a base matrix or a submatrix of the base matrix; and transmitting the first code word, wherein the base matrix or the submatrix of the base matrix is an H×M submatrix formed from H selected rows and M selected columns of one of the following 12×22 matrices:

1 1 0 1 0 0 1 0 0 0 1 1 0 0 0 0 0 0 0 0 0 0

1 0 0 1 1 1 0 1 1 0 0 1 1 0 0 0 0 0 0 0 0 0

1 1 1 0 0 0 1 0 1 1 0 0 1 1 0 0 0 0 0 0 0 0

0 1 1 1 1 1 1 0 0 1 1 0 0 1 1 0 0 0 0 0 0 0

1 1 1 0 1 1 0 1 1 1 0 0 0 0 1 1 0 0 0 0 0 0

1 0 0 1 0 0 0 1 0 0 1 0 0 0 0 1 0 0 0 0 0 0

1 1 0 0 0 0 0 0 0 0 0 0 0 0 0 0 1 0 0 0 0 0

0 1 0 1 0 0 0 0 0 1 0 1 1 0 0 0 0 1 0 0 0 0

1 1 0 0 0 0 0 0 1 0 0 0 0 0 0 0 0 0 1 0 0 0

1 0 0 0 1 0 0 0 1 0 0 0 0 0 1 0 0 0 0 1 0 0

-continued 1 1 0 1 0 0 0 0 0 0 0 1 0 0 0 1 0 0 0 0 1 0

0 1 0 1 1 1 0 0 0 0 0 0 0 0 0 0 0 0 0 0 0 1, or 1 1 0 1 1 0 1 0 1 1 1 1 0 0 0 0 0 0 0 0 0 0

1 0 0 1 0 0 1 1 0 0 0 1 1 0 0 0 0 0 0 0 0 0

1 1 1 0 1 1 1 0 1 1 0 0 1 1 0 0 0 0 0 0 0 0

0 1 1 0 0 1 0 0 0 1 1 0 0 1 1 0 0 0 0 0 0 0

1 1 1 0 1 1 0 1 0 0 0 0 0 0 1 1 0 0 0 0 0 0

1 0 0 1 0 0 0 1 1 0 1 0 0 0 0 1 0 0 0 0 0 0

1 1 0 0 0 0 0 0 0 0 0 0 0 0 0 0 1 0 0 0 0 0

0 1 0 0 0 0 0 1 0 0 0 0 0 0 0 0 0 1 0 0 0 0

1 1 0 0 0 0 1 0 1 0 0 0 0 0 0 0 0 0 1 0 0 0

1 0 0 1 0 0 1 0 0 1 1 1 0 1 0 1 0 0 0 1 0 0

1 1 0 0 0 0 1 0 0 1 0 0 0 0 0 1 0 0 0 0 1 0

0 1 0 0 0 0 0 1 1 0 0 0 0 0 0 1 0 0 0 0 0 1, or 1 1 0 1 1 1 1 0 1 0 1 1 0 0 0 0 0 0 0 0 0 0

1 0 1 0 1 1 0 1 1 1 0 1 1 0 0 0 0 0 0 0 0 0

1 1 1 1 0 1 1 0 1 1 0 0 1 1 0 0 0 0 0 0 0 0

0 1 0 1 0 1 0 0 0 1 1 0 0 1 1 0 0 0 0 0 0 0

1 1 1 1 0 0 0 1 0 1 0 0 0 0 1 1 0 0 0 0 0 0

1 0 0 0 1 0 1 1 1 0 1 0 0 0 0 1 0 0 0 0 0 0

1 1 0 0 0 0 0 0 0 0 0 0 0 0 0 0 1 0 0 0 0 0

0 1 0 0 0 1 0 0 0 0 0 0 1 0 0 0 1 0 0 0 0 0

1 1 0 0 0 0 0 0 1 0 1 0 0 0 0 0 0 0 1 0 0 0

1 0 0 1 1 1 0 1 0 0 1 0 0 1 0 0 0 0 0 1 0 0

1 1 0 0 0 1 0 0 0 1 0 0 0 0 0 0 0 0 0 0 1 0

0 1 0 0 0 0 0 0 1 1 0 0 0 0 0 0 0 0 0 0 0 1, wherein H is an integer from 1 to 12, and M is an integer from 1 to 22, wherein one of first and second columns of the selected 12×22 matrix includes 1 1 1 0 1 1 1 0 1 1 1 0, and the other of the first and second columns includes 1 0 1 1 1 0 1 1 1 0 1 1, and wherein 1 in the base matrix corresponds to a circulant permutation matrix (CPM), and 0 in the base matrix corresponds to an all-zero square matrix.

2. The method according to claim 1, wherein the parity check matrix comprises L rows or F columns selected from the following (12×22) matrix:

| | | | | | | | | | | | | | | | | | | | | | |
|---|---|---|---|---|---|---|---|---|---|---|---|---|---|---|---|---|---|---|---|---|---|
| 19 | 30 | −1 | 8 | −1 | −1 | 27 | −1 | −1 | −1 | 1 | 0 | −1 | −1 | −1 | −1 | −1 | −1 | −1 | −1 | −1 | −1 |
| 24 | −1 | −1 | 27 | 3 | 32 | −1 | 32 | 15 | −1 | −1 | 0 | 0 | −1 | −1 | −1 | −1 | −1 | −1 | −1 | −1 | −1 |
| 13 | 0 | 11 | −1 | −1 | −1 | 3 | −1 | 8 | 13 | −1 | −1 | 0 | 0 | −1 | −1 | −1 | −1 | −1 | −1 | −1 | −1 |
| −1 | 21 | 7 | 24 | 4 | 7 | 20 | −1 | −1 | 28 | 0 | −1 | −1 | 0 | 0 | −1 | −1 | −1 | −1 | −1 | −1 | −1 |
| 29 | 4 | 19 | −1 | 6 | 16 | −1 | 30 | 15 | 33 | −1 | −1 | −1 | −1 | 0 | 0 | −1 | −1 | −1 | −1 | −1 | −1 |
| 7 | −1 | −1 | 0 | −1 | −1 | −1 | 18 | −1 | −1 | 1 | −1 | −1 | −1 | −1 | 0 | −1 | −1 | −1 | −1 | −1 | −1 |
| 5 | 12 | −1 | −1 | −1 | −1 | −1 | −1 | −1 | −1 | −1 | −1 | −1 | −1 | −1 | −1 | 0 | −1 | −1 | −1 | −1 | −1 |
| −1 | 27 | −1 | 11 | −1 | −1 | −1 | −1 | −1 | 24 | −1 | 17 | 10 | −1 | −1 | −1 | −1 | 0 | −1 | −1 | −1 | −1 |
| 0 | 16 | −1 | −1 | −1 | −1 | −1 | −1 | 5 | −1 | −1 | −1 | −1 | −1 | −1 | −1 | −1 | −1 | 0 | −1 | −1 | −1 |
| 24 | −1 | −1 | −1 | 2 | −1 | −1 | −1 | 27 | −1 | −1 | −1 | −1 | −1 | 22 | −1 | −1 | −1 | −1 | 0 | −1 | −1 |

-continued

| | | | | | | | | | | | | | | | | | | | | | |
|---|---|---|---|---|---|---|---|---|---|---|---|---|---|---|---|---|---|---|---|---|---|
| 24 | 24 | −1 | 16 | −1 | −1 | −1 | −1 | −1 | −1 | −1 | 26 | −1 | −1 | −1 | 10 | −1 | −1 | −1 | −1 | 0 | −1 |
| −1 | 4 | −1 | 26 | 27 | 14 | −1 | −1 | −1 | −1 | −1 | −1 | −1 | −1 | −1 | −1 | −1 | −1 | −1 | −1 | −1 | 0, |

wherein

−1 in the parity check matrix represents an all-zero matrix of size K×K, 0 in the parity check matrix represents an identity matrix of size K×K, an element greater than 0 in the parity check matrix represents a CPM of size K×K, L is an integer from 1 to 12, and F is an integer from 1 to 22.

3. The method according to claim 1, wherein the parity check matrix comprises L rows or F columns selected from the following (12×22) matrix:

| | | | | | | | | | | | | | | | | | | | | | |
|---|---|---|---|---|---|---|---|---|---|---|---|---|---|---|---|---|---|---|---|---|---|
| 22 | 25 | −1 | 5 | −1 | −1 | 17 | −1 | −1 | −1 | 1 | 0 | −1 | −1 | −1 | −1 | −1 | −1 | −1 | −1 | −1 | −1 |
| 28 | −1 | −1 | 21 | 31 | 21 | −1 | 14 | 33 | −1 | −1 | 0 | 0 | −1 | −1 | −1 | −1 | −1 | −1 | −1 | −1 | −1 |
| 6 | 0 | 8 | −1 | −1 | −1 | 27 | −1 | 6 | 18 | −1 | −1 | 0 | 0 | −1 | −1 | −1 | −1 | −1 | −1 | −1 | −1 |
| −1 | 30 | 14 | 13 | 18 | 22 | 11 | −1 | −1 | 22 | 0 | −1 | −1 | 0 | 0 | −1 | −1 | −1 | −1 | −1 | −1 | −1 |
| 0 | 7 | 3 | −1 | 11 | 30 | −1 | 32 | 26 | 9 | −1 | −1 | −1 | −1 | 0 | 0 | −1 | −1 | −1 | −1 | −1 | −1 |
| 2 | −1 | −1 | 32 | −1 | −1 | −1 | 18 | −1 | −1 | 1 | −1 | −1 | −1 | −1 | 0 | −1 | −1 | −1 | −1 | −1 | −1 |
| 12 | 20 | −1 | −1 | −1 | −1 | −1 | −1 | −1 | −1 | −1 | −1 | −1 | −1 | −1 | −1 | 0 | −1 | −1 | −1 | −1 | −1 |
| −1 | 18 | −1 | 2 | −1 | −1 | −1 | −1 | −1 | 29 | −1 | 9 | 1 | −1 | −1 | −1 | −1 | 0 | −1 | −1 | −1 | −1 |
| 6 | 7 | −1 | −1 | −1 | −1 | −1 | −1 | 2 | −1 | −1 | −1 | −1 | −1 | −1 | −1 | −1 | −1 | 0 | −1 | −1 | −1 |
| 19 | −1 | −1 | −1 | 23 | −1 | −1 | −1 | 18 | −1 | −1 | −1 | −1 | −1 | 30 | −1 | −1 | −1 | −1 | 0 | −1 | −1 |
| 21 | 9 | −1 | 25 | −1 | −1 | −1 | −1 | −1 | −1 | −1 | 29 | −1 | −1 | −1 | 31 | −1 | −1 | −1 | −1 | 0 | −1 |
| −1 | 31 | −1 | 6 | 31 | 7 | −1 | −1 | −1 | −1 | −1 | −1 | −1 | −1 | −1 | −1 | −1 | −1 | −1 | −1 | −1 | 0, |

wherein

−1 in the parity check matrix represents an all-zero matrix of size K×K, 0 in the parity check matrix represents an identity matrix of size K×K, an element greater than 0 in the parity check matrix represents a CPM of size K×K, L is an integer from 1 to 12, and F is an integer from 1 to 22.

4. The method according to claim 1, wherein the parity check matrix comprises L rows or F columns selected from the following (12×22) matrix:

| | | | | | | | | | | | | | | | | | | | | | |
|---|---|---|---|---|---|---|---|---|---|---|---|---|---|---|---|---|---|---|---|---|---|
| 23 | 15 | −1 | 1 | 20 | −1 | 1 | −1 | 16 | 27 | 1 | 0 | −1 | −1 | −1 | −1 | −1 | −1 | −1 | −1 | −1 | −1 |
| 14 | −1 | −1 | 24 | −1 | −1 | 11 | 33 | −1 | −1 | −1 | 0 | 0 | −1 | −1 | −1 | −1 | −1 | −1 | −1 | −1 | −1 |
| 13 | 21 | 6 | −1 | 7 | 5 | 20 | −1 | 28 | 0 | −1 | −1 | 0 | 0 | −1 | −1 | −1 | −1 | −1 | −1 | −1 | −1 |
| −1 | 31 | 4 | −1 | −1 | 1 | −1 | −1 | −1 | 7 | 0 | −1 | −1 | 0 | 0 | −1 | −1 | −1 | −1 | −1 | −1 | −1 |
| 30 | 25 | 17 | −1 | 22 | 13 | −1 | 27 | −1 | −1 | −1 | −1 | −1 | −1 | 0 | 0 | −1 | −1 | −1 | −1 | −1 | −1 |
| 0 | −1 | −1 | 17 | −1 | −1 | −1 | 22 | 19 | −1 | 1 | −1 | −1 | −1 | −1 | 0 | −1 | −1 | −1 | −1 | −1 | −1 |
| 0 | 3 | −1 | −1 | −1 | −1 | −1 | −1 | −1 | −1 | −1 | −1 | −1 | −1 | −1 | −1 | 0 | −1 | −1 | −1 | −1 | −1 |
| −1 | 20 | −1 | −1 | −1 | −1 | −1 | 8 | −1 | −1 | −1 | −1 | −1 | −1 | −1 | −1 | −1 | 0 | −1 | −1 | −1 | −1 |
| 25 | 11 | −1 | −1 | −1 | −1 | 18 | −1 | 17 | −1 | −1 | −1 | −1 | −1 | −1 | −1 | −1 | −1 | 0 | −1 | −1 | −1 |
| 30 | −1 | −1 | 2 | −1 | −1 | 7 | −1 | −1 | 2 | 3 | 4 | −1 | 9 | −1 | 12 | −1 | −1 | −1 | 0 | −1 | −1 |
| 26 | 23 | −1 | −1 | −1 | −1 | 31 | −1 | −1 | 27 | −1 | −1 | −1 | −1 | −1 | 22 | −1 | −1 | −1 | −1 | 0 | −1 |
| −1 | 11 | −1 | −1 | −1 | −1 | −1 | 17 | 15 | −1 | −1 | −1 | −1 | −1 | −1 | 3 | −1 | −1 | −1 | −1 | −1 | 0, |

wherein

−1 in the parity check matrix represents an all-zero matrix of size K×K, 0 in the parity check matrix represents an identity matrix of size K×K, an element greater than 0 in the parity check matrix represents a CPM of size K×K, L is an integer from 1 to 12, and F is an integer from 1 to 22.

5. The method according to claim 1, wherein the parity check matrix comprises L rows or F columns selected from the following (12×22) matrix:

| | | | | | | | | | | | | | | | | | | | | | |
|---|---|---|---|---|---|---|---|---|---|---|---|---|---|---|---|---|---|---|---|---|---|
| 29 | 17 | −1 | 30 | 22 | −1 | 11 | −1 | 29 | 27 | 1 | 0 | −1 | −1 | −1 | −1 | −1 | −1 | −1 | −1 | −1 | −1 |
| 2 | −1 | −1 | 10 | −1 | −1 | 15 | 25 | −1 | −1 | −1 | 0 | 0 | −1 | −1 | −1 | −1 | −1 | −1 | −1 | −1 | −1 |
| 3 | 8 | 20 | −1 | 6 | 2 | 0 | −1 | 26 | 33 | −1 | −1 | 0 | 0 | −1 | −1 | −1 | −1 | −1 | −1 | −1 | −1 |
| −1 | 4 | 3 | −1 | −1 | 8 | −1 | −1 | −1 | 4 | 0 | −1 | −1 | 0 | 0 | −1 | −1 | −1 | −1 | −1 | −1 | −1 |
| 7 | 24 | 29 | −1 | 30 | 31 | −1 | 6 | −1 | −1 | −1 | −1 | −1 | −1 | 0 | 0 | −1 | −1 | −1 | −1 | −1 | −1 |
| 5 | −1 | −1 | 1 | −1 | −1 | −1 | 10 | 31 | −1 | 1 | −1 | −1 | −1 | −1 | 0 | −1 | −1 | −1 | −1 | −1 | −1 |
| 4 | 31 | −1 | −1 | −1 | −1 | −1 | −1 | −1 | −1 | −1 | −1 | −1 | −1 | −1 | −1 | 0 | −1 | −1 | −1 | −1 | −1 |
| −1 | 22 | −1 | −1 | −1 | −1 | −1 | 20 | −1 | −1 | −1 | −1 | −1 | −1 | −1 | −1 | −1 | 0 | −1 | −1 | −1 | −1 |
| 18 | 2 | −1 | −1 | −1 | −1 | 6 | −1 | 25 | −1 | −1 | −1 | −1 | −1 | −1 | −1 | −1 | −1 | 0 | −1 | −1 | −1 |
| 9 | −1 | −1 | 13 | −1 | −1 | 13 | −1 | −1 | 18 | 0 | 28 | −1 | 21 | −1 | 30 | −1 | −1 | −1 | 0 | −1 | −1 |
| 24 | 24 | −1 | −1 | −1 | −1 | 8 | −1 | −1 | 10 | −1 | −1 | −1 | −1 | −1 | 32 | −1 | −1 | −1 | −1 | 0 | −1 |
| −1 | 4 | −1 | −1 | −1 | −1 | −1 | 0 | 5 | −1 | −1 | −1 | −1 | −1 | −1 | 31 | −1 | −1 | −1 | −1 | −1 | 0, 1 |

wherein

−1 in the parity check matrix represents an all-zero matrix of size K×K, 0 in the parity check matrix represents an identity matrix of size K×K, an element greater than 0 in the parity check matrix represents a CPM of size K×K, L is an integer from 1 to 12, and F is an integer from 1 to 22.

6. The method according to claim 1, wherein the parity check matrix comprises L rows or F columns selected from the following (12×22) matrix:

| | | | | | | | | | | | | | | | | | | | | | |
|---|---|---|---|---|---|---|---|---|---|---|---|---|---|---|---|---|---|---|---|---|---|
| 28 | 25 | −1 | 25 | 10 | 10 | 33 | −1 | 24 | −1 | 1 | 0 | −1 | −1 | −1 | −1 | −1 | −1 | −1 | −1 | −1 | −1 |
| 22 | −1 | 7 | −1 | 0 | 28 | −1 | 17 | 2 | 33 | −1 | 0 | 0 | −1 | −1 | −1 | −1 | −1 | −1 | −1 | −1 | −1 |
| 19 | 30 | 27 | 0 | −1 | 27 | 2 | −1 | 12 | 11 | −1 | −1 | 0 | 0 | −1 | −1 | −1 | −1 | −1 | −1 | −1 | −1 |
| −1 | 0 | −1 | 6 | −1 | 29 | −1 | −1 | −1 | 29 | 0 | −1 | −1 | 0 | 0 | −1 | −1 | −1 | −1 | −1 | −1 | −1 |
| 29 | 5 | 9 | 15 | −1 | −1 | −1 | 14 | −1 | 12 | −1 | −1 | −1 | −1 | 0 | 0 | −1 | −1 | −1 | −1 | −1 | −1 |
| 11 | −1 | −1 | −1 | 19 | −1 | 10 | 27 | 5 | −1 | 1 | −1 | −1 | −1 | −1 | 0 | −1 | −1 | −1 | −1 | −1 | −1 |
| 21 | 22 | −1 | −1 | −1 | −1 | −1 | −1 | −1 | −1 | −1 | −1 | −1 | −1 | −1 | −1 | 0 | −1 | −1 | −1 | −1 | −1 |
| −1 | 17 | −1 | −1 | −1 | 29 | −1 | −1 | −1 | −1 | −1 | −1 | −1 | 26 | −1 | −1 | −1 | 0 | −1 | −1 | −1 | −1 |
| 18 | 30 | −1 | −1 | −1 | −1 | −1 | −1 | 23 | −1 | 9 | −1 | −1 | −1 | −1 | −1 | −1 | −1 | 0 | −1 | −1 | −1 |
| 19 | −1 | −1 | 29 | 17 | 12 | −1 | 13 | −1 | −1 | 4 | −1 | −1 | 12 | −1 | −1 | −1 | −1 | −1 | 0 | −1 | −1 |
| 33 | 4 | −1 | −1 | −1 | 32 | −1 | −1 | −1 | 23 | −1 | −1 | −1 | −1 | −1 | −1 | −1 | −1 | −1 | −1 | 0 | −1 |
| −1 | 3 | −1 | −1 | −1 | −1 | −1 | −1 | 28 | 23 | −1 | −1 | −1 | −1 | −1 | −1 | −1 | −1 | −1 | −1 | −1 | 0, |

wherein

−1 in the parity check matrix represents an all-zero matrix of size K×K, 0 in the parity check matrix represents an identity matrix of size K×K, an element greater than 0 in the parity check matrix represents a CPM of size K×K, L is an integer from 1 to 12, and F is an integer from 1 to 22.

7. A low-density parity-check (LDPC) code decoding method, comprising:

determining a first log-likelihood ratio (LLR) sequence corresponding to a signal received over a first channel, and decoding the first LLR sequence based on a parity check matrix, wherein the parity check matrix is obtained by expanding a base matrix or a submatrix of the base matrix, wherein the base matrix or the submatrix of the base matrix is an H×M submatrix formed from H selected rows and M selected columns of one of the following 12×22 matrices:

| | | | | | | | | | | | | | | | | | | | | | |
|---|---|---|---|---|---|---|---|---|---|---|---|---|---|---|---|---|---|---|---|---|---|
| 1 | 1 | 0 | 1 | 0 | 0 | 1 | 0 | 0 | 0 | 1 | 1 | 0 | 0 | 0 | 0 | 0 | 0 | 0 | 0 | 0 | 0 |
| 1 | 0 | 0 | 1 | 1 | 1 | 0 | 1 | 1 | 0 | 0 | 1 | 1 | 0 | 0 | 0 | 0 | 0 | 0 | 0 | 0 | 0 |
| 1 | 1 | 1 | 0 | 0 | 0 | 1 | 0 | 1 | 1 | 0 | 0 | 1 | 1 | 0 | 0 | 0 | 0 | 0 | 0 | 0 | 0 |
| 0 | 1 | 1 | 1 | 1 | 1 | 1 | 0 | 0 | 1 | 1 | 0 | 0 | 1 | 1 | 0 | 0 | 0 | 0 | 0 | 0 | 0 |
| 1 | 1 | 1 | 0 | 1 | 1 | 0 | 1 | 1 | 1 | 0 | 0 | 0 | 0 | 1 | 1 | 0 | 0 | 0 | 0 | 0 | 0 |
| 1 | 0 | 0 | 1 | 0 | 0 | 0 | 1 | 0 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 0 | 1 | 0 | 0 | 0 | 0 | 0 | 1 | 0 | 1 | 1 | 0 | 0 | 0 | 0 | 1 | 0 | 0 | 0 | 0 |
| 1 | 1 | 0 | 0 | 0 | 0 | 0 | 0 | 1 | 0 | 0 | 0 | 0 | 0 | 0 | 0 | 0 | 0 | 1 | 0 | 0 | 0 |
| 1 | 0 | 0 | 0 | 1 | 0 | 0 | 0 | 1 | 0 | 0 | 0 | 0 | 1 | 0 | 0 | 0 | 0 | 0 | 1 | 0 | 0 |
| 1 | 1 | 0 | 1 | 0 | 0 | 0 | 0 | 0 | 0 | 0 | 1 | 0 | 0 | 0 | 1 | 0 | 0 | 0 | 0 | 1 | 0 |
| 0 | 1 | 0 | 1 | 1 | 1 | 0 | 0 | 0 | 0 | 0 | 0 | 0 | 0 | 0 | 0 | 0 | 0 | 0 | 0 | 0 | 1, or |

| | | | | | | | | | | | | | | | | | | | | | |
|---|---|---|---|---|---|---|---|---|---|---|---|---|---|---|---|---|---|---|---|---|---|
| 1 | 1 | 0 | 1 | 1 | 0 | 1 | 0 | 1 | 1 | 1 | 1 | 0 | 0 | 0 | 0 | 0 | 0 | 0 | 0 | 0 | 0 |
| 1 | 0 | 0 | 1 | 0 | 0 | 1 | 1 | 0 | 0 | 0 | 1 | 1 | 0 | 0 | 0 | 0 | 0 | 0 | 0 | 0 | 0 |
| 1 | 1 | 1 | 0 | 1 | 1 | 1 | 0 | 1 | 1 | 0 | 0 | 1 | 1 | 0 | 0 | 0 | 0 | 0 | 0 | 0 | 0 |
| 0 | 1 | 1 | 0 | 0 | 1 | 0 | 0 | 0 | 1 | 1 | 0 | 0 | 1 | 1 | 0 | 0 | 0 | 0 | 0 | 0 | 0 |
| 1 | 1 | 1 | 0 | 1 | 1 | 0 | 1 | 0 | 0 | 0 | 0 | 0 | 0 | 1 | 1 | 0 | 0 | 0 | 0 | 0 | 0 |
| 1 | 0 | 0 | 1 | 0 | 0 | 0 | 1 | 1 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 0 | 0 | 0 | 0 | 0 | 1 | 0 | 0 | 0 | 0 | 0 | 0 | 0 | 0 | 0 | 1 | 0 | 0 | 0 | 0 |

-continued

| | | | | | | | | | | | | | | | | | | | | | |
|---|---|---|---|---|---|---|---|---|---|---|---|---|---|---|---|---|---|---|---|---|---|
| 1 | 1 | 0 | 0 | 0 | 0 | 1 | 0 | 1 | 0 | 0 | 0 | 0 | 0 | 0 | 0 | 0 | 0 | 1 | 0 | 0 | 0 |
| 1 | 0 | 0 | 1 | 0 | 0 | 1 | 0 | 0 | 1 | 1 | 1 | 0 | 1 | 0 | 1 | 0 | 0 | 0 | 1 | 0 | 0 |
| 1 | 1 | 0 | 0 | 0 | 0 | 1 | 0 | 0 | 1 | 0 | 0 | 0 | 0 | 0 | 1 | 0 | 0 | 0 | 0 | 1 | 0 |
| 0 | 1 | 0 | 0 | 0 | 0 | 0 | 1 | 1 | 0 | 0 | 0 | 0 | 0 | 0 | 1 | 0 | 0 | 0 | 0 | 0 | 1, or |

| | | | | | | | | | | | | | | | | | | | | | |
|---|---|---|---|---|---|---|---|---|---|---|---|---|---|---|---|---|---|---|---|---|---|
| 1 | 1 | 0 | 1 | 1 | 1 | 1 | 0 | 1 | 0 | 1 | 1 | 0 | 0 | 0 | 0 | 0 | 0 | 0 | 0 | 0 | 0 |
| 1 | 0 | 1 | 0 | 1 | 1 | 0 | 1 | 1 | 1 | 0 | 1 | 1 | 0 | 0 | 0 | 0 | 0 | 0 | 0 | 0 | 0 |
| 1 | 1 | 1 | 1 | 0 | 1 | 1 | 0 | 1 | 1 | 0 | 0 | 1 | 1 | 0 | 0 | 0 | 0 | 0 | 0 | 0 | 0 |
| 0 | 1 | 0 | 1 | 0 | 1 | 0 | 0 | 0 | 1 | 1 | 0 | 0 | 1 | 1 | 0 | 0 | 0 | 0 | 0 | 0 | 0 |
| 1 | 1 | 1 | 1 | 0 | 0 | 0 | 1 | 0 | 1 | 0 | 0 | 0 | 0 | 1 | 1 | 0 | 0 | 0 | 0 | 0 | 0 |
| 1 | 0 | 0 | 0 | 1 | 0 | 1 | 1 | 1 | 0 | 1 | 0 | 0 | 0 | 0 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 1 | 0 | 0 | 0 | 1 | 0 | 0 | 0 | 0 | 0 | 0 | 0 | 1 | 0 | 0 | 0 | 1 | 0 | 0 | 0 | 0 |
| 1 | 1 | 0 | 0 | 0 | 0 | 0 | 0 | 1 | 0 | 1 | 0 | 0 | 0 | 0 | 0 | 0 | 0 | 1 | 0 | 0 | 0 |
| 1 | 0 | 0 | 1 | 1 | 1 | 0 | 1 | 0 | 0 | 1 | 0 | 0 | 1 | 0 | 0 | 0 | 0 | 0 | 1 | 0 | 0 |
| 1 | 1 | 0 | 0 | 0 | 1 | 0 | 0 | 0 | 1 | 0 | 0 | 0 | 0 | 0 | 0 | 0 | 0 | 0 | 0 | 1 | 0 |
| 0 | 1 | 0 | 0 | 0 | 0 | 0 | 0 | 1 | 1 | 0 | 0 | 0 | 0 | 0 | 0 | 0 | 0 | 0 | 0 | 0 | 1, |

wherein H is an integer from 1 to 12, and M is an integer from 1 to 22, wherein one of first and second columns of the selected 12×22 matrix includes 1 1 1 0 1 1 1 0 1 1 1 0, and the other of the first and second columns includes 1 0 1 1 1 0 1 1 1 0 1 1, and wherein 1 in the base matrix corresponds to a circulant permutation matrix (CPM), and 0 in the base matrix corresponds to an all-zero square matrix.

8. The method according to claim 7, wherein the parity check matrix comprises L rows or F columns selected from the following (12×22) matrix:

| | | | | | | | | | | | | | | | | | | | | | |
|---|---|---|---|---|---|---|---|---|---|---|---|---|---|---|---|---|---|---|---|---|---|
| 19 | 30 | −1 | 8 | −1 | −1 | 27 | −1 | −1 | −1 | 1 | 0 | −1 | −1 | −1 | −1 | −1 | −1 | −1 | −1 | −1 | −1 |
| 24 | −1 | −1 | 27 | 3 | 32 | −1 | 32 | 15 | −1 | −1 | 0 | 0 | −1 | −1 | −1 | −1 | −1 | −1 | −1 | −1 | −1 |
| 13 | 0 | 11 | −1 | −1 | −1 | 3 | −1 | 8 | 13 | −1 | −1 | 0 | 0 | −1 | −1 | −1 | −1 | −1 | −1 | −1 | −1 |
| −1 | 21 | 7 | 24 | 4 | 7 | 20 | −1 | −1 | 28 | 0 | −1 | −1 | 0 | 0 | −1 | −1 | −1 | −1 | −1 | −1 | −1 |
| 29 | 4 | 19 | −1 | 6 | 16 | −1 | 30 | 15 | 33 | −1 | −1 | −1 | −1 | 0 | 0 | −1 | −1 | −1 | −1 | −1 | −1 |
| 7 | −1 | −1 | 0 | −1 | −1 | −1 | 18 | −1 | −1 | 1 | −1 | −1 | −1 | −1 | 0 | −1 | −1 | −1 | −1 | −1 | −1 |
| 5 | 12 | −1 | −1 | −1 | −1 | −1 | −1 | −1 | −1 | −1 | −1 | −1 | −1 | −1 | −1 | 0 | −1 | −1 | −1 | −1 | −1 |
| −1 | 27 | −1 | 11 | −1 | −1 | −1 | −1 | −1 | 24 | −1 | 17 | 10 | −1 | −1 | −1 | −1 | 0 | −1 | −1 | −1 | −1 |
| 0 | 16 | −1 | −1 | −1 | −1 | −1 | −1 | 5 | −1 | −1 | −1 | −1 | −1 | −1 | −1 | −1 | −1 | 0 | −1 | −1 | −1 |
| 24 | −1 | −1 | −1 | 2 | −1 | −1 | −1 | 27 | −1 | −1 | −1 | −1 | −1 | 22 | −1 | −1 | −1 | −1 | 0 | −1 | −1 |
| 24 | 24 | −1 | 16 | −1 | −1 | −1 | −1 | −1 | −1 | −1 | 26 | −1 | −1 | −1 | 10 | −1 | −1 | −1 | −1 | 0 | −1 |
| −1 | 4 | −1 | 26 | 27 | 14 | −1 | −1 | −1 | −1 | −1 | −1 | −1 | −1 | −1 | −1 | −1 | −1 | −1 | −1 | −1 | 0, |

wherein

−1 in the parity check matrix represents an all-zero matrix of size K×K, 0 in the parity check matrix represents an identity matrix of size K×K, an element greater than 0 in the parity check matrix represents a CPM of size K×K, L is an integer from 1 to 12, and F is an integer from 1 to 22.

9. The method according to claim 7, wherein the parity check matrix comprises L rows or F columns selected from the following (12×22) matrix:

| | | | | | | | | | | | | | | | | | | | | | |
|---|---|---|---|---|---|---|---|---|---|---|---|---|---|---|---|---|---|---|---|---|---|
| 22 | 25 | −1 | 5 | −1 | −1 | 17 | −1 | −1 | −1 | 1 | 0 | −1 | −1 | −1 | −1 | −1 | −1 | −1 | −1 | −1 | −1 |
| 28 | −1 | −1 | 21 | 31 | 21 | −1 | 14 | 33 | −1 | −1 | 0 | 0 | −1 | −1 | −1 | −1 | −1 | −1 | −1 | −1 | −1 |
| 6 | 0 | 8 | −1 | −1 | −1 | 27 | −1 | 6 | 18 | −1 | −1 | 0 | 0 | −1 | −1 | −1 | −1 | −1 | −1 | −1 | −1 |
| −1 | 30 | 14 | 13 | 18 | 22 | 11 | −1 | −1 | 22 | 0 | −1 | −1 | 0 | 0 | −1 | −1 | −1 | −1 | −1 | −1 | −1 |
| 0 | 7 | 3 | −1 | 11 | 30 | −1 | 32 | 26 | 9 | −1 | −1 | −1 | −1 | 0 | 0 | −1 | −1 | −1 | −1 | −1 | −1 |
| 2 | −1 | −1 | 32 | −1 | −1 | −1 | 18 | −1 | −1 | 1 | −1 | −1 | −1 | −1 | 0 | −1 | −1 | −1 | −1 | −1 | −1 |
| 12 | 20 | −1 | −1 | −1 | −1 | −1 | −1 | −1 | −1 | −1 | −1 | −1 | −1 | −1 | −1 | 0 | −1 | −1 | −1 | −1 | −1 |
| −1 | 18 | −1 | 2 | −1 | −1 | −1 | −1 | −1 | 29 | −1 | 9 | 1 | −1 | −1 | −1 | −1 | 0 | −1 | −1 | −1 | −1 |
| 6 | 7 | −1 | −1 | −1 | −1 | −1 | −1 | 2 | −1 | −1 | −1 | −1 | −1 | −1 | −1 | −1 | −1 | 0 | −1 | −1 | −1 |
| 19 | −1 | −1 | −1 | 23 | −1 | −1 | −1 | 18 | −1 | −1 | −1 | −1 | −1 | 30 | −1 | −1 | −1 | −1 | 0 | −1 | −1 |
| 21 | 9 | −1 | 25 | −1 | −1 | −1 | −1 | −1 | −1 | −1 | 29 | −1 | −1 | −1 | 31 | −1 | −1 | −1 | −1 | 0 | −1 |
| −1 | 31 | −1 | 6 | 31 | 7 | −1 | −1 | −1 | −1 | −1 | −1 | −1 | −1 | −1 | −1 | −1 | −1 | −1 | −1 | −1 | 0, |

wherein

−1 in the parity check matrix represents an all-zero matrix of size K×K, 0 in the parity check matrix represents an identity matrix of size K×K, an element greater than 0 in the parity check matrix represents a CPM of size K×K, L is an integer from 1 to 12, and F is an integer from 1 to 22.

10. The method according to claim 7, wherein the parity check matrix comprises L rows or F columns selected from the following (12×22) matrix:

| | | | | | | | | | | | | | | | | | | | | | |
|---|---|---|---|---|---|---|---|---|---|---|---|---|---|---|---|---|---|---|---|---|---|
| 23 | 15 | −1 | 1 | 20 | −1 | 10 | −1 | 16 | 27 | 1 | 0 | −1 | −1 | −1 | −1 | −1 | −1 | −1 | −1 | −1 | −1 |
| 14 | −1 | −1 | 24 | −1 | −1 | 11 | 33 | −1 | −1 | −1 | 0 | 0 | −1 | −1 | −1 | −1 | −1 | −1 | −1 | −1 | −1 |
| 13 | 21 | 6 | −1 | 7 | 5 | 20 | −1 | 28 | 0 | −1 | −1 | 0 | 0 | −1 | −1 | −1 | −1 | −1 | −1 | −1 | −1 |
| −1 | 31 | 4 | −1 | −1 | 1 | −1 | −1 | −1 | 7 | 0 | −1 | −1 | 0 | 0 | −1 | −1 | −1 | −1 | −1 | −1 | −1 |
| 30 | 25 | 17 | −1 | 22 | 13 | −1 | 27 | −1 | −1 | −1 | −1 | −1 | −1 | 0 | 0 | −1 | −1 | −1 | −1 | −1 | −1 |
| 0 | −1 | −1 | 17 | −1 | −1 | −1 | 22 | 19 | −1 | 1 | −1 | −1 | −1 | −1 | 0 | −1 | −1 | −1 | −1 | −1 | −1 |
| 0 | 3 | −1 | −1 | −1 | −1 | −1 | −1 | −1 | −1 | −1 | −1 | −1 | −1 | −1 | −1 | 0 | −1 | −1 | −1 | −1 | −1 |
| −1 | 20 | −1 | −1 | −1 | −1 | −1 | 8 | −1 | −1 | −1 | −1 | −1 | −1 | −1 | −1 | −1 | 0 | −1 | −1 | −1 | −1 |
| 25 | 11 | −1 | −1 | −1 | −1 | 18 | −1 | 17 | −1 | −1 | −1 | −1 | −1 | −1 | −1 | −1 | −1 | 0 | −1 | −1 | −1 |
| 30 | −1 | −1 | 2 | −1 | −1 | 7 | −1 | −1 | 2 | 3 | 4 | −1 | 9 | −1 | 12 | −1 | −1 | −1 | 0 | −1 | −1 |
| 26 | 23 | −1 | −1 | −1 | −1 | 31 | −1 | −1 | 27 | −1 | −1 | −1 | −1 | −1 | 22 | −1 | −1 | −1 | −1 | 0 | −1 |
| −1 | 11 | −1 | −1 | −1 | −1 | −1 | 17 | 15 | −1 | −1 | −1 | −1 | −1 | −1 | 3 | −1 | −1 | −1 | −1 | −1 | 0, |

wherein

−1 in the parity check matrix represents an all-zero matrix of size K×K, 0 in the parity check matrix represents an identity matrix of size K×K, an element greater than 0 in the parity check matrix represents a CPM of size K×K, L is an integer from 1 to 12, and F is an integer from 1 to 22.

11. The method according to claim 7, wherein the parity check matrix comprises L rows or F columns selected from the following (12×22) matrix:

| | | | | | | | | | | | | | | | | | | | | | |
|---|---|---|---|---|---|---|---|---|---|---|---|---|---|---|---|---|---|---|---|---|---|
| 29 | 17 | −1 | 30 | 22 | −1 | 11 | −1 | 29 | 27 | 1 | 0 | −1 | −1 | −1 | −1 | −1 | −1 | −1 | −1 | −1 | −1 |
| 2 | −1 | −1 | 10 | −1 | −1 | 15 | 25 | −1 | −1 | −1 | 0 | 0 | −1 | −1 | −1 | −1 | −1 | −1 | −1 | −1 | −1 |

-continued

| | | | | | | | | | | | | | | | | | | | | | |
|---|---|---|---|---|---|---|---|---|---|---|---|---|---|---|---|---|---|---|---|---|---|
| 3 | 8 | 20 | −1 | 6 | 2 | 0 | −1 | 26 | 33 | −1 | −1 | 0 | 0 | −1 | −1 | −1 | −1 | −1 | −1 | −1 | −1 |
| −1 | 4 | 3 | −1 | −1 | 8 | −1 | −1 | −1 | 4 | 0 | −1 | −1 | 0 | 0 | −1 | −1 | −1 | −1 | −1 | −1 | −1 |
| 7 | 24 | 29 | −1 | 30 | 31 | −1 | 6 | −1 | −1 | −1 | −1 | −1 | −1 | 0 | 0 | −1 | −1 | −1 | −1 | −1 | −1 |
| 5 | −1 | −1 | 1 | −1 | −1 | −1 | 10 | 31 | −1 | 1 | −1 | −1 | −1 | −1 | 0 | −1 | −1 | −1 | −1 | −1 | −1 |
| 4 | 31 | −1 | −1 | −1 | −1 | −1 | −1 | −1 | −1 | −1 | −1 | −1 | −1 | −1 | −1 | 0 | −1 | −1 | −1 | −1 | −1 |
| −1 | 22 | −1 | −1 | −1 | −1 | −1 | 20 | −1 | −1 | −1 | −1 | −1 | −1 | −1 | −1 | −1 | 0 | −1 | −1 | −1 | −1 |
| 18 | 2 | −1 | −1 | −1 | −1 | 6 | −1 | 25 | −1 | −1 | −1 | −1 | −1 | −1 | −1 | −1 | −1 | 0 | −1 | −1 | −1 |
| 9 | −1 | −1 | 13 | −1 | −1 | 13 | −1 | −1 | 18 | 0 | 28 | −1 | 21 | −1 | 30 | −1 | −1 | −1 | 0 | −1 | −1 |
| 24 | 24 | −1 | −1 | −1 | −1 | 8 | −1 | −1 | 10 | −1 | −1 | −1 | −1 | −1 | 32 | −1 | −1 | −1 | −1 | 0 | −1 |
| −1 | 4 | −1 | −1 | −1 | −1 | −1 | 0 | 5 | −1 | −1 | −1 | −1 | −1 | −1 | 31 | −1 | −1 | −1 | −1 | −1 | 0, |

wherein

−1 in the parity check matrix represents an all-zero matrix of size K×K, 0 in the parity check matrix represents an identity matrix of size K×K, an element greater than 0 in the parity check matrix represents a CPM of size K×K, L is an integer from 1 to 12, and F is an integer from 1 to 22.

12. The method according to claim 7, wherein the parity check matrix comprises L rows or F columns selected from the following (12×22) matrix:

| | | | | | | | | | | | | | | | | | | | | | |
|---|---|---|---|---|---|---|---|---|---|---|---|---|---|---|---|---|---|---|---|---|---|
| 28 | 25 | −1 | 25 | 10 | 10 | 33 | −1 | 24 | −1 | 1 | 0 | −1 | −1 | −1 | −1 | −1 | −1 | −1 | −1 | −1 | −1 |
| 22 | −1 | 7 | −1 | 0 | 28 | −1 | 17 | 2 | 33 | −1 | 0 | 0 | −1 | −1 | −1 | −1 | −1 | −1 | −1 | −1 | −1 |
| 19 | 30 | 27 | 0 | −1 | 27 | 2 | −1 | 12 | 11 | −1 | −1 | 0 | 0 | −1 | −1 | −1 | −1 | −1 | −1 | −1 | −1 |
| −1 | 0 | −1 | 6 | −1 | 29 | −1 | −1 | −1 | 29 | 0 | −1 | −1 | 0 | 0 | −1 | −1 | −1 | −1 | −1 | −1 | −1 |
| 29 | 5 | 9 | 15 | −1 | −1 | −1 | 14 | −1 | 12 | −1 | −1 | −1 | −1 | 0 | 0 | −1 | −1 | −1 | −1 | −1 | −1 |
| 11 | −1 | −1 | −1 | 19 | −1 | 10 | 27 | 5 | −1 | 1 | −1 | −1 | −1 | −1 | 0 | −1 | −1 | −1 | −1 | −1 | −1 |
| 21 | 22 | −1 | −1 | −1 | −1 | −1 | −1 | −1 | −1 | −1 | −1 | −1 | −1 | −1 | −1 | 0 | −1 | −1 | −1 | −1 | −1 |
| −1 | 17 | −1 | −1 | −1 | 29 | −1 | −1 | −1 | −1 | −1 | −1 | −1 | 26 | −1 | −1 | −1 | 0 | −1 | −1 | −1 | −1 |
| 18 | 30 | −1 | −1 | −1 | −1 | −1 | −1 | 23 | −1 | 9 | −1 | −1 | −1 | −1 | −1 | −1 | −1 | 0 | −1 | −1 | −1 |
| 19 | −1 | −1 | 29 | 17 | 12 | −1 | 13 | −1 | −1 | 4 | −1 | −1 | 12 | −1 | −1 | −1 | −1 | −1 | 0 | −1 | −1 |
| 33 | 4 | −1 | −1 | −1 | 32 | −1 | −1 | −1 | 23 | −1 | −1 | −1 | −1 | −1 | −1 | −1 | −1 | −1 | −1 | 0 | −1 |
| −1 | 3 | −1 | −1 | −1 | −1 | −1 | −1 | 28 | 23 | −1 | −1 | −1 | −1 | −1 | −1 | −1 | −1 | −1 | −1 | −1 | 0 |

wherein

−1 in the parity check matrix represents an all-zero matrix of size K×K, 0 in the parity check matrix represents an identity matrix of size K×K, an element greater than 0 in the parity check matrix represents a CPM of size K×K, L is an integer from 1 to 12, and F is an integer from 1 to 22.

* * * * *